(12) United States Patent
Osabe et al.

(10) Patent No.: US 8,278,700 B2
(45) Date of Patent: Oct. 2, 2012

(54) SEMICONDUCTOR DEVICE

(75) Inventors: Taro Osabe, Kokubunji (JP); Tomoyuki Ishii, Hachioji (JP); Kazuo Yano, Hino (JP); Takashi Kobayashi, Tokorozawa (JP)

(73) Assignee: Renesas Electronics Corporation, Kanagawa (JP)

( * ) Notice: Subject to any disclaimer, the term of this patent is extended or adjusted under 35 U.S.C. 154(b) by 4 days.

(21) Appl. No.: 13/072,211

(22) Filed: Mar. 25, 2011

(65) Prior Publication Data

US 2011/0169070 A1    Jul. 14, 2011

Related U.S. Application Data

(62) Division of application No. 11/896,800, filed on Sep. 6, 2007, now Pat. No. 7,939,879, which is a division of application No. 10/919,471, filed on Aug. 17, 2004, now Pat. No. 7,294,880, which is a division of application No. 09/944,073, filed on Sep. 4, 2001, now Pat. No. 6,849,895.

(30) Foreign Application Priority Data

Dec. 11, 2000    (JP) ................................. 2000-375686

(51) Int. Cl.
*H01L 29/792*    (2006.01)

(52) U.S. Cl. ........ 257/324; 257/311; 257/316; 257/317; 257/325

(58) Field of Classification Search .................. 257/311, 257/316, 317, 324, 325
See application file for complete search history.

(56) References Cited

U.S. PATENT DOCUMENTS

| | | | |
|---|---|---|---|
| 5,338,957 A | 8/1994 | Fukumoto et al. | |
| 5,357,134 A | 10/1994 | Shimoji | |
| 5,600,163 A | 2/1997 | Yano et al. | |
| 5,751,636 A | 5/1998 | Naruke et al. | |
| 5,824,584 A | 10/1998 | Chen et al. | |
| 6,181,597 B1 | 1/2001 | Nachumovsky | |
| 6,274,901 B1 | 8/2001 | Odake et al. | |
| 6,400,610 B1 | 6/2002 | Sadd | |
| 6,477,083 B1 | 11/2002 | Fastow et al. | |
| 6,531,735 B1 | 3/2003 | Kamigaki et al. | |
| 6,894,344 B2 | 5/2005 | Kamigaki et al. | |
| 2002/0109539 A1 | 8/2002 | Takeuchi et al. | |

FOREIGN PATENT DOCUMENTS

| | | |
|---|---|---|
| JP | 05-152579 | 6/1993 |
| JP | 06-037286 | 2/1994 |
| JP | 2000-049245 | 2/2000 |

OTHER PUBLICATIONS

Kume et al, "Flash Memory Technology", Ouyou Butsuri, vol. 65, p. 1114, 1996.

(Continued)

*Primary Examiner* — Tan N Tran
(74) *Attorney, Agent, or Firm* — Mattingly & Malur, P.C.

(57) ABSTRACT

For providing a cheap semiconductor memory device with improving reliability by level of a cell, in the place of escaping from defects on memory cells electrically, through such as ECC, and further for providing a cell structure enabling scaling-down in the vertical direction with maintaining the reliability, in a semiconductor memory device, upon which high-speeded read-out operation is required, a charge storage region is constructed with particles made from a large number of semiconductor charge storage small regions, each being independent, thereby increasing the reliability by the cell level.

4 Claims, 52 Drawing Sheets

OTHER PUBLICATIONS

J.D. Bude et al, "EEPROM/Flash Sub 3.0V Drain-Source Bias Hot Carrier Writing", IEEE International Electron Device Meeting 1995, p. 898-991.

Ogura et al, "Low Voltage, Low Current, High Speed Program Step Split Gate Cell with Ballistic Direct Injection for EEPRO/Flash", IEEE International Electron Device Meeting, 1998, pp. 987-990.

T. Jung et al, "A.3.3V 128Mb Multi-Level NAND Flash Memory for Mass Storage Application", IEEE International Solid-State Circuit Conference 1996, pp. 32-33, 1996.

M. Lorenzini et al, "A Dual Gate Flash EEPROM Cell with Two-Bit Storage Capacity", IEEE Transactions on Components, Packaging, and Manufacturing Technology Part A, vol. 20, No. 2, p. 182, 1997.

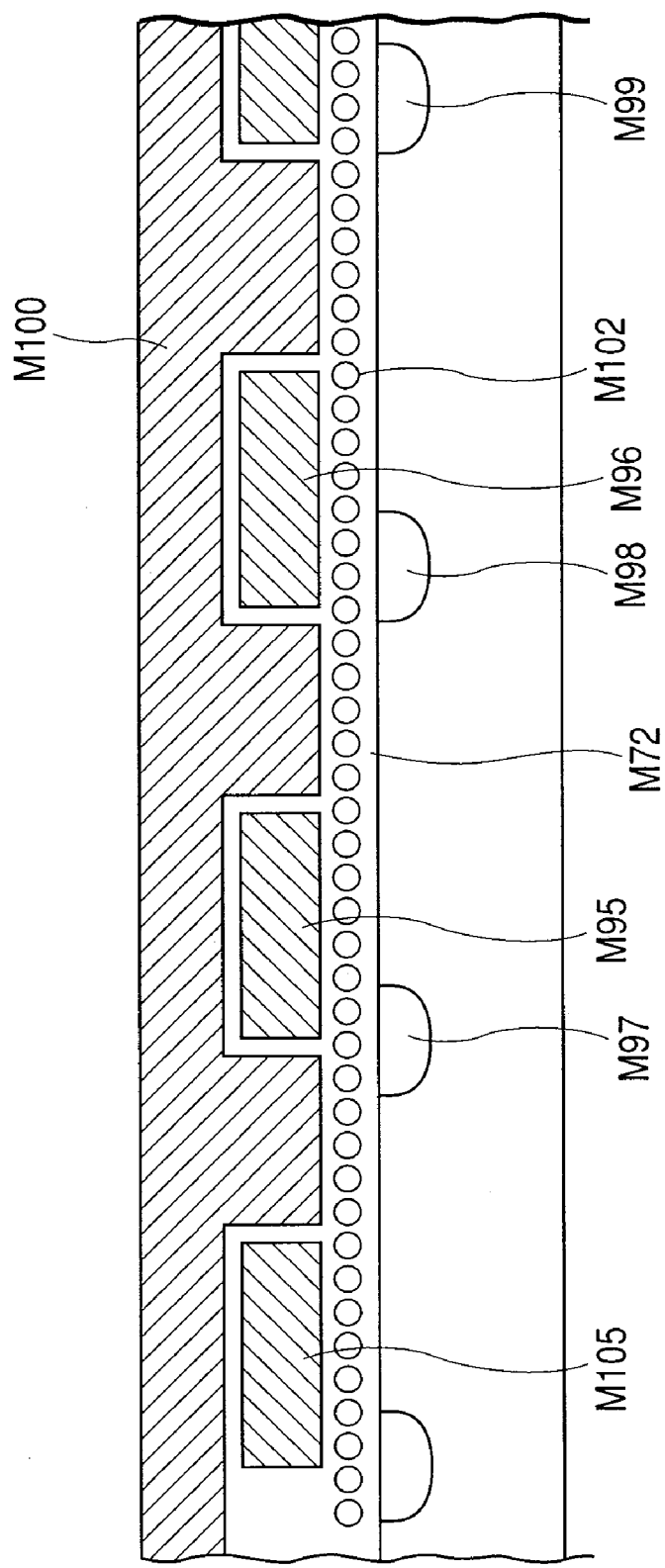

SEMICONDUCTOR DEVICE

CROSS-REFERENCES

This is a divisional application of U.S. Ser. No. 11/896,800, filed Sep. 6, 2007, which is a divisional application of U.S. Ser. No. 10/919,471, filed Aug. 17, 2004 (now U.S. Pat. No. 7,294,880), which is a divisional application of U.S. Ser. No. 09/944,073, filed Sep. 4, 2001, (now U.S. Pat. No. 6,849,895).

BACKGROUND OF THE INVENTION

The present invention relates to a semiconductor memory cell, and further to a semiconductor device.

In recent years, many portable apparatuses and/or equipments adopt flash memories for the purpose of high-speed readout operation. For the purpose of achieving the high-speed readout operation, in general, a memory cell array is used, in which memory cells are connected in parallel while one (1) piece of data line contact is provided for every pair of the cells connected in parallel, thereby suppressing parasitic resistance therein down to the minimum, so as to achieve the high-speed readout operation. Such memory cell array itself, however, was already known for many years, and was described, for example, in "Ouyou Butsuri", by KUME 65, p. 1114, (1996).

For the flash memory, it is important to keep the reliability of the memory cells thereof. For keeping the reliability of the memory cells, many technical innovations were made in the manufacturing processes thereof, however no drastic technology was developed up to now. At preset, redundant memory cells are also manufactured in the place thereof, in which a so-called ECC technology or the like is widely adopted, such as, replacing poor quality or defected cells in the circuits, electrically.

With the development of such the portable equipments or apparatuses, including, such as, a PDA, a digital camera, a cellular (mobile) telephone apparatus, etc., for example, as well as, wide spreading of so-called the multi-media, a non-volatile memory of large capacity comes to be important more and more in the future. In particular, the importance of the semiconductor nonvolatile memory cells, such as the flash memory, being a representative one thereof, is considered from the viewpoints of small-sizing, high-speed accessing, and shock-resistant property thereof. However, while reduction or scaling-down of sizes is proceeded in the horizontal direction on the cells, in accordance with the trends of the manufacturing technology thereof, but scaling-down is hardly done in the vertical direction, i.e., in the direction of the film thickness thereof. This is due to problems on reliability, including, such as, leakage under a low electric field, and so on, and because of this, the certainty is considered on that this short channel effect will come up remarkable in near future. It is also impossible to lower the voltage, in particular of the applied voltage therein, and then the sizes of the peripheral circuits cannot be made small, therefore the space factor of occupying an area of the memory cells on a chip falls down, and since the chip area cannot be made small irrespective of miniaturization thereof, the cost rises up.

Among those problems, various methods are proposed from a viewpoint of the write-in voltage. As the conventional technologies relating thereto, a method of using the secondary electron for injection is known, for example, in J. D. Bude et al., IEEE International Electron Device Meeting 1995, p989-991, 1995, and a method of applying the source-drain electric field for injection with using a step, for example, in S. Ogura et al., IEEE International Electron Device Meeting 1998, p987-990, 1998.

Also, there is other problem thereof, such as, price of the semiconductor nonvolatile memory. At present, comparing with, such as, a hard disc, an opt-magnetic disc, or a DVD, etc., the price per a unit of memory capacity of the semiconductor memory comes up as several-times high or more as that. Accordingly, the lowering of costs is necessary, however, so-called a multi-value memory technology is put into practical use, wherein information to be memorized into a unit cell is made up of two (2) bits. This means that a large number of levels are prepared through control of the electron number injected into a memory node (i.e., a floating gate). As an example of such the conventional art of the multi-value memory, there is known Jung et al., IEEE International Solid-State Circuit Conference 1996, p32-33, 1996. Also, a technology of memorizing independent information is known, not through the large number of the levels, but dividing the floating gate of one (1) cell into two (2), for example, in IEEE Transactions on Components, Pacing and Manufacturing Technology Part A, Vol. 20, 1997.

The ECC technology is able to lower the demand on the reliability for each unit of memory cells, however for it, since the electronic circuit is put into between them, therefore it means that the times necessary for read-out, write-in and erase operations are sacrificed. Accordingly, in particular for the application requiring a high read-out speed, this ECC technology cannot be applied to, therefore there is a problem that the reliability of cells has a direct influence upon the cost of memory.

The flash memory cell stores electric charge in the floating gate thereof, thereby to memorize information therein, however if there is leakage in any one of those floating gates, the memory cell is a poor quality or defected one. Accordingly, the entire memory device is the poor quality or defected one, including that memory cells therein. Thus, only the leakage in a portion of the floating gates results into the poor quality of the memory cell as a whole, therefore there is a problem that it comes up to the high price directly in manufacturing cost of the memory cell itself.

SUMMARY OF THE INVENTION

An object is, therefore, according to the present invention, to provided a semiconductor memory device and a control method thereof, wherein the manufacturing cost thereof can be suppressed to low, while keeping the high speed read-out operation.

As was mentioned above, various methods were proposed from the viewpoint of changing the method for injecting electric charge, and every one of them enables the electron injection (i.e., the write-in) with a voltage value, being lower than that in the ordinal flash memory, however the applied voltage cannot changed (i.e., not low) when it discharges electron (i.e., the erase). Further, the short channel effect was not treated with, to be dissolved therein.

Next, explanation will be made on the problem of using the large number of levels in the multi-value memory, hereinafter. The width of threshold voltage distribution in the cells must be narrow, comparing to that of one (1) bit memory, and the write-in or the erase operation is conducted by repeating verify operation, which conducts the read-out operation after application of a pulse for making the characteristics of them even or uniform. Because of this, there is a necessity of time period, being as several times or several-tens times long as an averaged injection (or discharge) time for electric charge, and this brings about fall-down in performances of the chip. Also, in the read-out operation, a result is calculated out after several times of the read-out operation, to be outputted, the performance is lowered comparing to that of the ordinal one (1) bit memory. Further, since the width between the threshold voltage distributions prepared is narrower than that of the one (1) bit memory, there is a problem in the reliability of memory. Those difficulties come to be further remarkable, if the information to be memorized into the unit of cell comes up to three (3) bits or more.

Also, according to the technology of dividing the floating gate, there is an advantage that the write-in and the read-out operations can be high-speeded, comparing to the case of preparing the large number of the levels by use of the single floating gate, however the machining is difficult, and the unit cell is large in the structure, therefore there is a problem that an effect is small on the cost reduction. Also, the electric charge injection at the drain end or terminal side is conducted through applying large voltage on the drain, thereby generating hot electron at the drain end. With such the method, since ratio of current injected into the floating gate is small to the drain current, therefore it necessitates large drain current. Accordingly, due to the restriction upon current driving ability of peripheral circuits thereof, the number of cells being writable at the same time is limited, then it has a problem that it is not suitable for such the memory of large capacity.

From the above-mentioned, an object according to the present invention is to provide a cell structure for realizing the scaling-down in the vertical direction while maintaining the reliability thereof. Also, another one is to provide a method for increasing the memorized information per a unit cell without greatly decreasing the performance of the cells. Furthermore, other one is to provide a method for realizing a large capacitor memory device with such the cells.

According to the present invention, not using the memory cells of the conventional art, being formed with a single charge storage area or region, but there is proposed a semiconductor memory cell comprising charge storage region, being formed with a large number of charge storage small regions, which are aligned independently through an insulation layer from an active region, at positions corresponding to a source region, a drain region, or the both the source region and the drain regions, thereby dissolving the problems mentioned above.

The detailed structure, the objects and the features of the present invention will be apparent from the following embodiments.

BRIEF DESCRIPTION OF THE DRAWINGS

FIG. 56 is a view for showing the cross-sectional structure of memory cell array portion, being cut in parallel to a word line and perpendicular to a data line, in the semiconductor device according to the embodiment 15;

DETAILED DESCRIPTION OF THE INVENTION

Hereinafter, explanation will be made on a semiconductor cell, a semiconductor device and a manufacturing method thereof, according to the detailed embodiments of the present invention.

(Embodiment 1)

Figure 1:
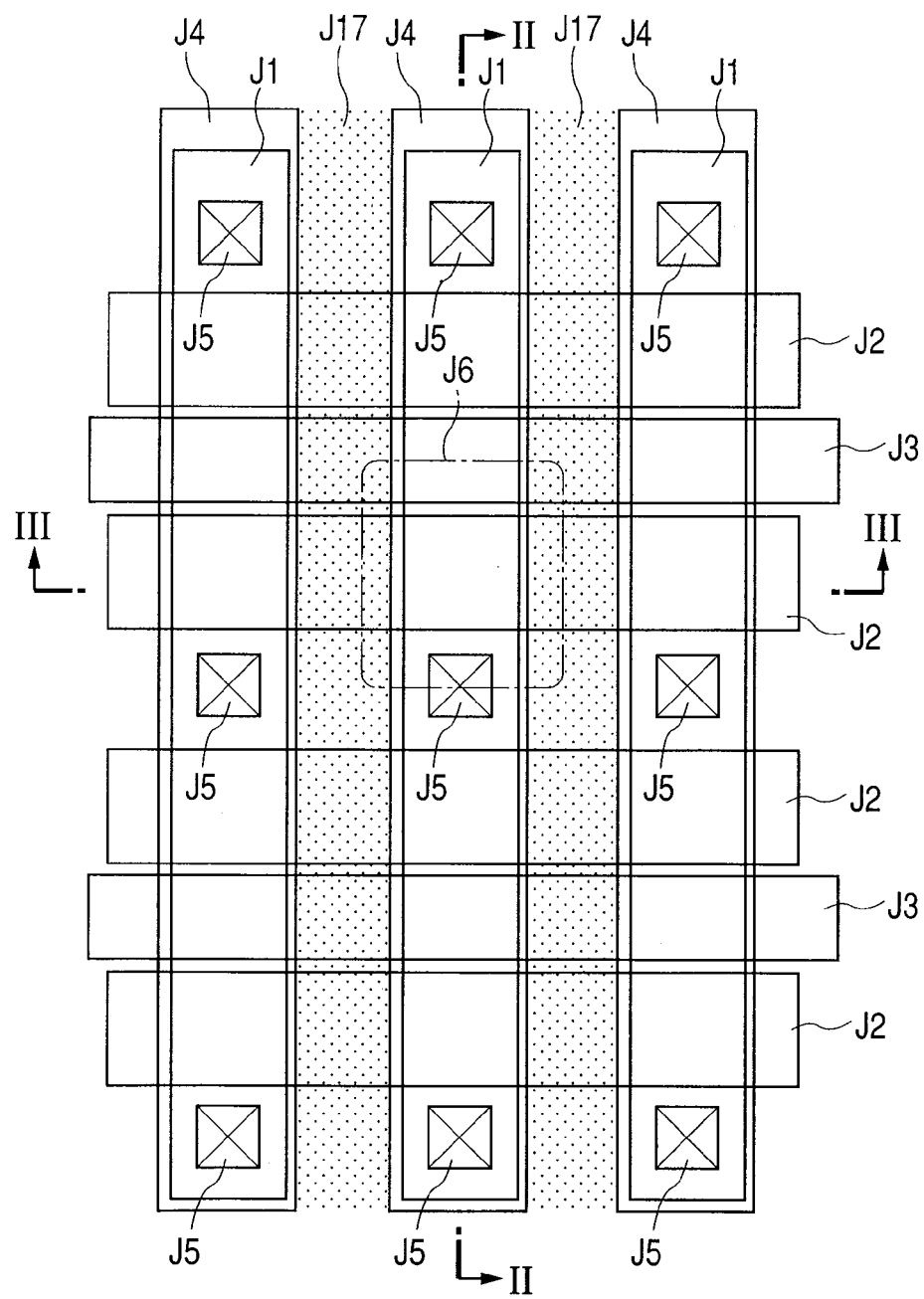
FIG. 1 is a view for showing a layout of a semiconductor memory device according to an embodiment 1.
Figure 2:
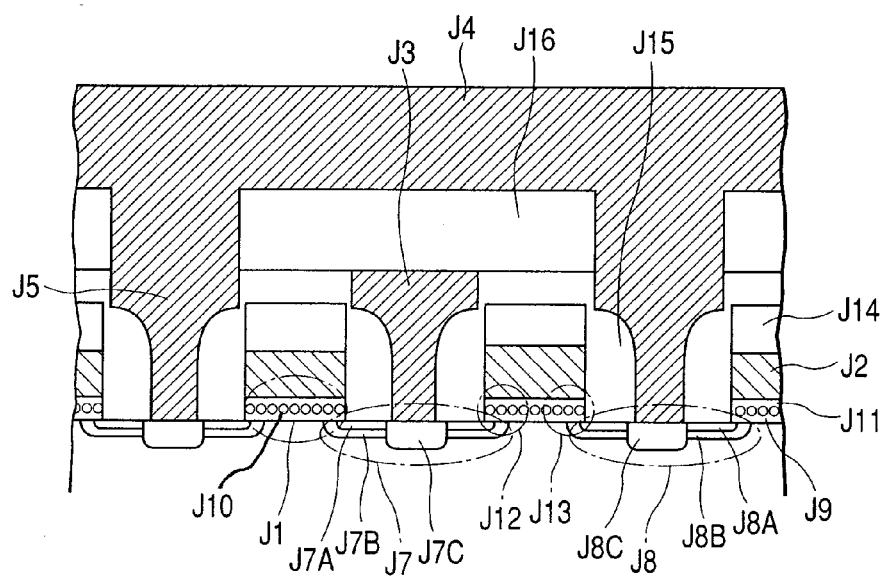
FIG. 2 is a view for showing the cross-section of the semiconductor memory device, shown along with II-II line into the direction of arrows in the FIG. 1.
Figure 3:
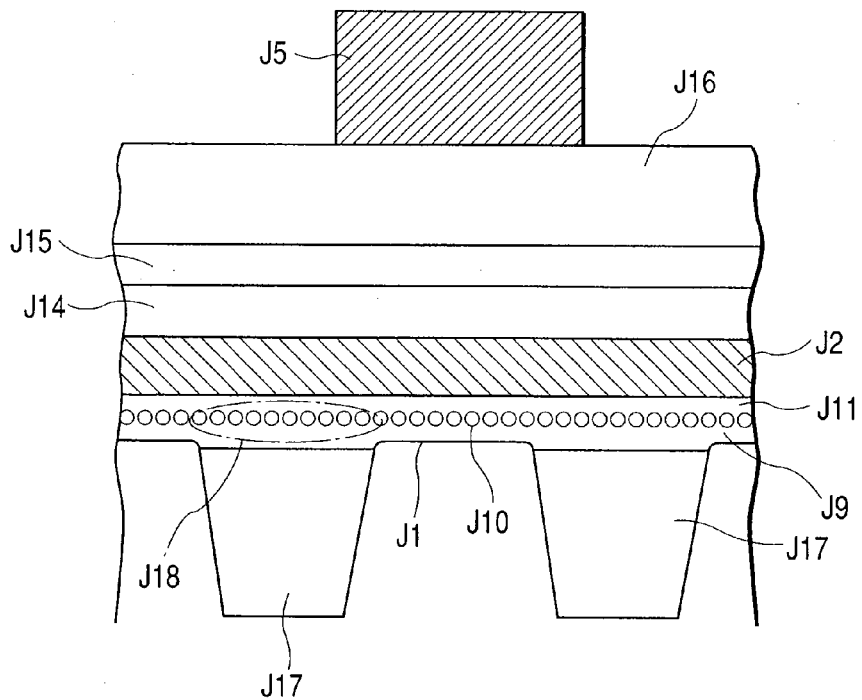
FIG. 3 is a view for showing the cross-section of the semiconductor memory device, shown along with III-III line into the direction of arrows in the FIG. 1.

A layout of the memory deice according to an embodiment 1 will be shown in FIG. 1. FIG. 2 shows the II-II cross-section view shown into the direction of arrows in the FIG. 1, within a range from a region J6 of a minimum memory unit to a data line contact J5 adjacent thereto. Also, FIG. 3 shows the cross-section view shown into the direction of arrows in the FIG. 1, within a range of the region J6 of the minimum memory unit. Actually, an array is constructed in a scale being much more larger than this, however in the FIG. 1, there is shown a small-scaled cell array of 3×4, for the purpose of explanation thereon. There are provided cell separation regions J17 and active regions J1 where electric charge can move on a P-type silicon substrate. Perpendicular to this active region J1, there is provided a word line J2 made of polysilicon, and in parallel to this word line J2 is provided a source line J3 made of tungsten. Also, perpendicular to this source line is a data line J4. On the active region J1, within a region defined between the word lines J2 lies a data line contact J5 for connecting the data line J4 and a drain J8 on the active region J1. A region J6 indicated by one-dotted chain line is the minimum memory unit. In the FIG. 1, reference marks or numerals are attached to almost all of the constituent elements, however in the following drawings, the reference numerals will omitted on some of them, which can be seen without them.

In the FIG. 2, a n-type source region J7 and a drain region J8 are provided on the P-type silicon substrate, and on the active region J1 are aligned a large number of fine crystal grains J10 of silicon having an averaged diameter of 13 nm through an insulation layer J9 of thickness 11 nm, which functions as charge storage regions J12 and J13. A word line J2 of n-type polycrystalline silicon is provided for controlling an electrical potential of the charge storage region, and between the silicon fine crystal grains J10 and the word line J2 is provided an insulation layer J11 of ONO structure, including $SiO_2$ layer of thickness 4 nm, $Si_3N_4$ film of thickness 8 nm and $SiO_2$ layer of thickness 4 nm, in that order from below. J14-J16 are insulation layers.

In the FIG. 3, since each of the silicon fine crystal grains constructing the charge storage region forms a charge storage small region of semiconductor, being independent from, respectively, there is no problem in memory operations if an charge storage region remains on the cell separation region J17. Dry etching, wet etching or a combination of them may removes the charge storage region J18 on this cell separation region.

Figure 4:
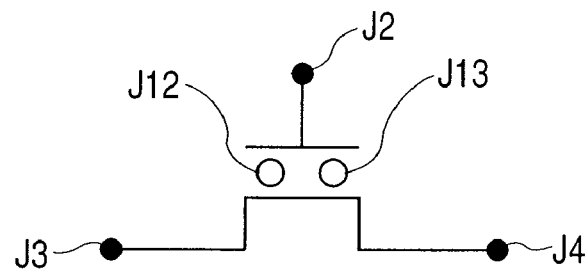
FIG. 4 is a view for showing symbols on a circuit diagram corresponding to a memory cell of the embodiment 1.

FIG. 4 shows symbols of an unit of the memory cell on a circuit diagram, which is used in the embodiment 1, and the same reference marks are attached to the portions corresponding thereto.

Figure 5:
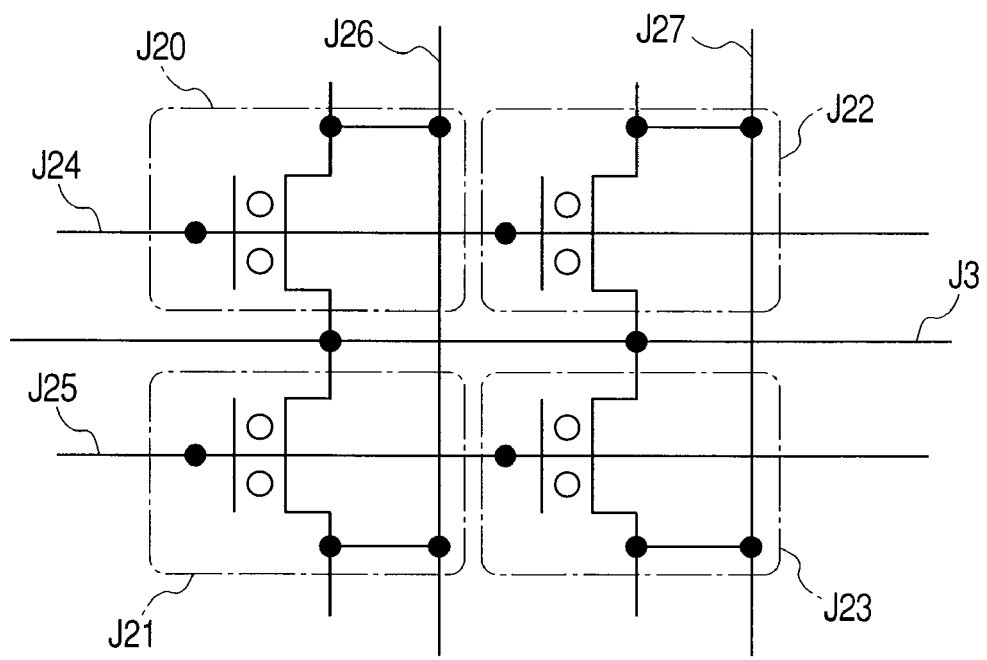
FIG. 5 is a view for showing an equivalent circuit of the semiconductor memory device according to an embodiment 1.

FIG. 5 shows an equivalent circuit of the embodiment 1. Actually, the array is constructed in a scale being much larger than this, however herein, there is shown a small-scaled cell array of 2×2, for the purpose of explanation.

Next, explanation will be made on the operation of the embodiment 1. According to the present invention, injection of electron into the charge storage regions J12 and J13 is carried out by applying voltage onto the word line J2 and the data line J4 at the same time, thereby generating hot electron.

First, write-in operation will be explained. Herein, it is assumed that a condition of injection of much electric charge corresponds to information "1", while the condition of less electric charge corresponds to information "0". Now, assuming that the memory cell indicated by J20 in FIG. 5 is a selected cell, explanation will be given on a case where the information "1" is written only into this memory cell J20, for example. Voltage of the data line J26 is set up, so that sufficient electric field can be established for generating hot electrons (for example, 5V). Electric potential of the source line J3 is set up to 0V. Further, voltage of the word line J24 is set up (for example, 11V), so that the generated hot electrons can be drawn into the charge storage region (hereinafter, it may be said "charge storage node", sometimes). In this instance, the hot electrons are concentrated to be stored into a portion of the charge storage region J12 in the FIG. 2, since almost of them are generated on a side of the data line J26 within the cell.

In this instance, with a non-selected memory cell J21, the electric potential of the word line J25 is set to a value, so that no current flows within the cell (for example, 0V). Also, to the non-selected memory cell J22, the electric potential of the data line J27 is set to a value, so that no current flows within the cell (for example, 0V). In this instance, within the non-selected memory cell J23, all the electric potentials at the word line J25, the data line J27, and the source line J3 are at the value (assuming to be 0V, for example), so that no current flows within the cell. Accordingly, when the information "1" is written into the selected memory cell J20, there is no chance that the information in the non-selected memory cells J21, J22 and J23 is destroyed. Herein, a relationship will be shown on a Table 1, on the write-in voltages mentioned in detail in the above.

TABLE 1

| Selected Word Line Voltage | Non-Selected Word Line Voltage | Selected Data Line Voltage | Non-Selected Data Line Voltage | Source Line Voltage |
| --- | --- | --- | --- | --- |
| 11 V | 0 V | 5 V | 0 V | 0 V |

In this instance, since high voltage is applied between the word line and the data line in the non-selected memory cell in the conventional flash memory made up with a semiconductor having a single charge storage region according to the prior art, the stored information is completely destroyed by a unit of the memory cell if at least one of leak path is formed once between the data line. Accordingly, quality control is very important, in particular, on dielectric strength of insulation between the charge storage region and the data line, and also brings about increase in costs of the entire memory device. However, in the embodiment 1, since each of the fine crystalline grains of silicon, building up the charge storage region therewith, forms an independent charge storage small region of semiconductor, respectively, only a part of the electric charge of the fine crystalline grains is lost, which are connected to the leak path in a part thereof, therefore there is no way that the stored information is completely destroyed by the unit of memory cell, and it is possible to memorize the information stably, as well as, to reduce the manufacturing costs thereof.

The similar can be also applied onto the non-selected memory J22. In such a case where the leakage occurs at least one place within the charge storage region with low voltage through tunnel oxide film, which is deteriorated due to, so-called the re-write stress, the stored information is completely destroyed. Accordingly, quality control is very important, in particular, on dielectric strength of insulation when stress is applied on the tunnel oxide film, and further brings about increase in the costs of the entire memory device. Herein, also in the similar manner to the case of the non-selected memory cell J12, since only a part of the electric charge of the fine crystalline grains is lost, which are connected to the leak path in a part thereof, the stored information can be prevented from being destroyed by the unit of memory cell, completely, therefore it is possible to memorize the information stably, as well as, to reduce the manufacturing cost thereof.

And, a method is also effective, wherein negative substrate bias voltage (for example, −2V) is applied during the write-in operation, thereby to lower voltage of the word line J25 for it (for example, down to 9V). The biasing of the substrate with negative voltage is conducted by introducing a triple well structure therein. In this instance, P well is shared by a several pieces of the memory cells neighboring with each other (for example, J21, J22 and J23) in common. Since the word line voltage used can be lowered in the absolute value thereof, it brings about an advantage that the voltage generator thereof can be simplified, and in addition thereto, since concentration of electric field easily occurs in the drain region J8, there can be obtain a feature that an efficiency in electron injection is increased. Details of relationships of voltages are shown in the following Table 2, when conducting the write-in operation with using further the substrate bias thereto.

TABLE 2

| Selected Word Line Voltage | Non-Selected Word Line Voltage | Selected Data Line Voltage | Non-Selected Data Line Voltage | Source Line Voltage | Substrate Voltage |
|---|---|---|---|---|---|
| 9 V | 0 V | 5 V | 0 V | 0 V | −2 V |

Explanation will be given on the erase operation of information. Erasing of information is conducted for the cells, which are driven on the same word line, collectively. Herein, the explanation will be given about the erasing onto the memory cells J20 and J22, which are driven by the same word line J24 in the FIG. 5. Negative voltage (for example, −21V) is applied onto the word line J24. For example, the source line J3 and the data lines J26 and J27 are set to 0V in the electric potential thereof. In this instance, electrons being injected in are discharged into the substrate side due to the high electric field. Further, in this instance, the well potential may be set at to be higher than 0V (for example, 5V), while the voltage applied onto the word line J24 may be made smaller in the absolute value for it (for example, −16V). The voltage used can be made small in the absolute value thereof, and therefore the voltage generator thereof can be simplified.

In the erase operation, also the superiority of the present embodiment to the conventional art having the single charge storage region therein is similar to that in the write-in operation mentioned above. According to the conventional art, if deterioration occurs in the dielectric strength of insulation on the tunnel oxide film at least one place thereon after applying the re-write stress, there may occurs a drawback that some memory cells have extremely fast erase speed. The memory cell having such the extremely fast erase speed is normally turned ON in the condition thereof, therefore it causes erroneous operation when reading out data therefrom. In the embodiment 1, which has the charge storage region built up with a large number of the independent charge storage small regions of semiconductor, since only the electric charge of the charge storage small regions is lost, which are connected to the leak path, information can be memorized with stability, and the manufacturing costs thereof can be reduced down.

Explanation will be given on the read-out operation of information. The explanation will be made on the read-out operation of the information stored in the selected memory cell J20, for example. Setting that voltage of the data line J26 is 2V, while that of the source line J4 is 0V, for example, a read-out pulse of 2V is applied to the word line J26. Since threshold voltage differs depending upon an amount of the electric charge injected into the charge storage region, current on the data line J26 memorizing "0" thereon is larger than that on the data line J26 memorizing "1" thereon, therefore the read-out of information can be conducted.

Next, explanation will be given on a manufacturing method of the embodiment 1. After forming the element separation region J17 and the triple well structure, boron ion is implanted in a memory cell-forming region on the P well for the purpose of adjusting the threshold voltage thereof. After forming the tunnel oxide film J19 at thickness of 1 nm with oxidization of a surface of the substrate, the silicon fine crystalline grains J10 are formed by means of CVD (Chemical Vapor Deposition). In the trial manufacturing, they are formed at an average of 7 nm in diameter, and at density of $5\times10^{11}$ pieces per 1 square centimeter ($cm^2$). The interlayer insulation layer J11 of ONO structure is formed with $SiO_2$ of thickness 4 nm, $Si_3N_4$ of thickness 8 nm, and $SiO_2$ of thickness 4 nm, in that order from the below. At this stage, through a resist mask, dry etching is conducted upon the ONO film at a portion corresponding to the gate of a peripheral circuit portion, as well as, dry etching upon the silicon fine crystalline grains, thereafter impurity is implanted for adjusting the threshold value thereof, and further oxidization is conducted thereupon. The etching upon the silicon fine crystalline grains may be conducted by combination of dry etching and wet etching. Repeating the process starting from the dry etching on the ONO film to the oxidization two (2) times or more enables the use of two (2) kinds of gate oxide films or more for the peripheral circuit.

For forming the gate electrode and the memory cell word line J2 of the peripheral circuit portion, n-type polycrystalline silicon is piled up or accumulated at thickness of 200 nm, and further $SiO_2$ at thickness 300 nm thereon. Through resist mask, dry etching upon $SiO_2$ is conducted on both the memory cell portion and the peripheral circuit portion. As a result of this, in the memory cell portion, $SiO_2$ is remained, as like the J14. Further, dry etching is conducted upon the polycrystalline silicon. Herein, only the memory cell portions are opened on the resist mask, and then dry etching is conducted upon the ONO film. Implantation of impurity, such as arsenic and/or boron, is conducted on it as it is, and then active annealing is conducted thereon. Accordingly, the source region J7 and the drain region J8 of the memory cell portion are built up with portions J7A and J8A made of arsenic and portions J7B and J8B made of boron, respectively. In the peripheral circuit portions, the source region and the drain region are formed through the implantation of impurity, in the same manner. Thereafter, $Si_3N_4$ is piled up, and further $SiO_2$ thereon. Flattening process is conducted thereon, and further $SiO_2$ is piled up thereon. Herein, the data line contact and the source line are opened through the resist mask. $SiO_2$ at the opening portion is removed by dry etching. The $SiO_2$, which cannot be removed from, remains as like the J16. In this instance, since the foundation is made of $Si_3N_4$, due to the selectivity in dry etching upon $SiO_2$ and $Si_3N_4$, the data line contact and the source line are opened correctly, in a manner of self-alignment, in the drain region and the source region, irrespective of shifting of the resist patterns thereof in a certain degree. Furthermore, through etching upon the foundation made of $Si_3N_4$, the source region and the drain region of the substrate are opened. With this etching on $Si_3N_4$, sidewalls J15 of $Si_3N_4$ are formed. Herein, for making the contact much stronger or stiffer, implantation of impurity is conducted, such as of phosphorous, and active annealing is conducted thereon. Phosphorous is diffused into a portion J8C. Thereafter, thin film of $SiO_2$ may be piled up and further treated with etch-back thereon, thereby to prevent short-circuiting from being formed between the data line contacts J5. After this, the peripheral circuit portions are also opened through the resist mask, and further etching is conducted therethrough, and then, in the same manner, the implantation of impurity and the active annealing are conducted thereon for the purpose of obtaining the strong or stiff contacts thereof. After this, tungsten is piled up and is flattened. After the flattening, $SiO_2$ is piled up on it, and then conducting etching through the resist mask thereon opens memory cell drain contact portions. After this, tungsten is piled up, again. Conducting etching on this tungsten through the resist mask forms the data line (J4). With repeating the similar processes hereinafter, wiring processes are conducted.

(Embodiment 2)

Explanation will be made on an embodiment 2. The layout of the memory cells, the cross-section and the equivalent circuit thereof are same to those of the embodiment 1 mentioned above. In the present embodiment 2, shifting the place where the electric charge is stored or accululated achieves memorizing of two (2) bits or more per a unit of the memory cells.

First, explanation will be given on the write-in operation of information. The explanation will be made on an example, in which the write-in operation of information "01" is achieved by injecting electric charge into the charge storage region J13 on the side of the selected memory cell J20 in the FIG. 5. Voltage on the data line J26 is set at a value, so that sufficient electric field can be established for generating electrons (for example, 5V). The potential of the source line J3 is set at 0V. Further, voltage on the word line J24 is set at a value, so that the electrons generated can be drawn into the charge storage node J13 (for example, 11V). In this instance, almost of hot electrons are generated in the charge storage region within the selected cell J20, on a side being connected to the data line J26, therefore they are accumulated concentrating into the portion of the charge storage region J13 in the FIG. 2. In this instance, since electrons are scarcely generated in the charge storage region at the side connected to the source line J3, no destroy of information occurs in the charge storage region J12 at the side connected to the source line J3. For writing-in of the information "01" with injecting electric charge into the charge storage region J12 at the side connected with the source line J3, it is enough to switch over the voltages between the data line J26 set in the above and the source line J3.

Also, in the write-in operation, it is also true that the method, in which, while applying negative substrate bias voltage (for example, −2V), the voltage of the word line J24 is lowered for it (for example, it is set at 9V), is still effective, in the same manner in the embodiment 1.

Explanation will be made on the erase operation of information. Erasing of information is conducted for the cells, which are driven on the same word line, collectively. Herein, the explanation will be given about the erasing onto the memory cells J20 and J22, which are driven by the same word line J24 in the FIG. 5. Negative voltage (for example, −21V) is applied onto the word line J24. For example, the source line J3, and the data lines J26 and J27 are set to 0V in the electric potential thereof. For this, electrons being injected in are discharged into the substrate side due to the high electric field. Further, in this instance, the well potential may be set at to be higher than 0V (for example, 5V), while the voltage applied onto the word line J24 may be made smaller in the absolute value for it (for example, −16V). The voltage applied or used can be made small in the absolute value thereof, and therefore the voltage generator thereof can be simplified.

Figure 6:
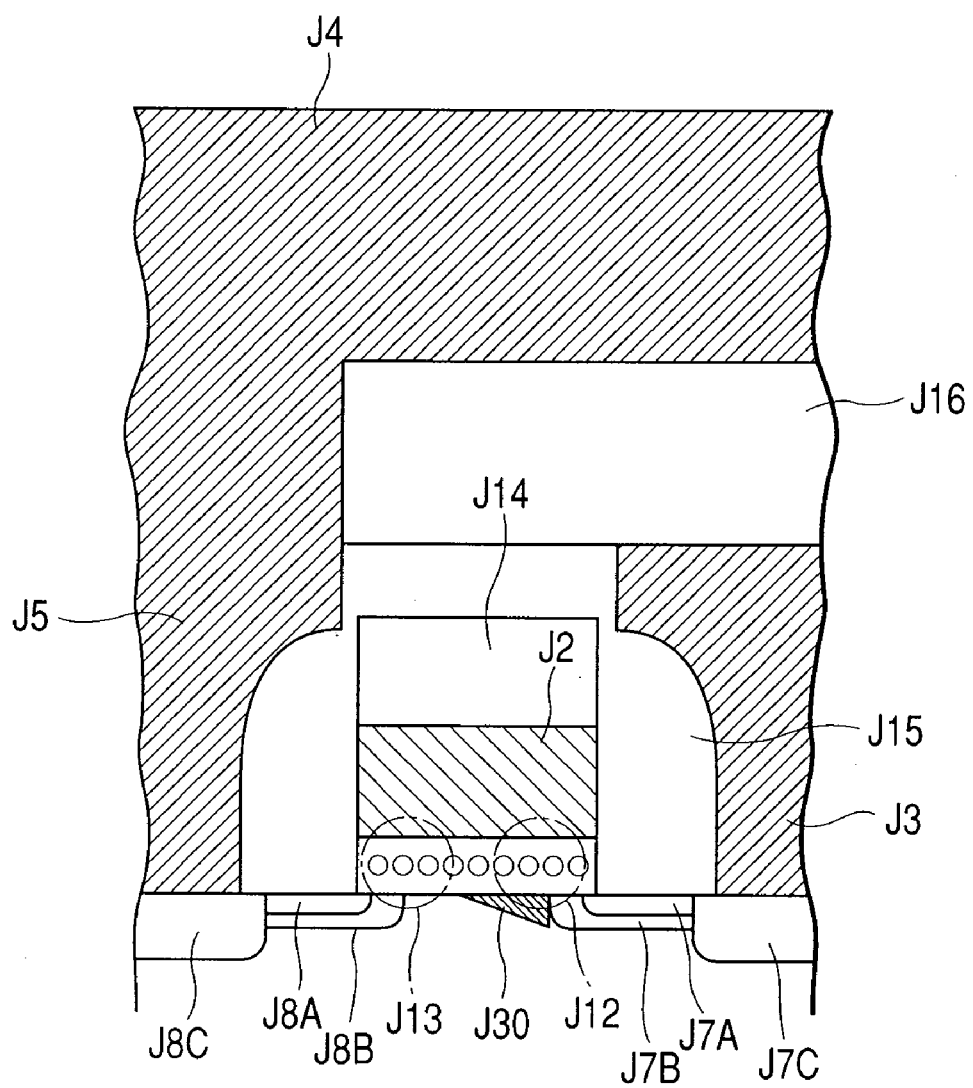
FIG. 6 is a view for showing the principle of read-out is operation of a memory method of two (2) bits or more per one (1) cell, in an embodiment 2.

Read-out operation will be explained by referring to FIG. 6. Herein, the explanation will be given on an example, where information is read out from the selected memory cell J20. Transistors constructing the selected memory cell are operated in the saturated area or region thereof. For reading out the information stored in the charge storage region J12 at the side of the source line J3, 2V is applied onto the data line J26, 0V onto the source line J3, and 2V onto the word line J24, respectively. In this instance, a channel 30 is defined, however in the vicinity of the substrate surface just below the word line J24, the side connected with the data line J26 is in the condition of "pinch-off", therefore no channel is formed therein. As a result of this, only the charge storage region J12 at the side of the source line J3 has influences upon the threshold voltage, therefore it is possible to eliminate the influences due to the electric charge stored in the charge storage region J13 at the side of the data line J26. If the electric charge stored is much more in the charge storage region J12 at the side of the charge storage region J13, the threshold voltage comes to be high, on the contrary, if less, it comes to be low, therefore the conductance in the selected memory cell J20 differs dependent upon an amount of the electric charge stored therein. With this difference in the conduction, current flowing through also changes in the amount thereof, and further voltage on the data line differs, therefore the read-out of information can be conducted with the difference in the voltage on the data line. For reading out the information within the charge storage region J13 at the side of the data line J26, it is enough to change over the set voltages between the data line J26 and the source line J3.

The write-in operation or the read-out operation can be switched over by simply exchanging the set voltages between the source and the drain. Accordingly, comparing with the method, in which four (4) levels are made up depending upon the charge amount injected into the single floating gate, the number of steps is small, which are necessary for the write-in operation and/or the read-out operation, and then high speed operation can be obtained. Also, at each of both ends of the charge storage region, since it performs the two (2) level operations, i.e., the information is "0" or "1", therefore also an operation margin can be increased.

In the conventional write-in operation, in particular in case of using the multi-levels, it is necessary to suppress spreading in the distribution of the threshold voltages between the cells, highly. For this, the read-out operation is conducted after applying the write-in pulse, so as to conduct a so-called verify operation of repeating the operation, in which the write-in pulse is applied again when voltage does not reach to a predetermined threshold voltage, and this comes to be a factor of lowering the through-put in the write-in operation. Accordingly, the effect of high speeding according to the embodiment 2 is remarkable, in particular in the write-in operation. In addition thereto, in the embodiment 2, because of the large number of the fine crystalline grains of silicon, which construct the charge storage region, an averaging is made on the write-in operations. As a result of this, the fluctuation between the cells can be reduced, then the operation of memorizing two (2) bits per a unit of memory cell can be obtained without such the verify operation. The averaging on the write-in operations is also effective to a defect, in which the write-in operations advance with extraordinary high speed by some of the cells, due to, such as, the defects in the tunnel insulation film, etc.

Figure 7:
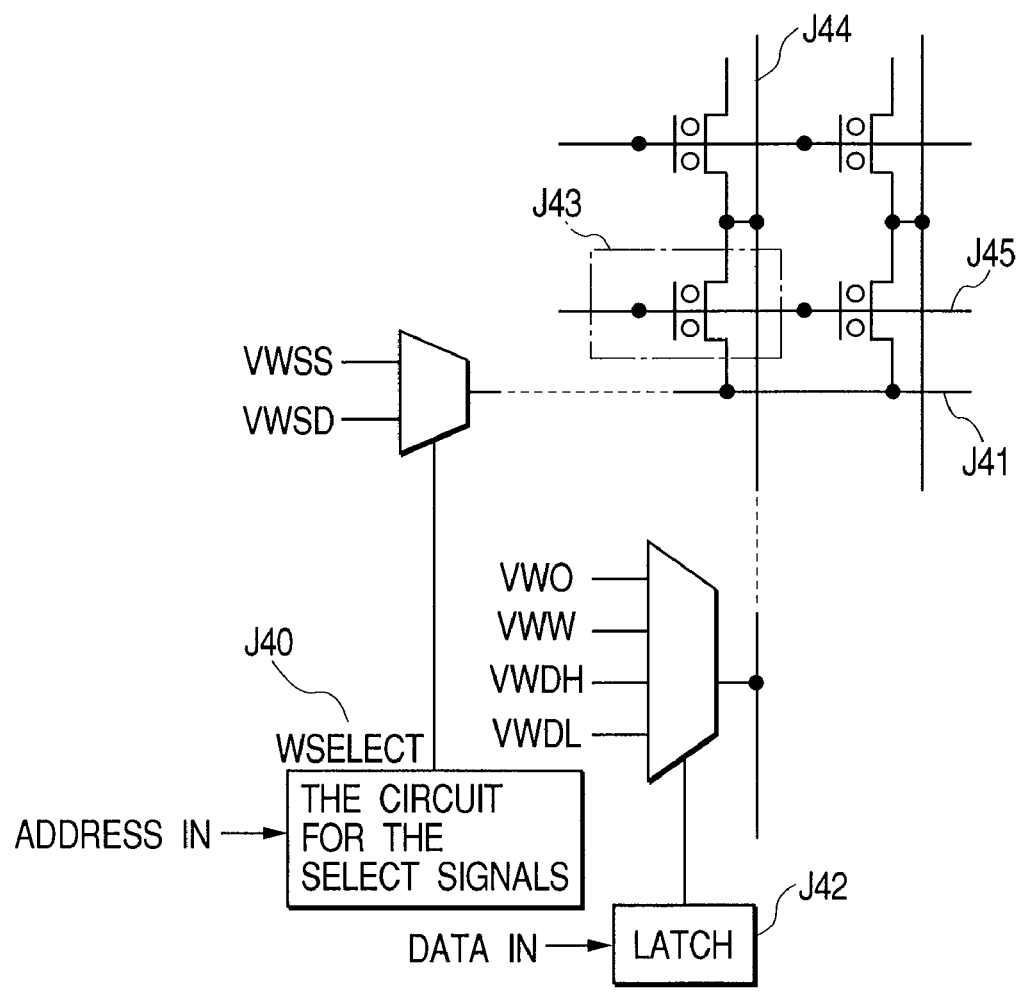
FIG. 7 is a view for showing write-in operation including drives of peripheral circuits therearound.

Next, explanation will be given on a driving method of the entire memory device including peripheral circuits thereof. First of all, the write-in operation will be explained by referring to FIG. 7. According to addresses inputted from an outside, a signal WSERECT J40 is generated, indicating either a source end write-in operation should be conducted or a drain end write-in operation. Depending upon the signal WSERECT J40 generated, voltage on the source line J41 is changed to either one of VWSS and VWSD. Input data is, first of all, stored into a latch J42. Herein, it is assumed that input voltage "high" corresponds to information "1", while "low" to information "0". In the source end write-in operation of the cell J43, the VWSS (for example, 0V) is applied onto the source line J41, and the voltage on the data line J44 is set to VWDL (for example, 0V) if information to be written is "0", while it is set to higher voltage, VWDH (for example, 5V), if being "1", and a pulse of high voltage VWW (for example, 12V) is given onto the word line J45. In the case when it is set to the VWDL, since hot electrons are scarcely generated, the charge injection into the memory node is less, but in the case when being set to VWDH, an amount of the charge injection is much. In this instance, also with other cells which are driven by the same word line, information can be written into them at the same time, by setting data line voltage connected with to, the VWDL or VWDH depending upon the data to be written into. Herein, no charge is injected when writing "0", accordingly, it is equal to the case where no write-in operation is made, therefore it is also possible to conduct the write-in operation of information only in a portion of the cells, which are driven by the same word line. Also on other word lines, no write-in operation are conducted if it is set at voltage (for example, V) being lower than the high voltage VWW.

Next, explanation will be given on the drain end write-in operation. The VWSD (for example, 5V) is applied onto the source line J41, and voltage on the data line J44 is set to the VWDL (for example, 0V) if the information is "0" while to the VWDH (for example, 5V) if being "1", in the same manner as for the source end write-in operation. After this, a pulse of the high voltage VWW (12V) is given onto the word line J45, thereby enabling the write-in operation. Herein, since the VWDH on the data line is in the condition for the charge injection in the source end write-in operation, on the contrary to this, since the VWDL on the data line is the condition in the drain end write-in operation, there is a feature that a corresponding relationship in the height between the memorized information and the threshold voltage is reversed, on the source terminal and the drain terminal.

The erase operation of information is conducted at once on the cells, which are driven with the same word line, collectively, and the information is erased at the source end and the drain end at the same time.

Figure 8:
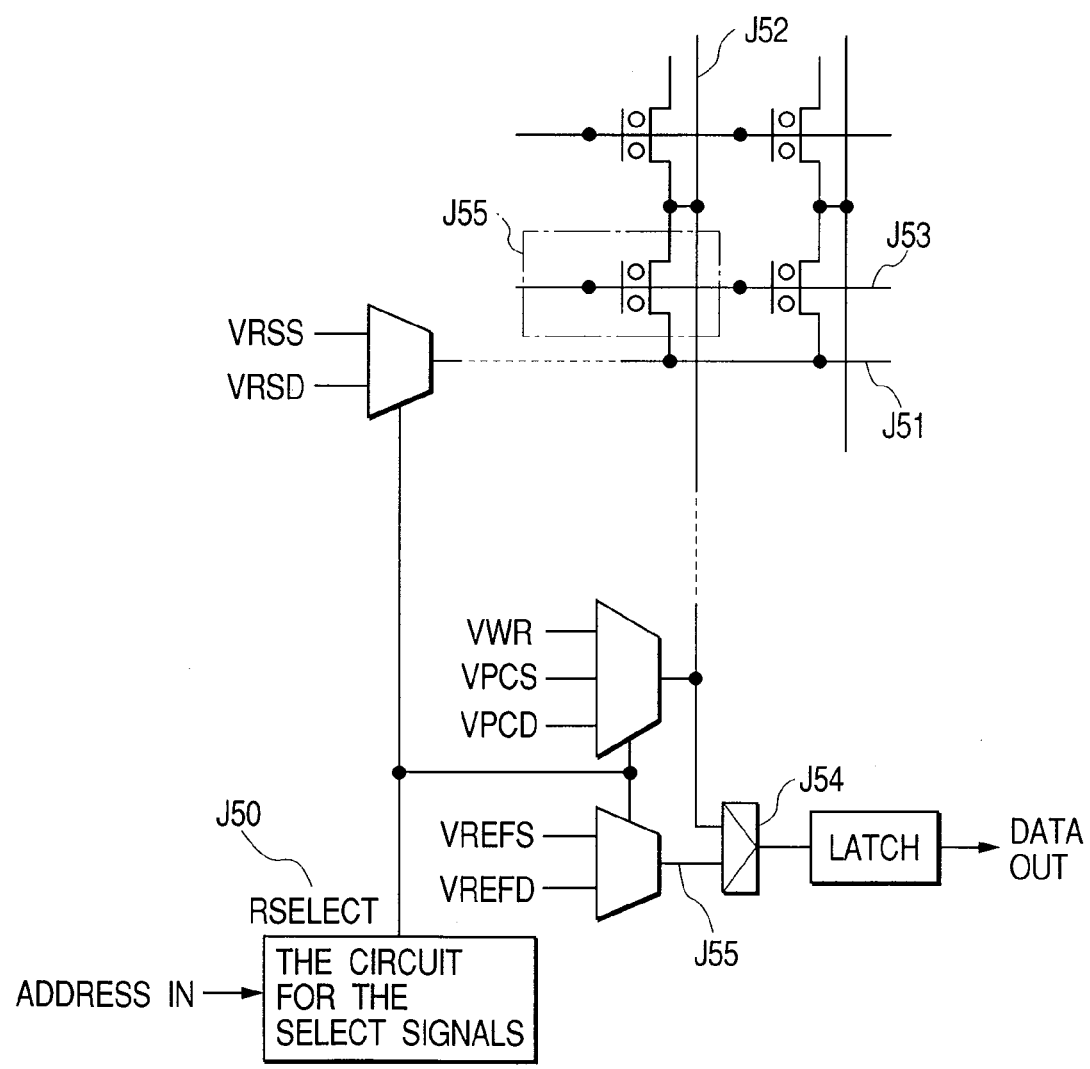
FIG. 8 is also a view for showing the write-in operation including drives of peripheral circuits therearound.

Next, explanation will be given on the read-out operation of information, by referring to FIG. 8. First, according to an address(es) of the memory cell(s) to be read out, being applied from an outside, the signal RSERECT J50 is generated, which indicates whether the source end read-out operation should be conducted or the drain end read-out operation. A circuit for generating the selection signal RSERECT from this address may be shared in common with a selection signal generator circuit, which generates signals when writing. Depending upon the RSERECT J50 generated, as will be explained below, voltage on the source line J51, pre-charge voltage and reference voltage are exchanged. For reading out the information in the source end of the cell 55, voltage on the source line J51 is set to VRSS (for example, 0V), so as to pre-charge it on the data line J52 up to voltage VACS (for example, 3V) being higher than the VRSS, and thereafter a read-out pulse of voltage VWR (for example, 2V) is applied onto the word line. In this instance, current flows not so much when the threshold voltage at the source end is high, therefore the potential on the data line J52 does not fluctuate so much from the VPCS, on the contrary to this, a large amount of current flows through when the threshold voltage on the source end is low, and the potential on the data line J52 falls down largely from the VPCS. One terminal of a sense amplifier J54 of a differential amplification type is connected to the data line, while on the other terminal J55 is provided small voltage VREFS (for example, 2.4V) being smaller than the VPCS, as a reference potential. With actuating the sense amplifier J54 at a predetermined timing, it is amplified up to a high potential when the threshold voltage of the source end is high, while it is amplified to a low potential when being low. The timing of actuating the sense amplifier is preferably so determined, that the voltage on the data line lies high in condition thereof, then the memory cells can operate within the saturation region thereof even when the threshold voltage is low. Thus, it is preferable that the sense amplifier is actuated under the condition that the voltage on the data line is higher than VWR-Vth, with assuming that the threshold voltage is Vth when the threshold voltage of the source end is low. This is because, if so, it is hardly influenced from the memorized information in the drain end, thereby enabling the operation with stability.

Voltage settings are different in the drain end information read-out operation. Voltage on the source line J51 is set at the voltage VRSD (for example, 3V) being higher than the VRSS, so as to pre-charge it on the data line J52 to the voltage VPCD (for example, 0V) lower than the VRSD, and thereafter a read-out pulse of the voltage VWR (2V) is applied onto the word line.

In this instance, current does not flow so much when the threshold voltage on the drain end is high, therefore the potential on the data line J52 does not fluctuate so much from the VPCD (0V), on the contrary to this, a large amount of current flows through when the threshold voltage on the drain end is low, and the potential on the data line J52 raises up largely from the VPCD (0V). The reference potential given to the sense amplifier is voltage VREFD (for example, 0.6V), being larger than the VPCS (0V). With actuating the sense amplifier J54 at a predetermined timing, it is amplified to a low potential when the threshold voltage on the drain end is high, while it is amplified up to a high potential when being low. Accordingly, herein again, the relationship in the height between the result of amplification and the threshold voltage at each end is reversed, between the source end and the drain end, and it comes to be a correct operation, being combined with the write-in method explained in the above. The write-in operation and the read-out operation mentioned above are summarized in a Table 3, below.

TABLE 3

| | Input Information From Outside | Data Line Setting When Writing | Threshold Value Of Cell | Data Line Voltage After Readout Amplification | Output Information To Outside |
|---|---|---|---|---|---|
| Source End Memory | "0"(L) | VWDL(L) | (L) (Source End) | (L) | "0"(L) |
| | "1"(H) | VWDH(H) | (H) (Source End) | (H) | "1"(H) |
| Drain End Memory | "0"(L) | VWDL(L) | (L) (Drain End) | (L) | "0"(L) |
| | "1"(H) | VWDH(H) | (H) (Drain End) | (H) | "1"(H) |

(Embodiment 3)

Figure 9:
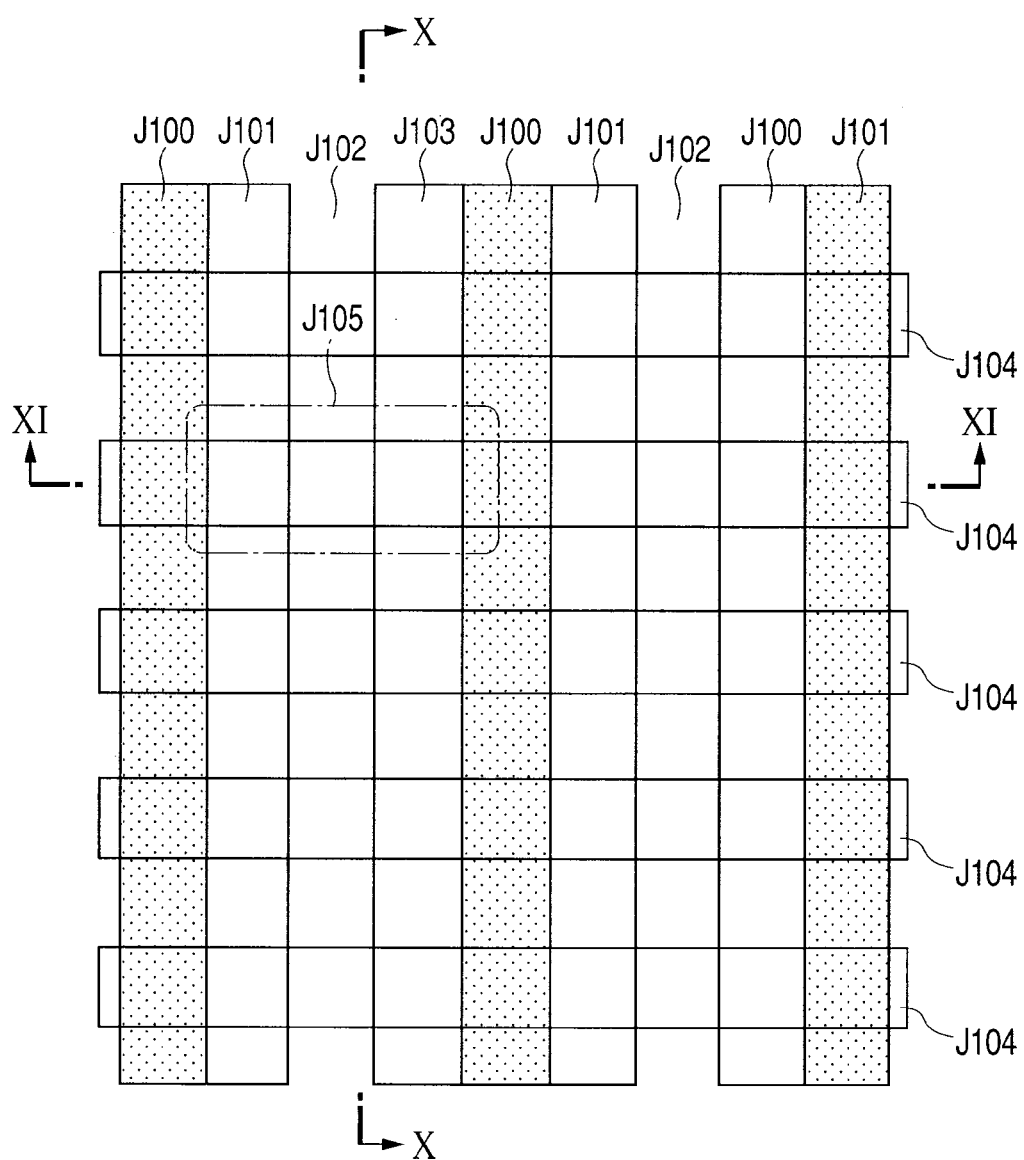
FIG. 9 is a view for showing a layout of a semiconductor memory device according to an embodiment 3.

A layout of the memory device according to an embodiment 3 will be shown in FIG. 9. Actually, the array is constructed in a scale being much larger than this, however herein, there is shown a small-scaled cell array of 2×5, for the purpose of explanation. On the P-type silicon substrate, there are formed cell separation regions J100, n-type diffusion regions J101, being in parallel with those cell separation regions as local source lines, and n-type diffusion regions J103 as local data lines. Perpendicular to those diffusion regions J101 are formed word lines J104 made of n-type polycrystalline silicon. Also, being put between the and n-type diffusion regions J101 and J103, p-type diffusion layer J102 is formed in a portion, but not just below the word lines J104. J105 constitutes the minimum memory unit. Actually, the array is constructed in much larger, scale than this, however herein, the small-scaled cell array of 2×5 is shown, for the purpose of explanation.

Figure 10:
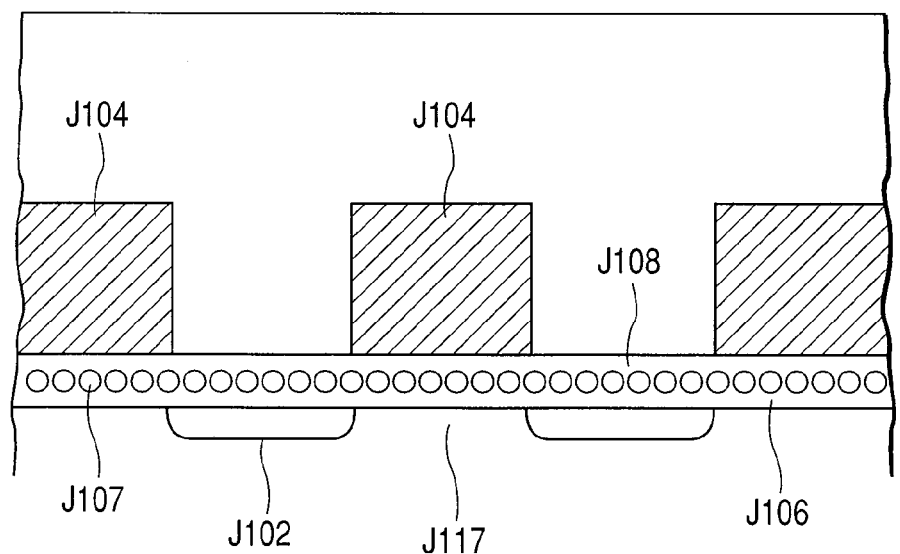
FIG. 10 is a view for showing the cross-section of the semiconductor memory device, shown along with X-X line into the direction of arrows in the FIG. 9.
Figure 11:
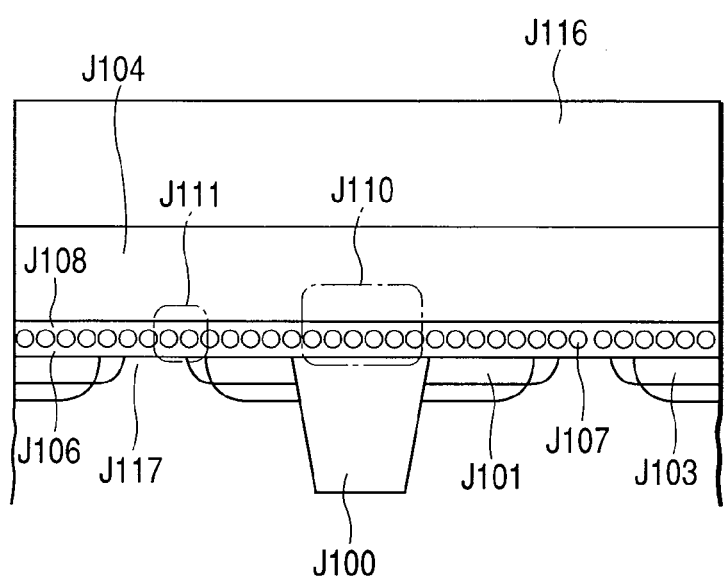
FIG. 11 is a view for showing the cross-section of the semiconductor memory device, shown along with XI-XI line into the direction of arrows in the FIG. 9.

The cross-section view along X-X line is shown in FIG. 10, wherein an area is viewed in the direction of arrows therein, including the region J105 of the minimum memory unit, and the word lines J104 on both sides at the center thereof. Also, the cross-section view along XI-XI line is shown in FIG. 11, wherein an area is viewed in the direction of arrows therein, around the cell separation region J100 defining the range of the minimum memory unit therewith. On the P-type silicon substrate are provided the n-type local source line J101 and the local data line J103, and on an active layer J117 are aligned fine crystalline grains J107 in a large number thereof, which is made of silicon at an averaged diameter of 12 nm and forms the charge storage region, through an insulation layer J106 of 8 nm in thickness thereof. The charge storage region is shown by a reference mark J111, as one representative thereof. The word line J104 of n-type polycrystalline silicon is provided for controlling the potential of the charge storage region, and between the silicon fine crystalline grains J107 and the word line J104 is provided an insulation layer J108 of the so-called ONO structure, including $SiO_2$ layer of 5 nm in thickness, $Si_3N_4$ layer of 8 nm in thickness, and $SiO_2$ layer of 5 nm in thickness, in the order from below. The reference mark J116 indicates the insulation layer. In the same manner in the embodiment 1, it does not matter if the charge storage region J110 is remained on the cell separation region J100. The charge storage region J110 on this cell separation region may be removed through dry etching, or wet etching, or the combination thereof. Also, the local source line J101 and the local data line J103 are separated by the J102 of the p-type diffusion region.

The reference marks attached on the circuit diagram of a unit of the memory cell, in the present embodiment, are same to those of the embodiment 1 shown in the FIG. 4.

Figure 12:
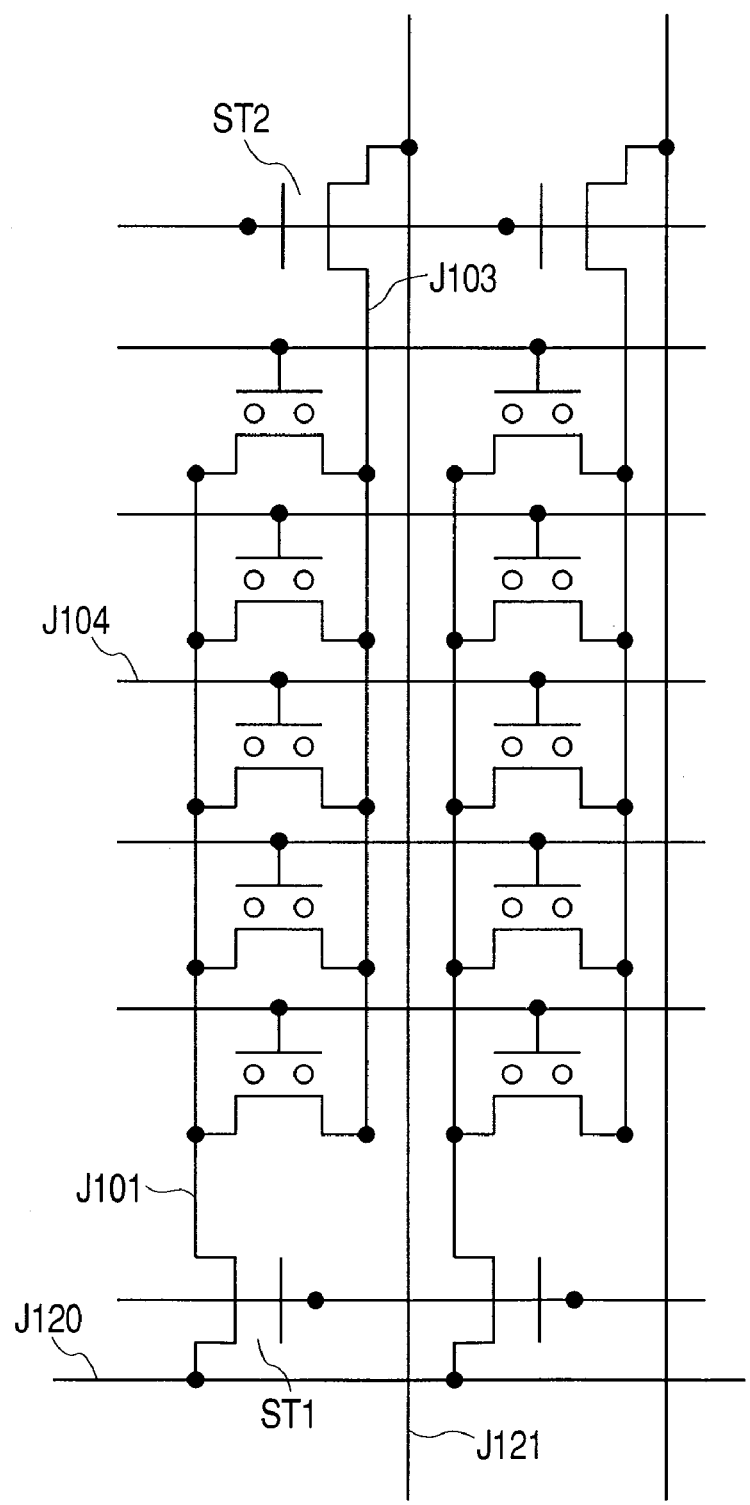
FIG. 12 is a view for showing an equivalent circuit of a memory cell array according to the embodiment 3.

FIG. 12 shows an equivalent circuit diagram of the embodiment 3. Actually, the array is constructed in much larger scale than this, however herein, the small-scaled cell array of 2×5 is shown, for the purpose of explanation. Plural numbers of memory cells are wired with, through the local source line J101, the local data line J102 and the diffusion layer. This local source line J101 is connected with a global source line J120 through a selection transistor ST1, and also the local data line J103 is connected with a global data line J121 through a selection transistor ST2.

In the embodiment 1, though the data line contacts and the source lines of metal are provided for every second memory cells, which are connected in parallel, on the contrary to this, according to the present embodiment, it is characterized in that the large number of the memory cells are made of diffusion layers, and they share the data line contacts and the source lines in common. The number of the data line contacts is dramatically reduced down, and the memory cells can be installed with high density, thereby bringing about a large effect on cost reduction. On the contrary, the parasitic resistance comes to be large when reading out, thereby slowing down the reading speed, however with hierarchical structure of the data lines and the source lines, it is possible to suppress the reduction in the speed at the minimum.

(Embodiment 4)

Figure 13:
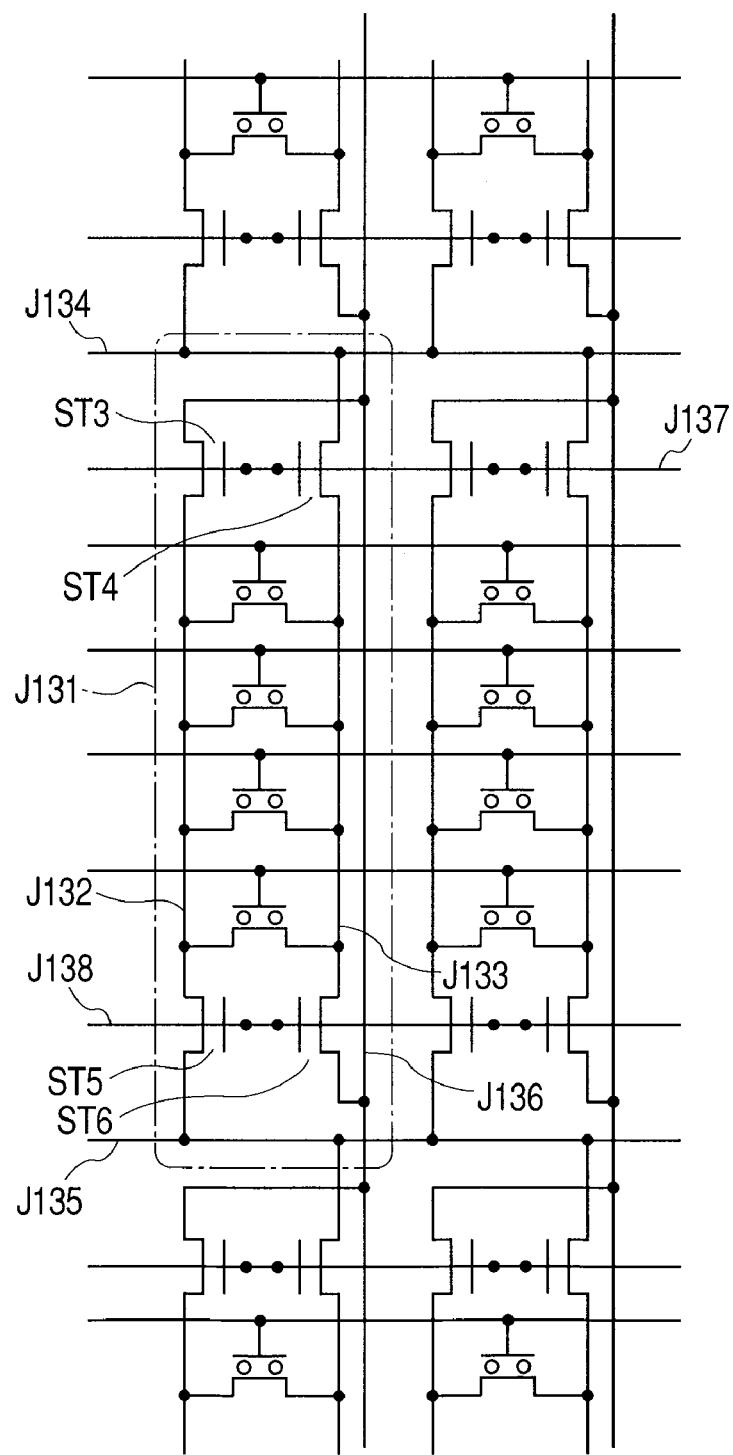
FIG. 13 is a view for showing an equivalent circuit of a memory cell array according to an embodiment 4.

A fourth ($4^{th}$) embodiment will be explained. The embodiment 4 is same to the embodiment 2 in the operation principle, and is same to the embodiment 2 in the fundamental structure thereof. FIG. 13 shows an equivalent circuit diagram. Herein, though being shown only with a small number of the memory cells, however a large number of cells are aligned in the directions of the line and the column of a matrix, actually. A portion J131 enclosed by a chained line is the structure of a unit array in the FIG. 13. Source regions J132 and drain regions J133 of plural numbers of memory cells are connected with each other through diffusion layers, thereby forming the local data lines J132 and J133. The local data lines J132 are selectively connected with either source lines J134 and J135 or global lines J136 through selection transistors ST3-ST6. On signal lines J137 and J138 for use of driving the selection transistors are inputted signals, being reversed with each other, and therefore the local data line J132 can be used as the drain region while using the local data line J133 as the source region, when the selection transistors ST3 and ST4 are turned ON, on the other hand, the local data line J132 can be used as the source region while using the local data line J133 as the drain region, when the selection transistors ST5 and ST6 are turned ON. If turning over the input signals onto the signal lines J137 and J138 for use of driving the selection transistors, respectively, they achieve functions on the contrary thereto.

Comparing with the driving method of the embodiment 2, there are needed the selection transistors, however, since the same voltage can be set on the source lines J134 and J135 and the global data line J136 when conducting the read-out operation at the source end and at the drain end, and since the potential on the source line M52 and M55 can be fixed to be used, there is an advantage that a voltage switching circuit for use of source line driving can be eliminated, and so on. Also, those selection transistors can be provided in common with the plural numbers of cells, which are driven by the same local data lines J132 and J133, in this embodiment 4, and therefore an increase in the area is small.

In the embodiment 1, the direction of current in connecting between the source J7 and the drain J8 and the direction in laying of the word line J2 are in the relationship of being perpendicular to each other, however they are in parallel in the relationship on the array construction of the embodiment 4. Adoption of the manufacturing method of the embodiment 4 makes the manufacturing of the structure easy, as was shown in the FIG. 9, in which the direction in connecting the source region J101 and the drain region J103 is in parallel to that of the word line J104.

(Embodiment 5)

Figure 14:
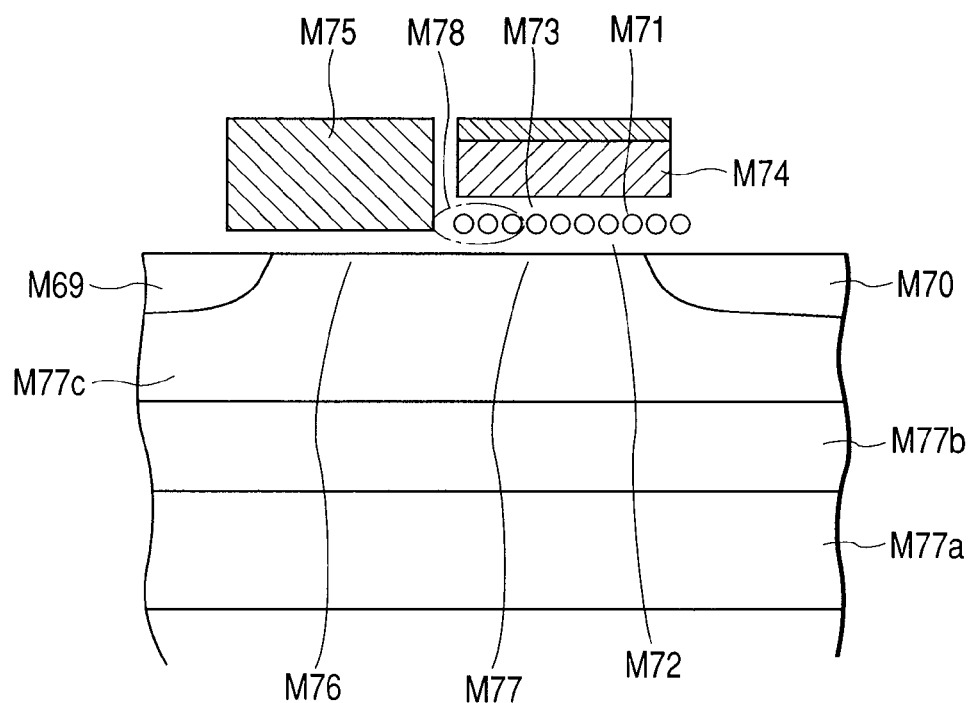
FIG. 14 is a view for showing the cross-sectional structure of semiconductor memory cell of an embodiment 5, shown along with XIV-XIV line in the direction of arrows in FIG. 16 below.
Figure 16:
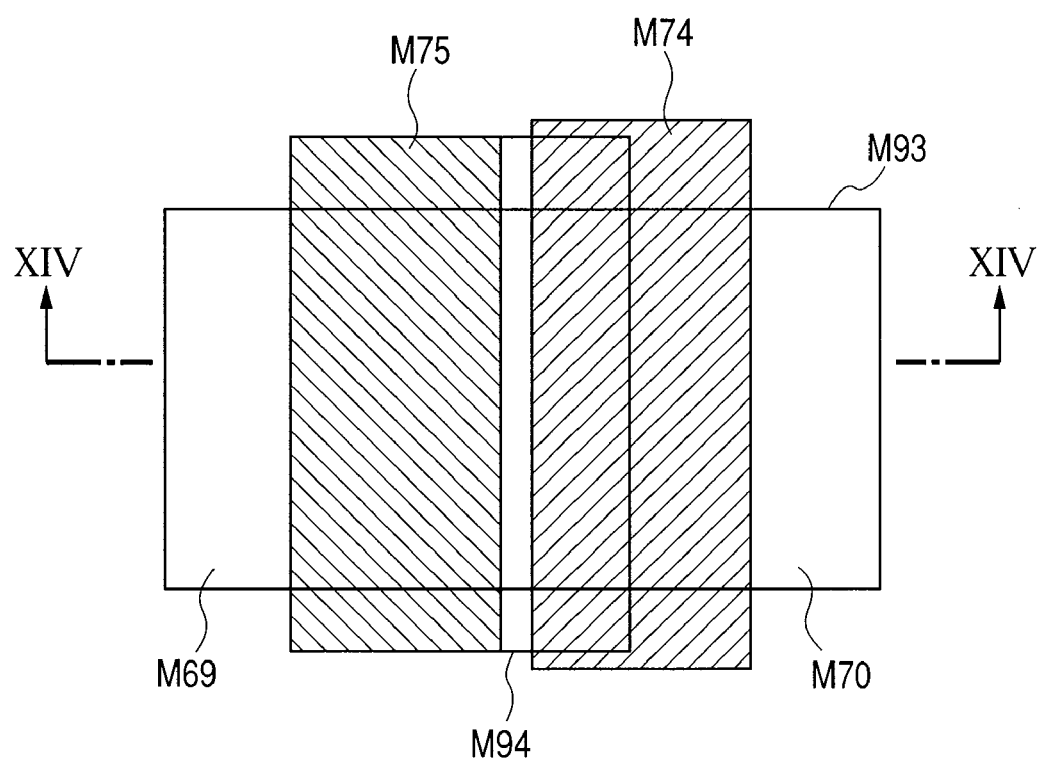
FIG. 16 is a view for showing a layout of a semiconductor memory device according to the embodiment 5.

FIG. 14 shows a cross-sectional structural view of the memory cell according to an embodiment 5, being viewed along XIV-XIV line shown in FIG. 16 in the direction of arrows therein. On a P-type silicon substrate M77a are provided n-type well regions M77b, and further in an inside of this, a p-type well M77c is provided, thereby having a so-called triple well structure. In the p-type well are provided regions of a source M69 and a drain M70 of n-type, and upon portions M76 and M77 of the active region are aligned the fine crystalline grains M71 of silicon, in a large number thereof, at an averaged diameter of 15 nm for forming the charge storage region, through a tunnel oxide film M72 of 8 nm in thickness. For controlling the potentials of a portion M77 of the active region and the charge storage region, a first gate electrode M74 of n-type polycrystalline silicon is proved, and between the silicon fine crystalline grains M71 and the gate electrode M74 is provided an insulation film M73 of the so-called ONO, including $SiO_2$ layer of 4 nm in thickness, $Si_3N_4$ layer of 8 nm in thickness, and $SiO_2$ layer of 4 nm in thickness, in the order from below. Also, there is provided the structure of a second gate electrode M75 for controlling the potential of a portion M76 of the active region. However, in this FIG. 14, the triple well structure is clearly shown therein, but this is omitted in other figures of the other embodiments for avoiding from confusion on the figures.

Figure 15:
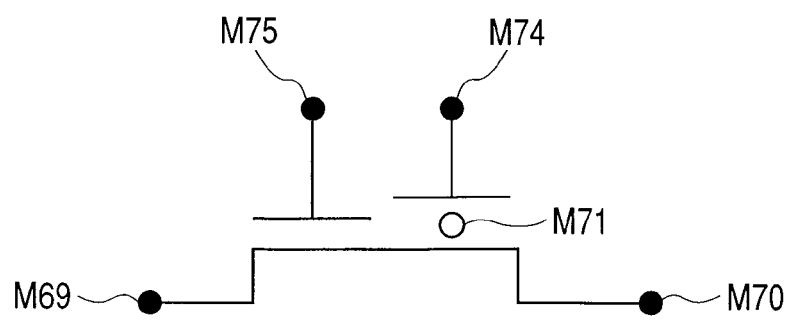
FIG. 15 is a view for showing an equivalent circuit corresponding to the semiconductor memory cell in the embodiment 5.

The circuit diagram is shown in FIG. 15, corresponding to that shown in FIG. 14. Reference numerals or marks are attached on the first gate M74, the second gate M75, the source M69, the drain M70, and the charge storage region M71, corresponding to each of them. In a case of applying a substrate bias into memory cell control, the triple well structure is effective for setting different p-type wells at different potentials. However, if using the n-type substrate, the double well structure is sufficient in the portion of memory cells.

Next, the operation of the embodiment 5 will be explained. In the embodiment 5, with using the second gate electrode M75 as an axially or supplement electrode, the injection of hot electrons is accomplished into the charge storage region M71, with high efficiency.

First, the write-in operation will be explained. Voltage of the drain region M70 is set corresponding to information to be written into. Herein, it is assumed that the condition of much charge injection corresponds to "1" while the condition of less charge injection to "0". In the write-in operation of the information "1", setting is made so that a sufficient electric field can be built up for generating hot electrons (for example, at 5V). The source region M69 is set at 0V. In the write-in operation of the information "0", voltage difference between the source and the drain is set to be small (for example, 0V). The second gate electrode M75 is set at a predetermined voltage (for example, 2V). To the first gate electrode M74 is applied a write-in pulse of voltage (for example, 12V), being higher than that to the second gate electrode M75. In this instance, resistance in the active region M76 below the second gate electrode M75 is larger than that in the active region M77 below the first gate electrode M74. Accordingly, almost the voltage between the source and the drain is applied onto the M76 below the second gate electrode M75. Also, in the active region M76 below the second gate electrode M75, the higher the potential, the nearer to the drain M70, and therefore the effective gate voltage is lowered and it comes to be high in resistance thereof. For this, hot electrons are generated much more at the end near to the drain M70 below the second gate electrode M75. The hot electrons generated are accelerated in the direction of the charge storage region M71 through the electric field built up with the first gate electrode 74, thereby causing the injection. The portions of injection are concentrated in a region M78 near to the second gate electrode M75 below the first gate electrode M74. In this instance, current flowing between the source and the drain is smaller, comparing to that flowing in the structure of having no such the supplemental or auxiliary gate because of the high resistance in the active region M76 below the second gate electrode M75, and therefore it is possible to conduct the injection at high efficiency, thereby settling with less current. Because of the less write-in current per the unit cell, the number of the cells can be set at a larger number thereof, in which the writing can be conducted by one time of the write-in operation, thereby bringing about an improvement on the throughput in writing, as a memory chip. In particular, this is suitable for the memory of a large capacity, for treating with or transmitting information from/to an outside by a relatively large unit of data. In the write-in operation of the information "0", since the voltage between the source and the drain is small, no hot electron is generated, and therefore no injection of charge is conducted.

Next, the read-out operation will be explained. For example, the drain voltage is set at 2V, the source voltage at 0V, the voltage of the second gate electrode at 3.5V, respectively, and a read-out pulse of 2V is applied onto the first gate electrode M74. Since the threshold voltage changes depending upon an amount of the charge injected into the charge storage region M73, the drain current for "0" memory is smaller than that for the "1" memory, therefore it is possible to conduct the read-out operation.

Further, the embodiment 5 is also advantageous in the read-out operation, comparing to the cell structure having no such the second gate electrode, because of the following reasons, which will be mentioned hereinafter. Thus, with the cell structure having no such the second gate electrode, hot electrons are injected in memory regions in the vicinity of the drains, however since the transistors operate in the saturation region under the high threshold value condition, so that the channel is in "pinch-off" in the vicinity of the end of drain, therefore influences of the injected charge is small. As a result of this, shift of the threshold voltage comes to be small in the appearance irrespective of occurrence of sufficient charge injection, thereby lowering the operation margin. As a means for escaping from this, as was known in the hot carrier estimation in the MOS transistors, it is effective to conduct the read-out operation by setting the voltages exchanging between the source and the drain, however this accompanies with penalties of, such as fall-down in the operation speed of the memory, as well as, complexity of the peripheral circuits, etc. According to the present invention, since the charge injection is conducted in a middle of the source and the drain, it is possible to read out influences due to the charge injected therein, with efficiency.

Also, the embodiment 5 enables non-volatile memory, and therefore the memory is maintained after the power source is cut off. In particular, since memory nodes are built up with the large number of independent fine grains of semiconductor, only the charge of the fine grains is lost, which are connected with the leak path in a part thereof, if the insulation film is deteriorated due to the re-write stress, so that the leakage occurs in a low electric field, and therefore stable maintenance can be obtained. On the other hand, with the ordinal flash memory, the electric charge of the memory nodes come out one after another due to the leakage path, and therefore the influence is large. The thickness of the tunnel insulation film of the flash memory is determined by the leakage current after repetition of this re-write. In the embodiment 5, the tunnel insulation film can be thinned for an improvement of increase on reliability, therefore, being superior to the flash memory in scaling down in the vertical direction of the entire cells.

The erase operation of information is conducted by applying a negative voltage onto the first gate electrode M74. For example, both the source M69 and the drain M70 are set at voltage 0V, and the first gate electrode at voltage −18V. In this instance, electrons being injected are discharged into the substrate side with the high electric field. The erase operations are conducted both on the drain terminal and the source terminal at once, collectively. Further, in this instance, it may be possible that the potential of the well M77c is set at a potential higher than 0V (for example, 5V), while the potential of the gate electrode M74 is small (for example, −13V) in the absolute value thereof for it. The absolute value of the voltage used comes to be small, and the voltage generator circuit can be simplified.

Next, the manufacturing method of the embodiment 5 will be explained by referring to FIGS. 14 and 16. After forming the active region M93 and the triple well structure, B (boron) ion is implanted in the region on the P well M77 where the memory cells are formed, for adjustment of the threshold voltage thereof. After oxidizing the substrate surface, so as to form the tunnel oxide film M72 of 10 nm in thickness, the silicon fine crystalline grains M71 are formed through the CVD (Chemical Vapor Deposition). In the trial manufacturing, they are formed at an averaged diameter of 7 nm, and at the density of $5 \times 10^{11}$ pieces per one (1) square centimeter ($cm^2$). After forming the interlayer insulation film M73 of the ONO structure with $SiO_2$ of 4 nm in thickness, $Si_3N_4$ of 8 nm in thickness, and $SiO_2$ of 4 nm in thickness, in the order from the below, n-type polycrystalline silicon is piled up for forming the first gate electrode, and further $Si_3N_4$ layer is piled up thereon. Through a mask of the resist, etching is conducted upon the $Si_3N_4$ film, the polycrystalline silicon film, the ONO film, the silicon fine crystalline grains, and the $SiO_2$ film, one by one. In this process, the first gate electrode M74 is formed. Implantation of impurity is conducted through the mask of the first gate electrode, thereby adjusting the concentration of impurity in the region below the second gate electrode. After rinsing, the substrate surface is oxidized, and further a CVD-$SiO_2$ film is piled up thereupon. Polycrystalline silicon film is piled up for forming the second gate electrode, and flattening is conducted thereon. Herein, the film thickness of the polycrystalline silicon film is made thicker than the height of a step made up in processing of the first gate electrode. The flattening is stopped when a cap of the first gate electrode of $Si_3N_4$ film comes out, thereby exposing only the polycrystalline silicon film for forming the second gate electrode upon the upper surface thereof, while the surface of the fist gate electrode be covered with the $Si_3N_4$ film. Further, processing is conducted on the polycrystalline silicon film with using a mask pattern M94 for machining of the second gate electrode. With using the first and the second gates as the mask, As (arsenic) ion is implanted, and then active annealing is conducted on it, thereby forming the source region M69 and the drain region M70. Furthermore, after forming the film between the layers and flattening thereof, processing is conducted for forming the contacts and for forming the wiring thereon.

(Embodiment 6)

Figure 17:
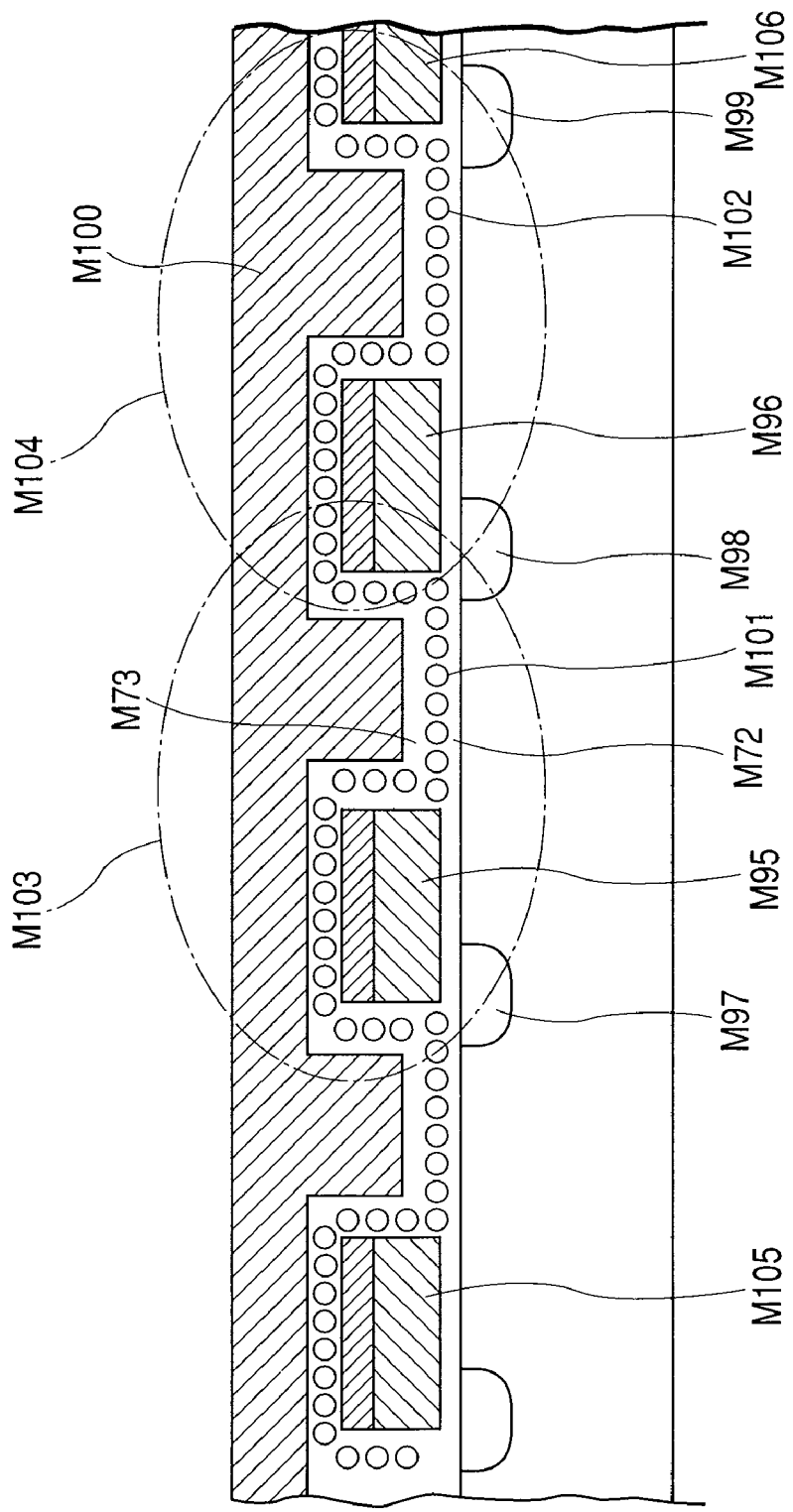
FIG. 17 is a view for showing the cross-sectional structure of memory cell portion of the semiconductor device of an embodiment 6, on surface parallel with a word line.
Figure 18:
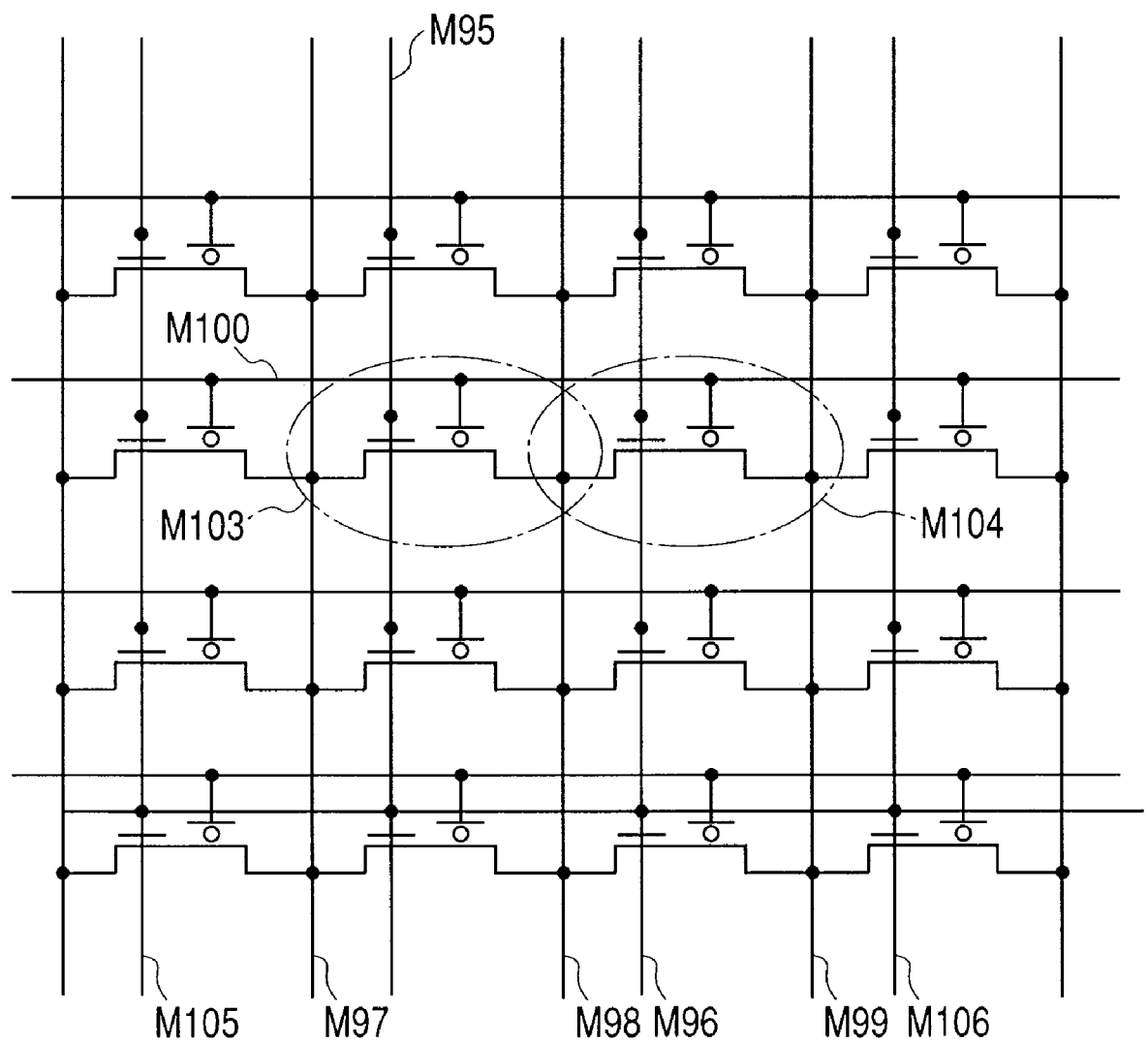
FIG. 18 is a view of showing an equivalent circuit for explaining connecting relationship of the memory cell portion of the semiconductor device according to the embodiment 6.

FIG. 17 shows the cross-section view of the memory device according to an embodiment 6. This is the cross-section view mainly showing the two (2) memory cells M103 and M104, neighboring with each other and being driven by the same word line M100. FIG. 18 shows a circuit diagram for showing a relationship of connection in the memory cell array of the embodiment 6. Actually, the array is constructed within a larger scale much more, however herein is shown a small-scaled cell array of 4×4, for the purpose of explanation. This is same to the embodiment 5 in the fundamental or basic structure thereof, and also same in the operation of the cell unit, however there are differences in the cross-section structure and the manufacturing method corresponding to the relationship of connection between the cells, and there is a feature in the driving method thereof.

A first gate electrode M100 serves also the function of word line in common, and a second gate electrode M95 is disposed in direction perpendicular to the word line M100 as an auxiliary or supplemental control line. A source region M97 and a drain region M98, made of diffusion layer wiring, lay in parallel with the auxiliary control line M95, and they connect the cells in parallel. Drain region M98 of this cell M103 also has the function of the source region M98 of an adjacent cell M104 in common. In ordinary, with such the structure that plural numbers of cells share the source and drain regions, in common, and are connected in parallel, though it is common that the drain region of the cell and the source region of the adjacent cell are insulated from each other through the cell separation region therebetween, however no physical separation is made in the embodiment 6, and they are used as common diffusion layers. For this, the cell separation region can be made small, therefore having an effect of low cost.

In the operation, it is characterized in that the write-in operation and/or the read-out operation are/is conducted into/ from the cells, which are driven by the same word line, every second cell thereof. For example, in the case of conducting the write-in and/or read-out operations into/from the cell M103, bringing the auxiliary control lines M96 and M105 on both sides down to low voltage while the silicon surface below the control line at high resistance prevents the cells driven with the same word line from being short-circuited therebetween. Namely, the cell separation is conducted electrical manner with using the auxiliary control line. When conducting the write-in and/or read-out operations on the cell M104, it is enough to bring the auxiliary control line M95 down to low voltage. In the present embodiment, the cell array of 4×4, however the resistance on the diffused layer wiring is high when constructing the cell array in much larger scale actually, then voltage effect comes up as a problem. Accordingly, providing the contacts at an appropriate distance or backing with metal wiring is effective. Also, it may be possible to adopt the hierarchical structure, wherein a switch is provided between the metal wiring and the contact openings, thereby touse the diffusion layer wiring as the local line while the metal wiring as the global data line. When adopting the hierarchical structure, charging/discharging is not necessary on the local lines in an unnecessary portion when operating, thereby bringing about effect of low electric power consumption and high speed.

Figure 19:
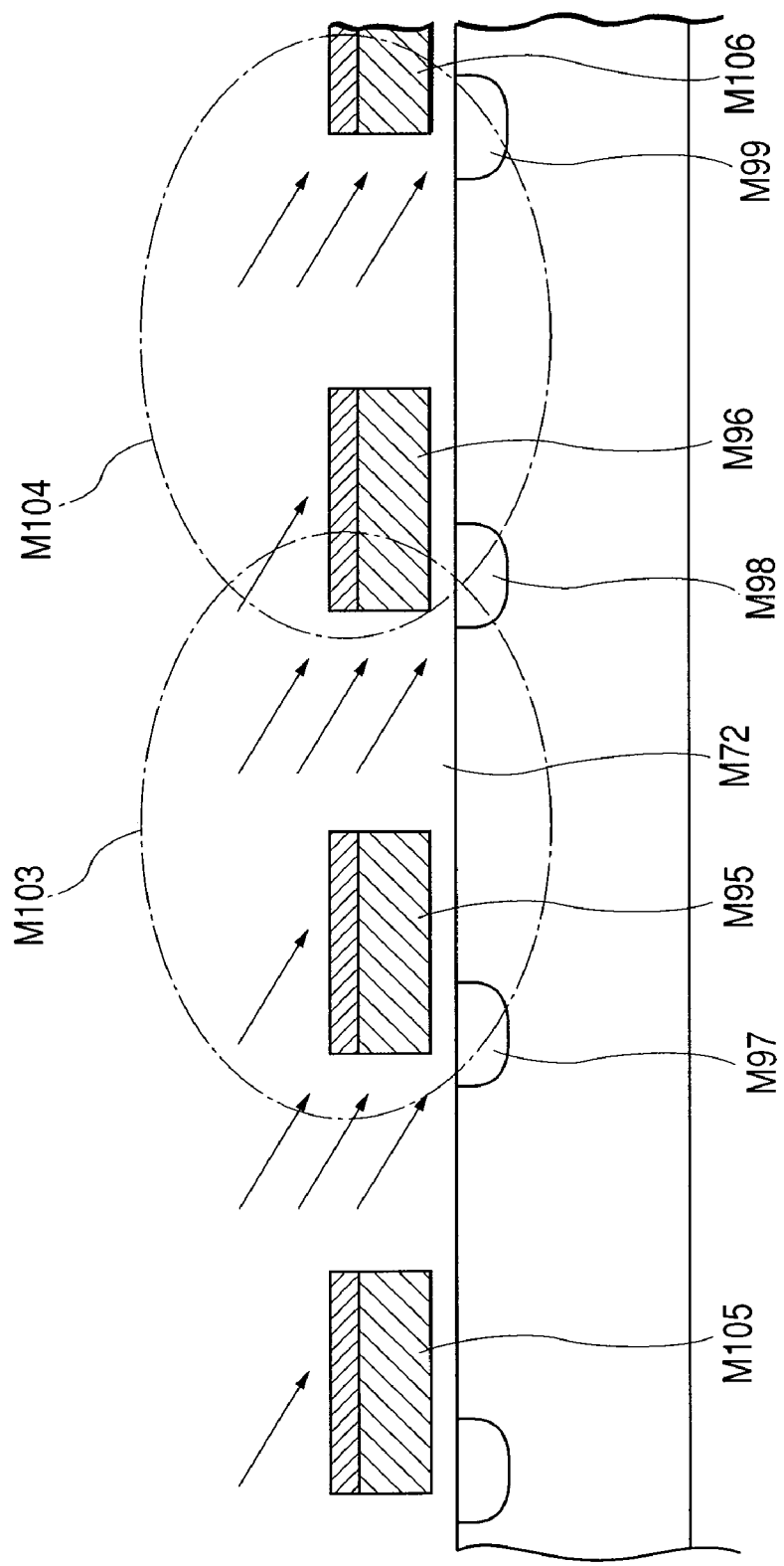
FIG. 19 is a view for showing the cross-sectional structure of memory cell portion of the semiconductor device of the embodiment 6, being cut along a surface parallel with a word line, for explaining the manufacturing method thereof.

The manufacturing method will be described mainly on the difference from that of the embodiment 5, by referring to FIG. 19. After forming the cell separation regions for the peripheral circuits and the well structures, and introduction of impurities for adjustment of the threshold value below the second gate electrode, as well, the substrate surface is oxidized for forming the tunnel oxide film M72 in thickness of 8 nm. And, after piling up the polycrystalline silicon film for forming the second gate electrode and the $SiO_2$ film thereon, processing or machining is conducted, so as to form the second gate electrodes M95 and M96. Further, with using this pattern as the mask, as shown by arrows, As ion is implanted in oblique, thereby forming the diffusion layers M97, M98 and M99, so as to form the source and drain regions. In this instance, also introduction of impurities is made for adjustment of the threshold value under the first gate electrode. After oxidization on the substrate surface, so as to form the tunnel oxide film M72 of thickness 8 nm, the silicon fine crystalline grains M101 and M102 are formed through the CVD (Chemical Vapor Deposition). Further, after forming the interlayer insulation film M 73 of the ONO structure with $SiO_2$ of 4 nm in thickness, $Si_3N_4$ of 8 nm in thickness, and $SiO_2$ of 4 nm in thickness, in the order from the below, n-type polycrystalline silicon is piled up for forming the first gate electrode, and flattening is conducted thereon. Further, W (tungsten) film and $SiO_2$ film are piled up, and then etching is conducted on the $SiO_2$ film, the W film and the n-type polycrystalline silicon with using the resist as the mask, thereby forming a common line M100 of both the first gate electrode and the word line. Further, after forming the interlayer film and then conducting flattening thereon, processing is conducted for forming the contacts and for forming the wiring thereon. With using the present manufacturing method, the silicon fine crystalline grains remains even on the auxiliary gate. This may be considered to cause deterioration on the characteristics due to short-circuiting between the cells in the memory region or capacitive coupling between the auxiliary electrodes, etc., in the case of such the flash memory, in which the memory region is formed with a continuous polycrystalline silicon film, and it is difficult to eliminate this due to the existence of the step which is caused by the auxiliary electrode. In the memory device of the embodiment 6, however it never causes such problem on the electrical characteristics without process of eliminating this, therefore it has a feature that the manufacturing method is simple.

(Embodiment 7)

Figure 20:
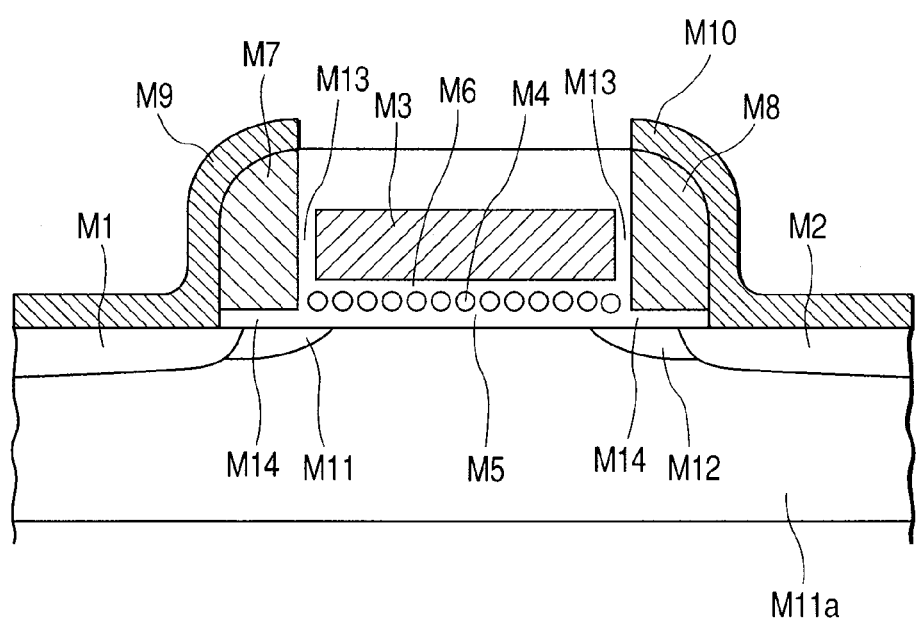
FIG. 20 is a view for showing the cross-sectional structure of the semiconductor device according to an embodiment 7.

FIG. 20 shows the cross-section structure view of the memory cell of a seventh (7th) embodiment.

In the P-type well M11a, there are provided regions of n-type source M1 and drain M2, and further a gate electrode M3 of n-type polycrystalline silicon for controlling channel. Between the gate electrode M3 and the substrate, fine crystalline grains M4 are aligned in large number thereof, being made of silicon and having an averaged diameter of 12 nm. On both sides of the gate electrode M3, there are formed sidewall structures M7 and M8 of P-type polycrystalline silicon, and between the gate electrodes M3 lie insulation films M13. Also, between the sidewall structures M7 and M8 and the substrate, there lay insulation films M14. Also, the substrate surfaces M11 and M12 just below the sidewalls M7 and M8 are P-type or n type of low density, though being n-type of high density in the common LDD structure, on the contrary thereto. Further, the regions of the source M1 and the drain M2, as well as, the sidewall structures, are connected with, through tungsten layers M9 and M10.

Figure 21A:
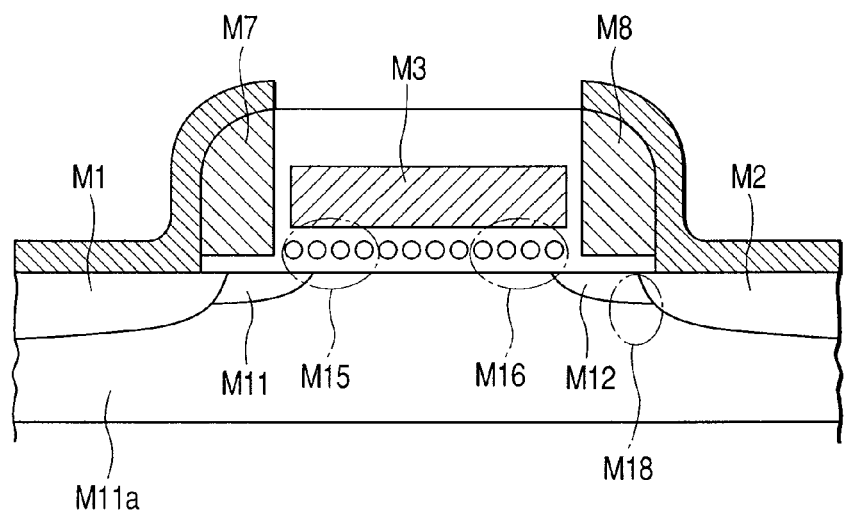
FIGS. 21(a) and 21(b) are views for showing the cross-sectional structure of the semiconductor device according to the embodiment 7, for explaining write-in and/or read-out operation(s) thereof.

Next, the operation of the embodiment 7 will be explained. In the embodiment 7, memory of two (2) bits or more per a memory cell is achieved by changing the place of charge storage. However, in the embodiment 7, since the source and the drain are operated by exchanging between them, electrons flow into, but not necessarily from the source to the drain, however, for escaping from being confused in the naming, those names are used as those of the regions with fixing the places thereof. First, by referring to FIG. 21(a), explanation will be given on charge injection into the memory node M15 near to the source region M1. The source is set to voltage 0V while the drain 4V, and a pulse of 12V is applied onto the gate electrode. In this instance, also the potential of the sidewall M8 at the drain end comes to 4V, the substrate surface M12 below this is reversed into n-type. On a while, the sidewall M7 of the source end is low in voltage (0V), and the substrate surface M11 below this is low in electron density. As a result of this, almost of the part of applied drain voltage is applied onto the M11 below the sidewall at the source end. Since the electric field of this part is strong, hot electrons are generated. The generated hot electrons are attracted or drawn to the electric field due to the voltage applied onto the gate electrode M3, and injected into the memory node M15 near to the source region M1. This injection of hot electrons is more effective than the normal injection of hot electrons, therefore the writing of information can be conducted without flowing large drain current. For this, it is possible to conduct the write-in operation upon a large number of cells at the same time, thereby enabling large capacity memory. Also, in this instance, within the substrate surface M12 below the sidewall M8 at the drain end, the electric field is strengthen also in the region M18 near to the drain, however since there is no such the fine crystalline grain functioning as the charge storage region near around, and also since it is far from the gate M3 in the distance, the drain end write-in operation will not occur. When conducting the write-in operation on the memory node M16 at the drain end, it is enough to exchange the source voltage and the drain voltage, being set in the above.

Also, in the write-in operation, such a method is effective, in which negative substrate bias voltage (for example, −2V) is applied onto the P-type well M11a while the gate voltage is lowered down for it (for example, to 10V). In addition to an advantage that, since the gate voltage used can be lowered in the absolute value thereof, the voltage generator circuit can be simplified, it has a feature that electric field concentration easily occurs below the sidewalls since the threshold voltage rises up. In this instance, with using the layer of n-type at low density below the sidewalls, a read-out current can be obtained, being larger than that in the case of using the p-type.

Figure 21B:
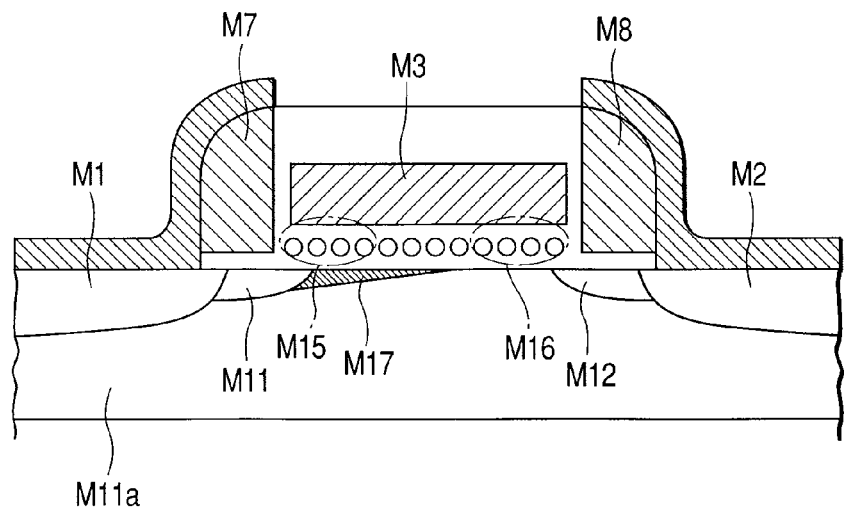

Next, the read-out operation will be explained by referring to FIG. 21(b). For reading out information, the transistor, being constructed with the source, the drain and the gate, is operated in the saturation region thereof. In the read-out operation of charge injected into the source end memory node M15, the drain voltage is set at 2V, the source voltage 0V, and gate voltage 2V, respectively. In this instance, the channel M17 is formed, however since the "pinch-off" occurs in the vicinity of the drain end on the substrate surface below the gate electrode, no channel is formed. As a result of this, it is only the stored charge in the source end memory node M15 that can give an influence upon the threshold voltage, therefore it is possible to eliminate the influence due to the charge stored into the drain end memory node M16. The much in an amount of charge stored in the source end memory node M15, the higher the threshold voltage, while the less, the lower the threshold voltage, therefore the conductance between the source and the drain is changed dependent upon the amount of the charge storage. Upon the basis of this difference in the conductance, the read-out operation of information can be conducted. For reading out the charge storage in the drain end memory node M16, it is enough to change over the set voltages at the source and the drain. Herein, the source region set voltage is set at 0V when reading out information from the source end, however another method is also effective, in which it is set at a predetermined voltage (for example, −1V) being lower than the source region set voltage when reading, so as to reverse the surface below the source end and lower the resistance thereon, thereby increasing the read-out current. In this instance, corresponding to it, also the gate voltage and the drain voltage are lowered down to 1V and 1V, for example. Further, the same may be done, by applying the positive voltage (for example, 1V) onto the P well M11a.

However, in the case of using the negative substrate voltage mentioned above when writing, an operation method is effective, in which a relatively high substrate bias (for example, 0V) is used when reading out. When writing, the portion below the sidewall comes into high resistance condition due to the substrate bias, where hot electrons can be easily generated, while at the same time, when reading out, it in low resistance, therefore it is possible to obtain sufficient read-out voltage with certainty. As a result of this, both the write-in and the read-out operations can be achieved at high speed.

In the write-in operation and the read-out operation, it is enough to exchange the set voltages between the source and the drain, simply. Accordingly, comparing to the method, in which the four (4) levels are built up with the charge amount injected into is the single floating gate, the number of the steps necessary for the write-in operation and the read-out operation is less, and then high speed operation can be obtained. Also, with the two (2) level operation between the information "0" and "1" at each of both ends, the operational margin can be increased. In the write-in operation, when applying such the multi-levels, it is necessary to suppress the expansion of distribution of the threshold voltage between cells, highly. For this reason, the read-out operation must be conducted after applying the write-in pulse, thereby to conduct so-called the verify operation, repeating, the operation, in which the write-in pulse is applied again when voltage does not reach to a predetermined threshold voltage, and this comes to be a factor of lowering the throughput in the write-in operation. Accordingly, the effect of high speed according to the embodiment 7 is remarkable, in particular in the write-in operation. In addition thereto, in the embodiment 7, because of the large number of the fine crystalline grains of silicon, which build up the charge storage region, averaging is made upon the write-in operations. As a result of this, the fluctuation between the cells can be reduced, and then the operation of memorizing two (2) bits per a unit of memory cell can be obtained without such the verify operation. The averaging on the write-in operations is also effective to a defect, in which the write-in perorations advance with extraordinary high speed by the cells, due to the defects, such as, of the tunnel insulation film, etc.

The erase operation of information is conducted by applying negative voltage onto the first gate electrode M3. For example, both the source M1 and the drain M2 are set at voltage 0V, and the gate M3 at voltage −12V. In this instance, electrons being injected are discharged into the substrate side with the electric field. The erase operations are conducted both on the drain end and the source end at once, collectively. Further, in this instance, it may be possible that the well potential is set to be higher than 0V (for example, 5V), while the potential of the gate electrode M3 is smaller (for example, −7V) in the absolute value thereof for it. The absolute value of the voltage used comes to be small, and then the voltage generator circuit can be simplified.

Figure 22A:
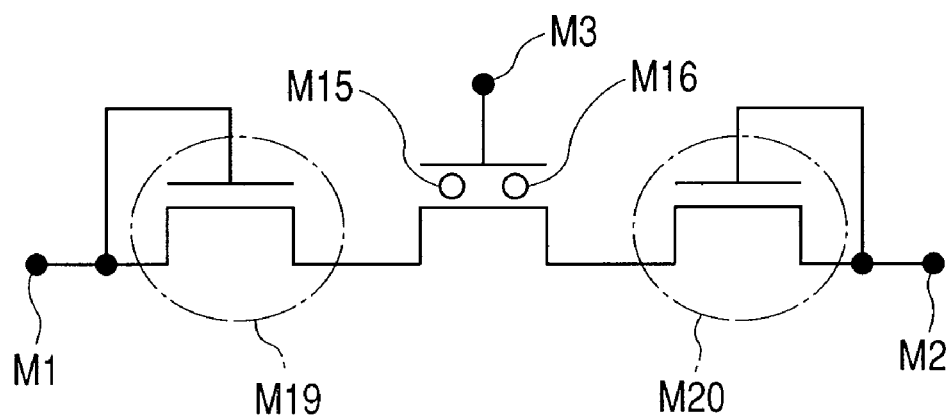
FIGS. 22(a) and 22(b) are views for showing an equivalent circuit and a brief drawing thereof, clearly indicating the transistor structure with sidewalls in the semiconductor memory cell of the embodiment 7.
Figure 22B:
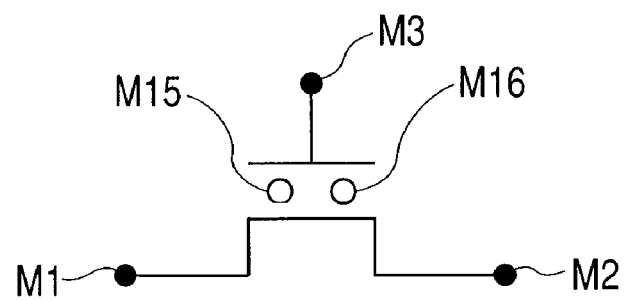

FIGS. 22(*a*) and 22(*b*) show an equivalent circuit of the embodiment 7. Using the symbols indicative thereof depicts the source end memory node M15 and the drain end memory node M16. In the FIG. 22(*a*), there are depicted a field effect transistor M19 formed with the source end sidewall M7 as the gate electrode and the substrate surface M11 below it as the channel, and a field effect transistor M20 formed with the drain end sidewall M8 as the gate electrode and the substrate surface M12 below it as the channel. However, indication of the substrate bias terminal corresponding to the P well 11*a* is omitted herein. For escaping from confusing in the figure, the simplified indication shown in the FIG. 22(*b*) will be used for the equivalent circuits of the memory device according to embodiments, which will be shown hereinafter.

Next, the manufacturing method of the embodiment 7 will be explained. After forming the cell separation region and the triple well structure, B (boron) ion is implanted in the region on the P well where the memory cells are formed, for adjustment of the threshold voltage thereof. After oxidizing the substrate surface, so as to form the tunnel oxide film M5 of 10 nm in thickness, the silicon fine crystalline grains M4 are formed through the CVD (Chemical Vapor Deposition). In the trial manufacturing, they are formed of an averaged diameter of 12 nm, and at the density of $4 \times 10^{11}$ pieces per one (1) square centimeter ($cm^2$). After forming the interlayer insulation film M6 of 12 nm in thickness, n-type polycrystalline silicon is piled up for forming the gate electrode, and further $SiO_2$ layer is piled up. Through a mask of the resist, etching is conducted on the $SiO_2$ film and the polycrystalline silicon film, thereby forming the gate electrode. Further, with using the same mask, the etching is conducted on the $SiO_2$, so as to also remove the formed crystalline grains therefrom.

After removing the resist, a victim oxide film is formed and the implantation of impurity is conducted, thereby adjusting the impurity concentration below the sidewalls. Thereafter, through oxidization, the substrate surface and side surfaces of the gate electrodes are oxidized. Those come to be the sidewalls M7 and M8 and the insulation film M13 between the gate electrodes M3. In this instance, the oxidizing is high in speed on the gate side surfaces than on the substrate surface, with acceleration in oxidization due to the impurities, and the insulation film is thick in the thickness thereof. Next, n-type polycrystalline silicon is piled up, and conducting the etchback for this film thickness forms the sidewalls M7 and M8. After this, portions where short-circuiting is not desirous on the sidewall polycrystalline silicon are removed with using a resist as the mask. As a method for removing, equi-directional dry etching or wet etching may be applicable, or a combination thereof. Conducting the implantation of As (arsenic) ion on the gate M3, the sidewalls M7 and M8 through the mask forms the source region, and the drain regions M1 and M2. Further, by means of the wet etching, the substrate surface is exposed upon, and tungsten (W) is selectively piled up only on silicon.

Between the source region M1 and the source side sidewall M7 or between the drain region M1 and the drain side sidewall M8, the distance is small, and then they are connected with each other through the pile-up of tungsten. Contacts are formed on the sidewalls M7 and M8, and since this can be achieved with a remarkably small cell area comparing to the cell structure of connecting the diffusion layers M1 and M2 through wiring, the processes can be simplified. Thereafter, wiring is conducted after the processing of build-up of interlayer insulation film, flattening, and contacting.

In the embodiment 7, the gate electrode M3 is made of polycrystalline silicon, however it may be silicided or made of multi-layer structure with metal, thereby obtaining the lowered resistance thereof. In this case, it is preferable that the insulation films between the gate M3 and the sidewalls M7 and M8 may be formed, not through oxidization, but through the pile-up or deposition. Also, the memory node is formed from the fine crystal of silicon, however it may be formed from other semiconductors or metals. In this case, it is important that each of the nodes is independent. In the forming method thereof, it is formed on the tunnel insulation film through the CVD in the embodiment 7, but other method of the pile-up or deposition may be also applicable therein. Further, the following may be also applicable: wherein implantation of ion, such as of Si or Ge, etc., is conducted after forming the insulation film being thicker than that of the tunnel insulation film, and then it is heated, so as to depose fine crystals in large number thereof within the insulation film, thereby forming the memory nodes.

(Embodiment 8)

Figure 23:
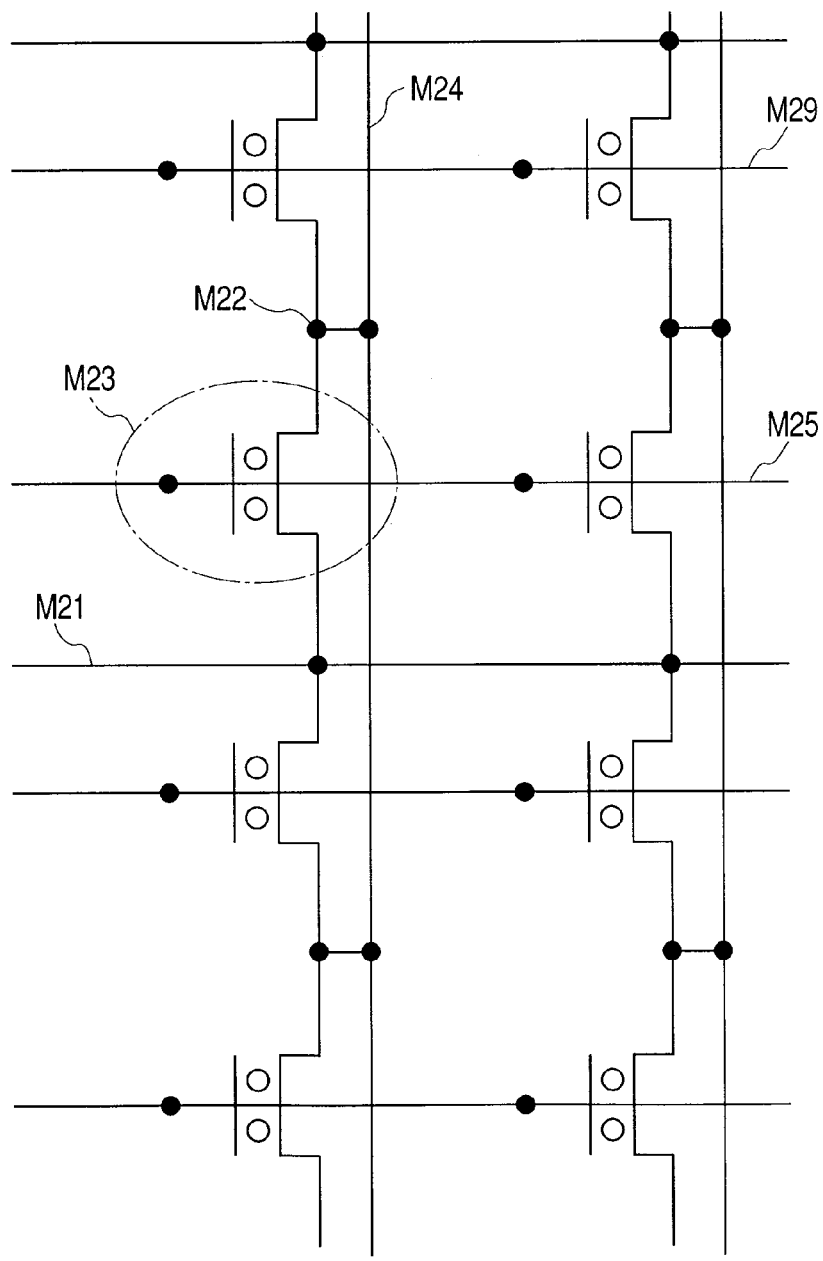
FIG. 23 is a view of showing an equivalent circuit for explaining connecting relationship in a memory cell array using the semiconductor device according to the embodiment 7 therein.
Figure 24:
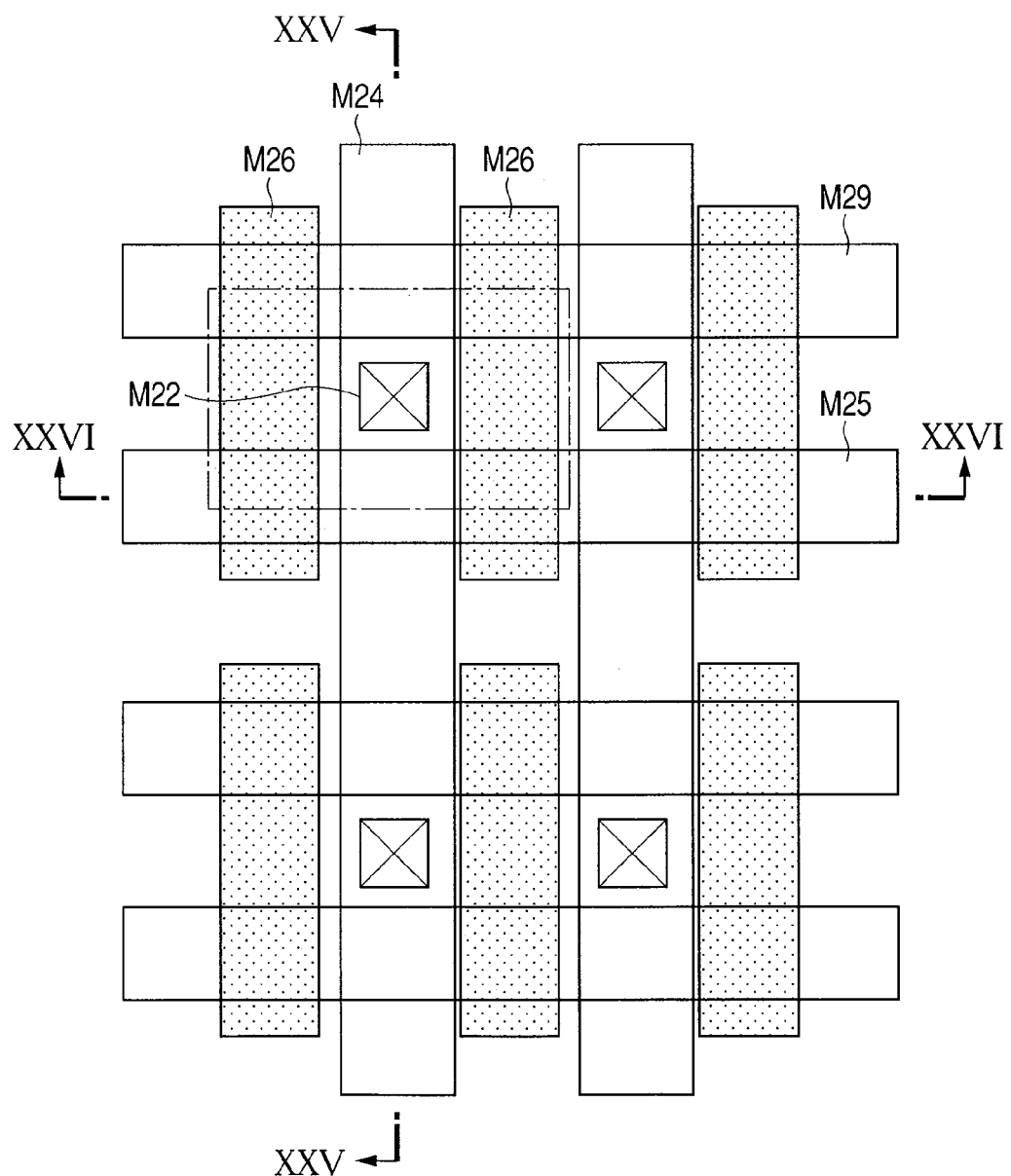
FIG. 24 is a view for showing a layout of a portion corresponding to the above FIG. 23 in the embodiment 7.
Figure 25:
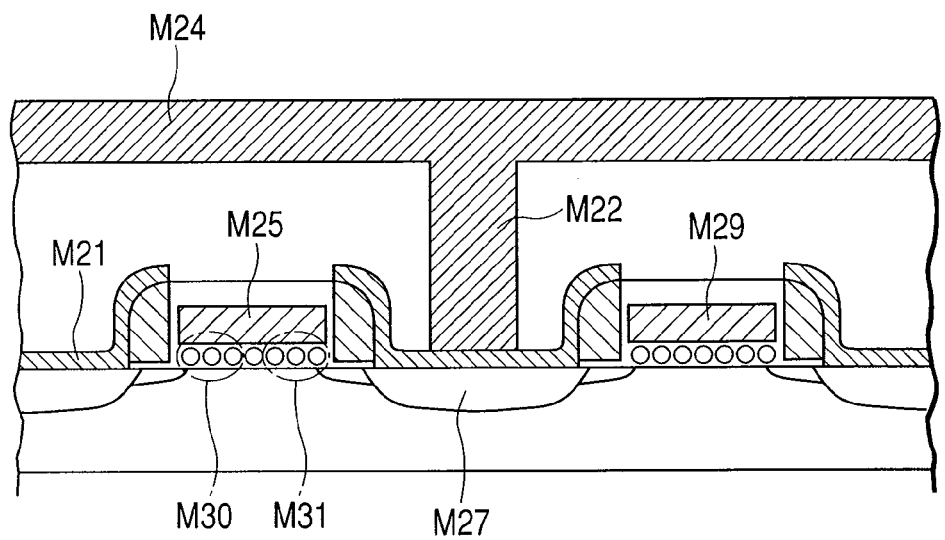
FIG. 25 is a view for showing the cross-section of two (2) cells neighboring with each other, being cut in perpendicular to a word line and parallel to a data line on the memory cells, in the semiconductor device according to an embodiment 8.
Figure 26:
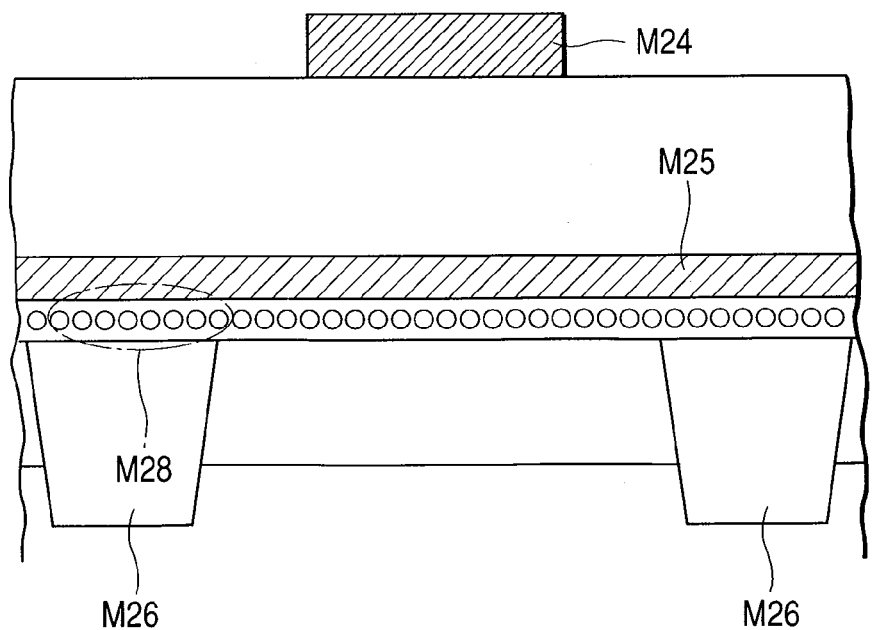
FIG. 26 is a view for showing the cross-section of a cell, being cut in perpendicular to the data line and parallel to the word line on the memory cells, in the semiconductor device according to the embodiment 8.
Figure 27:
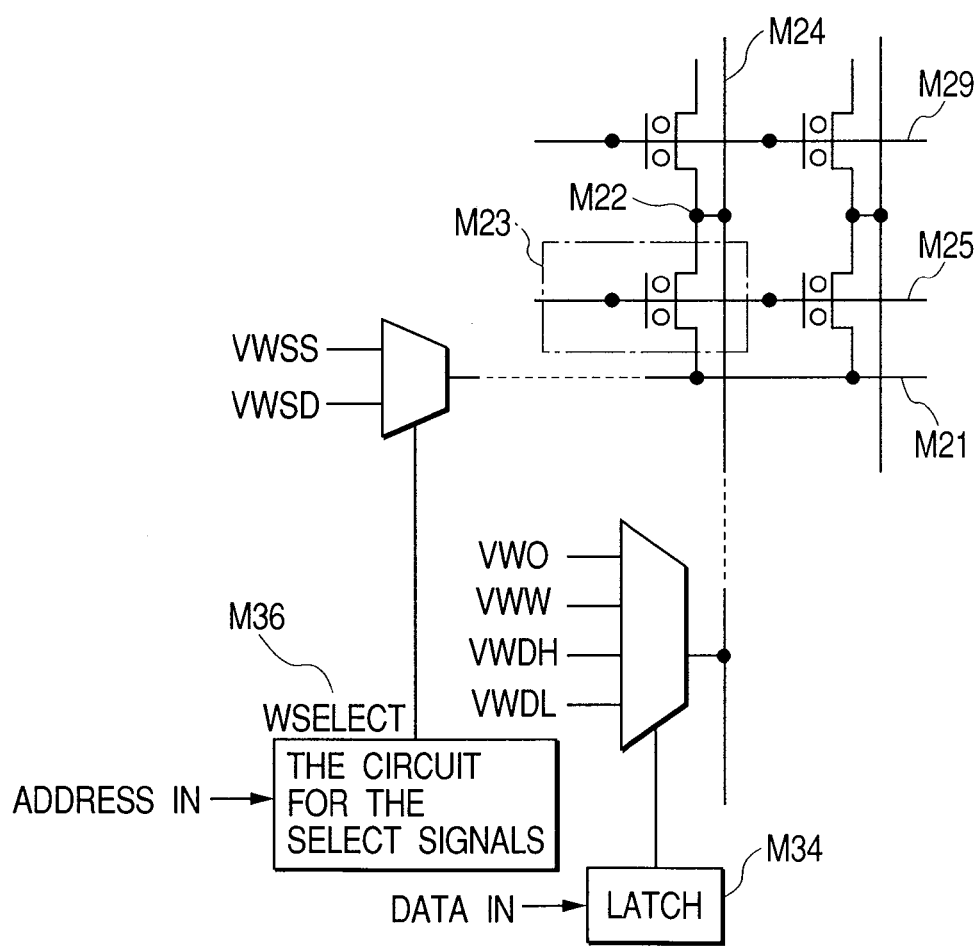
FIG. 27 is a view for showing the circuit structure of the semiconductor device according to the embodiment 8, for explaining write-in operation therein.

FIGS. 23 through 28 show an eighth (8$^{th}$) embodiment of the present invention. This is a memory cell array upon the basis of structure of the memory cell explained in the embodiment 7, wherein FIG. 23 shows the equivalent circuit diagram thereof, FIG. 24 a layout view corresponding to the FIG. 23, FIG. 25 the cross-sectional structure view along XXV-XXV line in the FIG. 24, within the region of adjacent word lines M25 and M29 and contact M22, being viewed in the direction of arrows therein, and FIG. 26 the cross-sectional structure view along XXVI-XXVI line in the FIG. 24, within the region of cell separation regions M26 adjacent with on both sides, being viewed in the direction of arrows therein. The portion M23 circled by the chained line in the FIG. 23 corresponds to a unit cell. In the FIG. 23, cells of 4 lines×2 columns in the matrix, i.e., totally 8 cells achieve memory of 16 bits. Actually, the numbers of lines and columns of the matrix are large much more, thereby constructing a large-scaled cell array, however the explanation will be given on that scale for the explanation purposes. Further, in those figures, the same elements or those having the same functions thereof are attached with the same reference numerals or marks thereof.

Gate electrodes are connected with each other though ward line M25. In this embodiment, the word line M25 achieves the function as the gate electrode in the structure. Drain region M27 is shared with an adjacent cell, in common, and is connected to a data line M24 through a contact opening M22 provided corresponding thereto. A cell separation region M26 separates the neighboring cells sharing the word line in common. In source region is formed a source line M21 of the diffusion layer wiring, and it lies in parallel to the word line. In the embodiment 8, since surface of the diffusion layer is covered with silicide or metal, it has low resistance, and therefore it is still fully practical with such the diffusion layer wiring. Of course, with providing the contact openings in places, backing may be made by means of metal wiring, thereby obtaining low resistance. Also, the manufacturing process is same to that of the embodiment 5, and in this case, the fine crystal region M28 as the memory nodes remains on the cell separation region. In the case of the continuous film floating gate of such as the flash memory, it comes to be short-circuiting of the floating gates between the adjacent cells, thereby failing operation thereof, however in the embodiment 8, since leakage between the memory nodes is sufficiently small, therefore it can operate. For this, it is possible to omit the processing of cutting off on the adjacent floating gates, being necessary for the flash memory, and thereby the processing can be simplified.

Next, explanation will be given on the driving method of the embodiment 8. First, the write-in operation will be explained by referring to FIG. 27. According to addresses inputted from an outside, a signal WSERECT M36 is generated, indicating either write-in operation should be conducted on a source end M30 or a drain end M31. Depending upon the signal WSERECT M36 generated, voltage on the source line M21 is changed over. Input data is, first of all, stored into a latch M34. Herein, it is assumed that input voltage "high" corresponds to information "1", while "low" to information "0". In the write-in operation on the source end M30 of the cell M23, the VRSS (for example, 0V) is applied onto the source line M21, and the voltage on the data line M24 is set to VWDL (for example, 0V) if information to be written is "0", while it is set to higher voltage, VWDH (for example, 5V), if being "1", and a pulse of high voltage VWW (for example, 12V) is given onto the word line M25. In the case when it is set to the VWDL, since hot electrons are scarcely generated, the charge injection into the memory node is less, but in the case when being set to VWDH, an amount of the charge injection is much. In this instance, also with other cells which are driven by the same word line, information can be written into them at the same time, by setting data line voltage connected with to the VWDL or VWDH depending upon the data to be written into. Herein, no charge is injected when writing "0", accordingly, it is equal to the case where no write-in operation is made, therefore it is also possible to conduct the write-in operation of information only in a portion of the cells, which are driven by the same word line. Also on other word lines, no write-in operation is conducted if it is set at voltage (for example, 0V) being lower than the high voltage VWW. Next, explanation will be given on the write-in operation on the drain terminal M31. Voltage on the source line M21 is set to the VWDH (5V), and voltage on the data line M24 is set to the VWDL (for example, 0V) if the information is "0" while to the VWDH (for example, 5V) if being "1", in the same manner of the write-in operation on the source end M30. After this, a pulse of VWW (12V) is applied onto the word line M25, thereby enabling the write-in operation thereof. Herein, the VWDH on the data line is the condition for the charge injection in the write-in operation on the source end M30, on the contrary to this, since the VWDL on the data line is the condition in the write-in operation on the drain end M31, there is a feature that a corresponding relationship is reversed in the heights between the memorized information and the threshold voltage, on the source terminal and the drain terminal.

Figure 28:
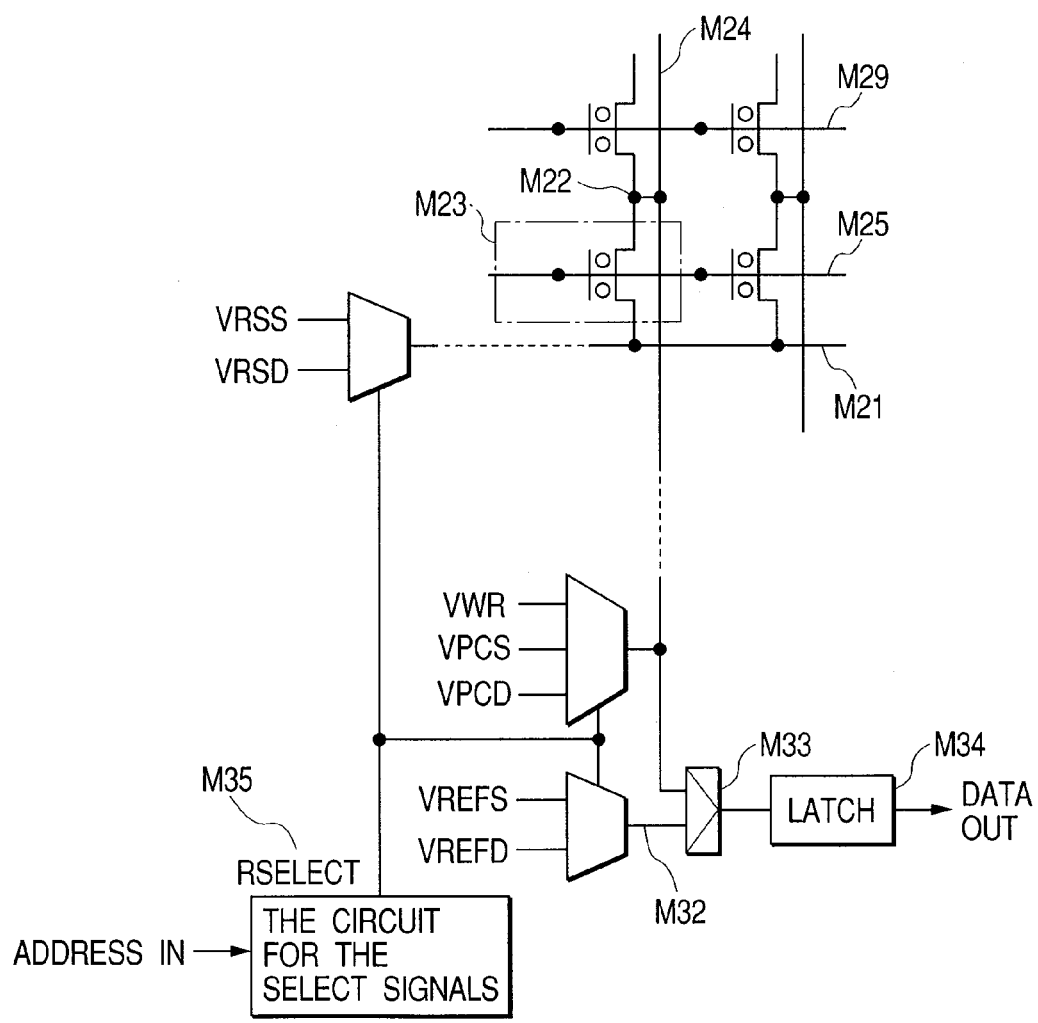
FIG. 28 is a view for showing the circuit structure of the semiconductor device according to the embodiment 8, for explaining read-out operation therein.

Next, explanation will be given on the read-out operation of information, by referring to FIG. 28. First, according to the address (es) of the memory cell to be read out, being applied from an outside, the signal RSERECT M35 is generated, which indicates whether the read-out operation on the source end M30 should be conducted or the read-out operation on the drain end M31. A circuit for generating the selection signal RSERECT from this address may be shared in common with the selection signal generator circuit, which generates signals when writing. Depending upon the RSERECT M35 generated, as will be explained below, voltage on the source line M21, pre-charge voltage and a reference voltage are exchanged. For reading out the information in the source terminal M30, voltage on the source line M21 is set to VRSS (for example, 0V), so as to pre-charge it on the data line M24 up to voltage VPCS (for example, 3V) being higher than the VRSS, and thereafter a read-out pulse of voltage VWR (for example, 2V) is applied onto the word line. In this instance, current flows not so much when the threshold voltage at the source end M30 is high, therefore the potential on the data line M24 does not fluctuate so much from the VPCS, on the contrary to this, a large amount of current flows through when the threshold voltage on the source end M30 is low, the potential on the data line M24 falls down largely from the VPCS. One terminal of a sense amplifier M33 of a differential amplification type is connected to the data line, while on the other terminal M32 is provided small voltage VREFS (for example, 2.4V) being smaller than the VPCS as a reference potential. With actuating the sense amplifier M33 at a predetermined timing, it is amplified up to a high potential when the threshold voltage of the source end M30 is high, while it is amplified to a low potential when being low. The timing of actuating the sense amplifier is preferably so determined, that the voltage on the data line lies high in condition thereof, and then the memory cells can operate within the saturation region thereof even when the threshold voltage is low. Thus, it is preferable that the sense amplifier is actuated under the condition that the voltage on the data line is higher than VWR-Vth, with assuming that the threshold voltage is Vth when the threshold voltage of the source end is low. This is because, it is hardly influenced from the memorized information in the drain end M31, thereby enabling the operation with stability.

Voltage settings are different in the read-out operation of information on the drain end M31. Voltage on the source line M21 is set at voltage VRSD (for example, 3V) being higher than the VRSS, so as to pre-charge it on the data line M24 to voltage VPCD (for example, 0V) lower than the VRSD, and thereafter a read-out pulse of the voltage VWR (2V) is applied onto the word line. In this instance, since current does not flow so much when the threshold voltage on the drain end M31 is high, therefore the potential on the data line M24 does not fluctuate so much from the VPCD (0V), on the contrary to this, a large amount of current flows through when the threshold voltage on the drain end M30 is low, the potential on the data line M24 raises up largely from the VPCD (0V). The reference potential given to the sense amplifier is voltage VREFD (for example, 0.6V), being larger than the VPCS (0V). With actuating the sense amplifier M33 at a predetermined timing, it is amplified to a low potential when the threshold voltage on the drain end is high, while it is amplified up to a high potential when being low. Accordingly, herein again, the relationship in the height between the result of amplification and the threshold voltage at each end is reversed, between the source end and the drain terminal, and it comes to be a correct operation, being combined with the write-in method explained in the above. The write-in operation and the read-out operation mentioned above are summarized in a Table 4, below.

TABLE 4

|  | Input Information From Outside | Data Line Setting When Writing | Threshold Value Of Cell | Data Line Voltage After Readout Amplification | Output Information To Outside |
|---|---|---|---|---|---|
| Source End Memory | "0"(L) | VWDL(L) | (L) (Source End) | (L) | "0"(L) |
|  | "1"(H) | VWDH(H) | (H) (Source End) | (H) | "1"(H) |
| Drain End Memory | "0"(L) | VWDL(L) | (H) (Drain End) | (L) | "0"(L) |
|  | "1"(H) | VWDH(H) | (L) (Drain End) | (H) | "1"(H) |

The erase operation of information is conducted at once on the cells, which are driven by the same word line, collectively, and the information is erased at the source end and the drain end at the same time.

(Embodiment 9)

Figure 29:
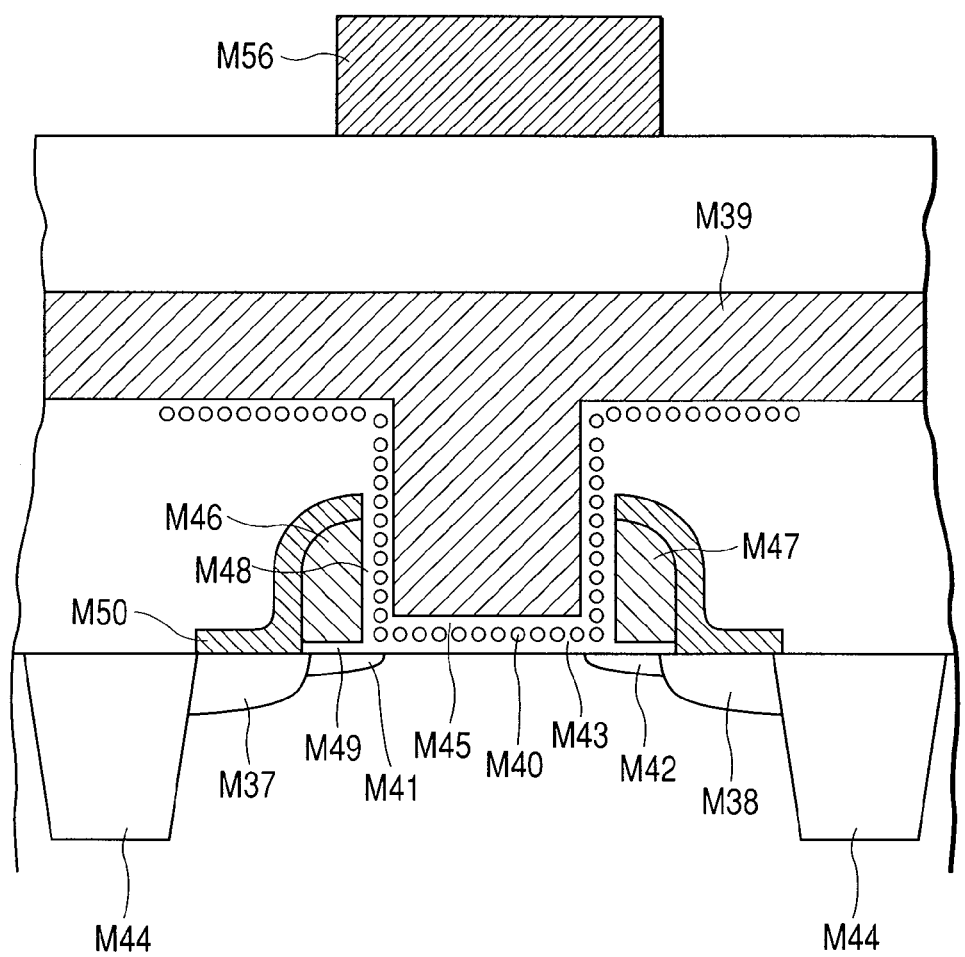
FIG. 29 is a view for showing the cross-sectional structure of semiconductor memory cell of an embodiment 9, shown along with XXIX-XXIX line into the direction of arrows in FIG. 34 below.

FIGS. 29 through 36 show an ninth ($9^{th}$) embodiment of the present invention. FIG. 29 shows the cross-section view of the construction of the memory cell according to the present embodiment.

The present embodiment is same to the embodiment 7 in the basic structure and the operation principle thereof, as well, however is different in the manufacturing method or processes thereof. Also, due to the difference in the manufacturing processes, it differs from in the structure of the cell array, that it can be built up easily. First, explanation will be given on the basic structure. In the figure, the p wells are omitted. On the P-type silicon substrate, on which the cell separation region M44 is provided, there are also provided a source M37 of n-type and a drain M38, as well as, a gate electrode M39 made of tungsten, for controlling the channel and also serving the function of the word line, as well. Between the gate electrode M39 and the substrate, there are aligned fine crystal grains of silicon, having an averaged diameter of 8 nm, in large number thereof. On side surfaces of the gate electrodes are provided sidewall structures M46 and M47 of P-type polycrystalline silicon, and between the gate electrodes M39 lie insulation films M48. Also, between the sidewall structures M46 and M47 and the substrate, there lay insulation films M49. Also, the substrate surfaces M41 and M42 just below the sidewall structures are, not being made of the common. LDD structure, but of a polarity, being different from those of the regions of the source M37 and the drain M38, for example, of P-type in this case. Further, the regions of the source M37 and the drain M38, as well as, the sidewall structures, are connected with one another, through tungsten layer M50.

Figure 30:
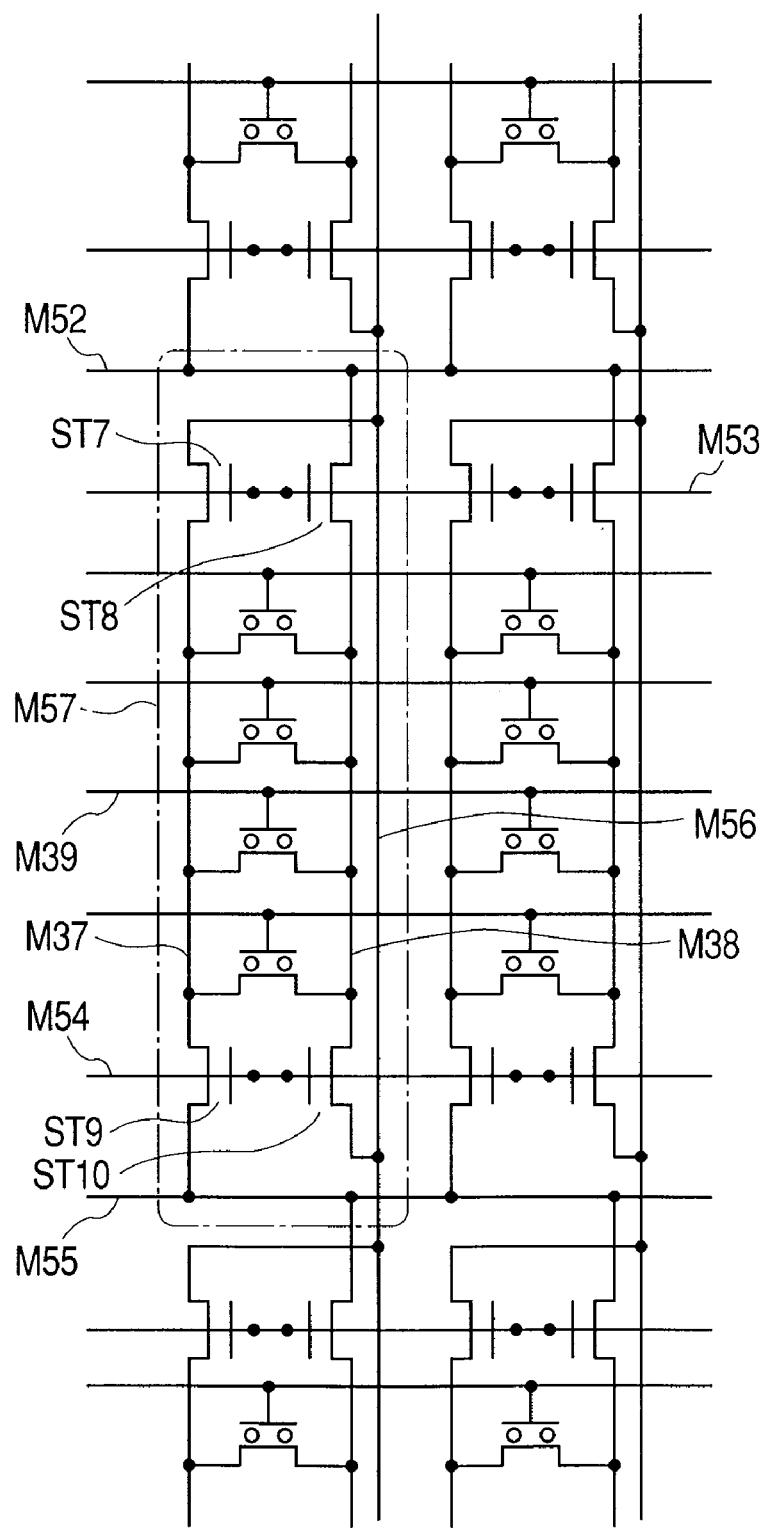
FIG. 30 is a view of showing an equivalent circuit for explaining connecting relationship in a memory cell array using the semiconductor device according to the embodiment 9 therein.

FIG. 30 shows the equivalent circuit diagram of the memory cell array portion of the memory device, which is constructed with using the memory cells of the embodiment 9.

A layout views adapted to the manufacturing processes are shown in FIGS. 31 to 34. The FIG. 29 corresponds to the cross-section of one (1) memory cell, which is indicated by circling it with a chained line in the FIG. 34 for showing a final layout thereof, shown along XXIX-XXIX line in the direction of arrows in the figure. For explanation purpose, the memory cells are indicated in small number thereof, but they are aligned in much larger number thereof in both the line direction and column direction thereof. A portion M57 enclosed by the chained line is the structure of a unit array in the FIG. 30. Source regions M37 and drain regions M38 of plural numbers of memory cells are connected with each other through diffusion layers, thereby forming the local data lines M37 and M38. The local data line M37 is connected with either a global data line M56 or a source line M55 through selection transistors ST7 and ST9, while the local data line M38 is connected with either the source lines M52 or the global data line M56 through selection transistors ST8 and ST10. With inputting signals onto a signal line M53 for driving the selection transistors ST7 and ST9 and a signal line M54 for driving the selection transistors ST8 and ST10, which are reversed to each other, it is possible to use either one of the local data lines as the source region while the other using as the drain region. If changing over the input signals onto the signal lines M53 and M54 for use of driving the selection transistors, respectively, they achieve functions on the contrary thereto. Comparing with the driving method of the embodiment 8, there are needed the selection transistors, however, since the same voltage can be set on the source lines M52 and M55 and the global data line M56 when conducting the read-out operation on the source end and of the drain end, and since the potential on the source line M52 and M53 can be fixed at to be used, there is an advantage that a voltage switching circuit for use of source line driving can be eliminated, and so on. Also, those selection transistors, being necessary in excess, can be provided in common with the plural numbers of cells, which are driven by the same local data lines M37 and M38, in this embodiment 9, therefore an increase in the area is small.

In the embodiment 8, the direction of current in connecting between the source M30 and the drain M31 and the direction in running of the word line M25 are in the relationship of being perpendicular to each other, however they are in parallel in the relationship on the array structure of the embodiment 9. Adoption of the manufacturing method of the embodiment 9 makes the manufacturing of the structure easy, as is shown in the FIG. 29, in which the direction in connecting the source region M37 and the drain region M38 is in parallel to that of the word line M39.

Figure 31:
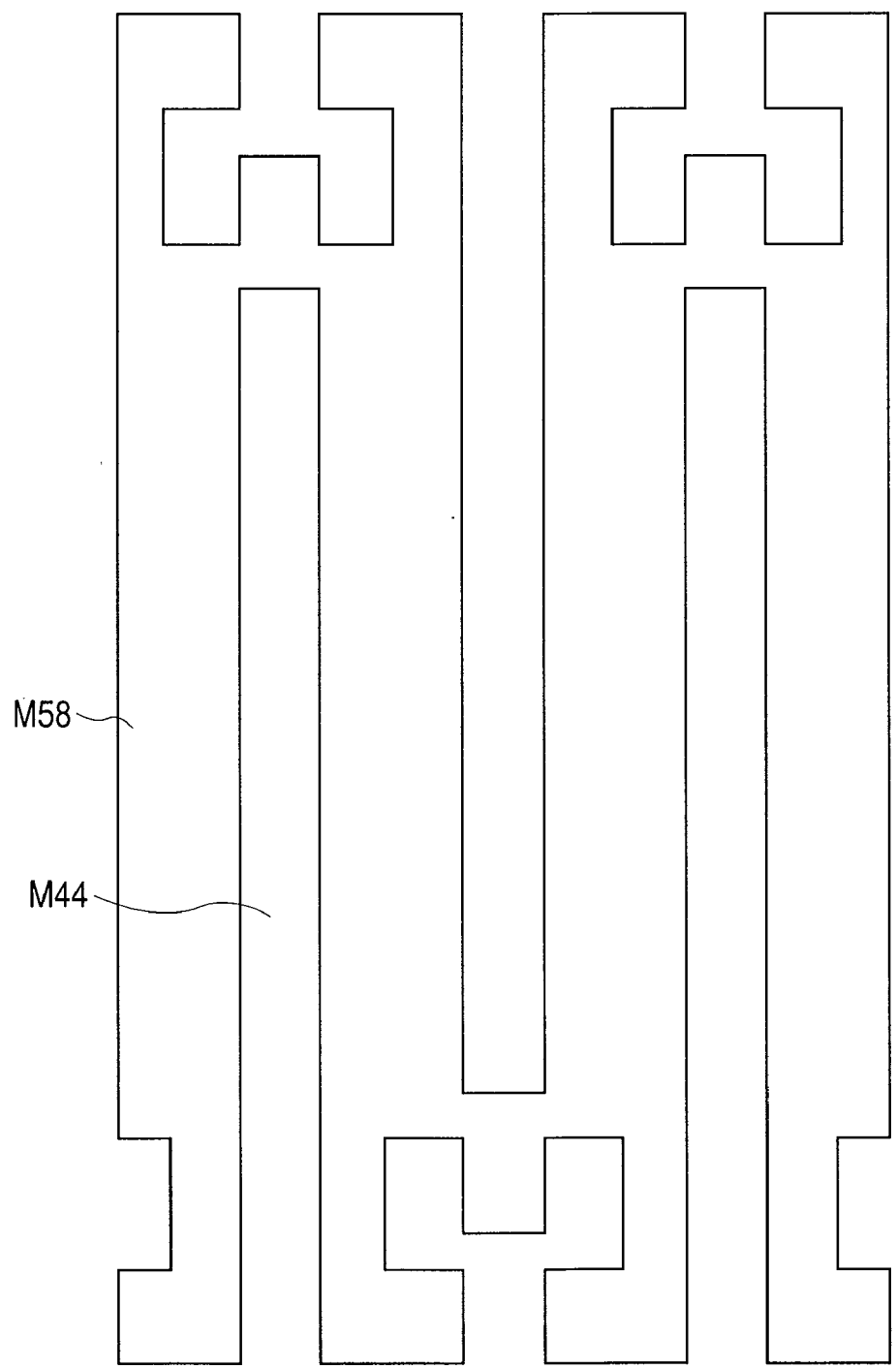
FIG. 31 is a view for showing a layout of the memory cell array of the semiconductor memory cell according to the embodiment 9, on way of manufacturing, for explaining manufacturing processes thereof.
Figure 32:
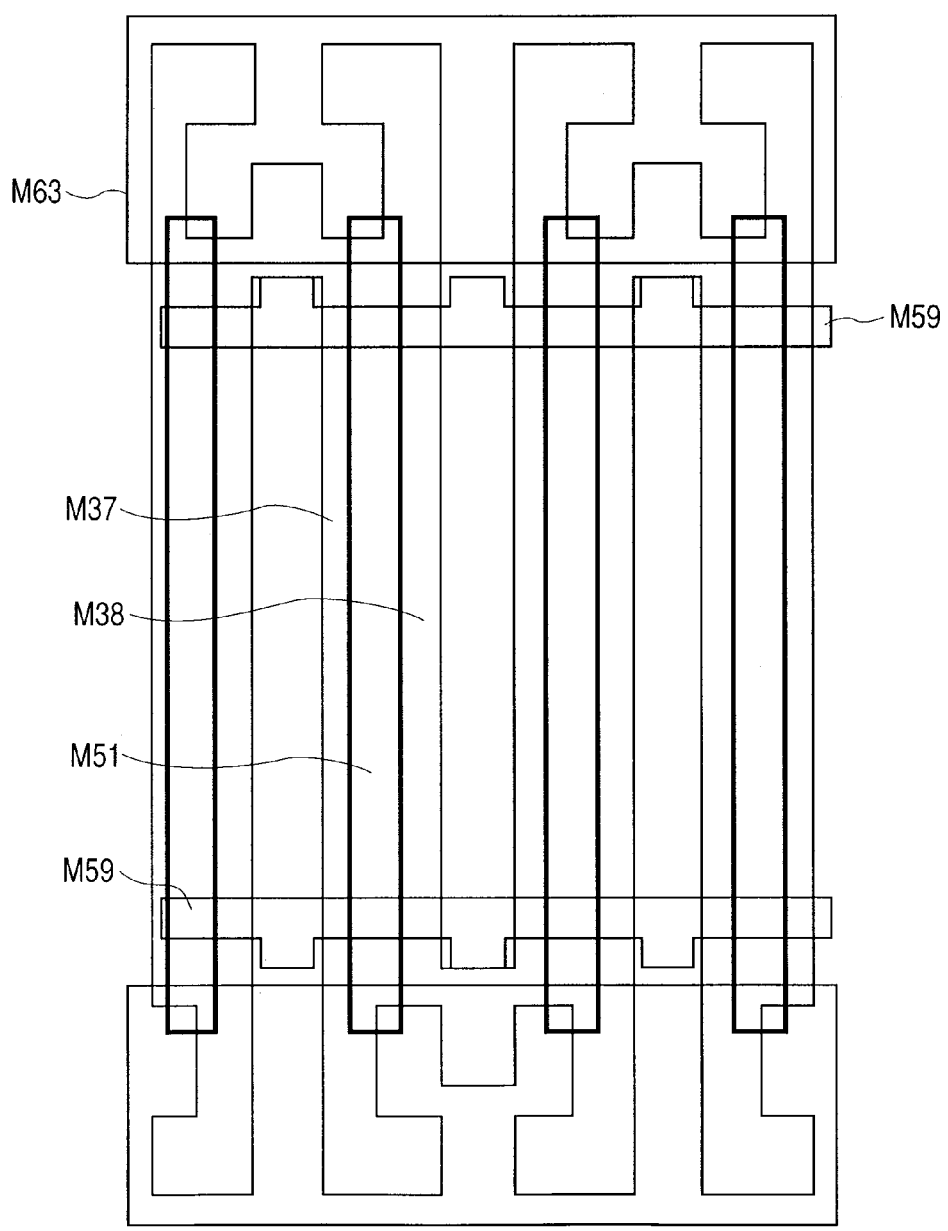
FIG. 32 is also a view for showing a layout of the memory cell array of the semiconductor memory cell according to the embodiment 9, on way of manufacturing, for explaining the manufacturing processes thereof.
Figure 33:
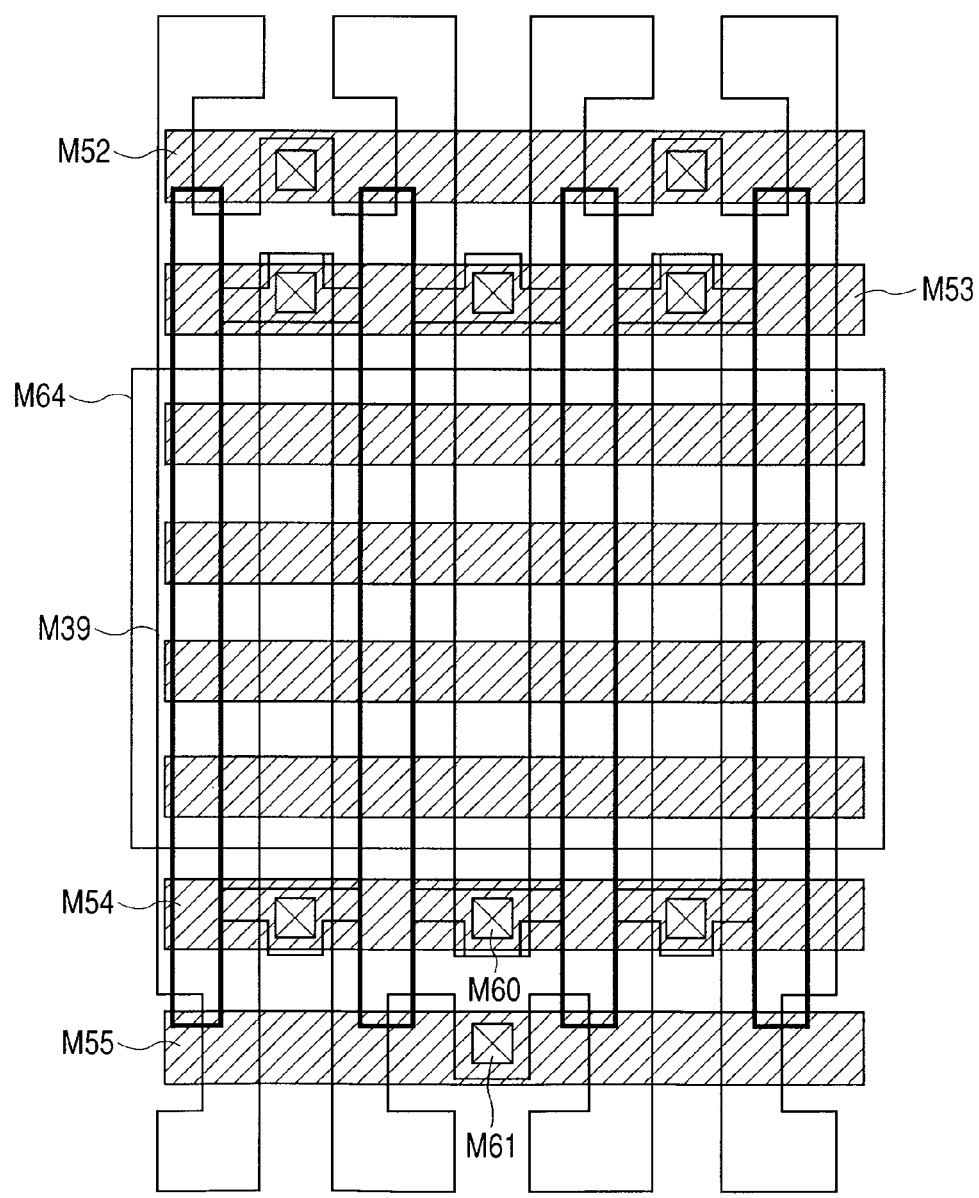
FIG. 33 is also a view for showing a layout of the memory cell array of the semiconductor memory cell according to the embodiment 9, on way of manufacturing, for explaining the manufacturing processes thereof.
Figure 34:
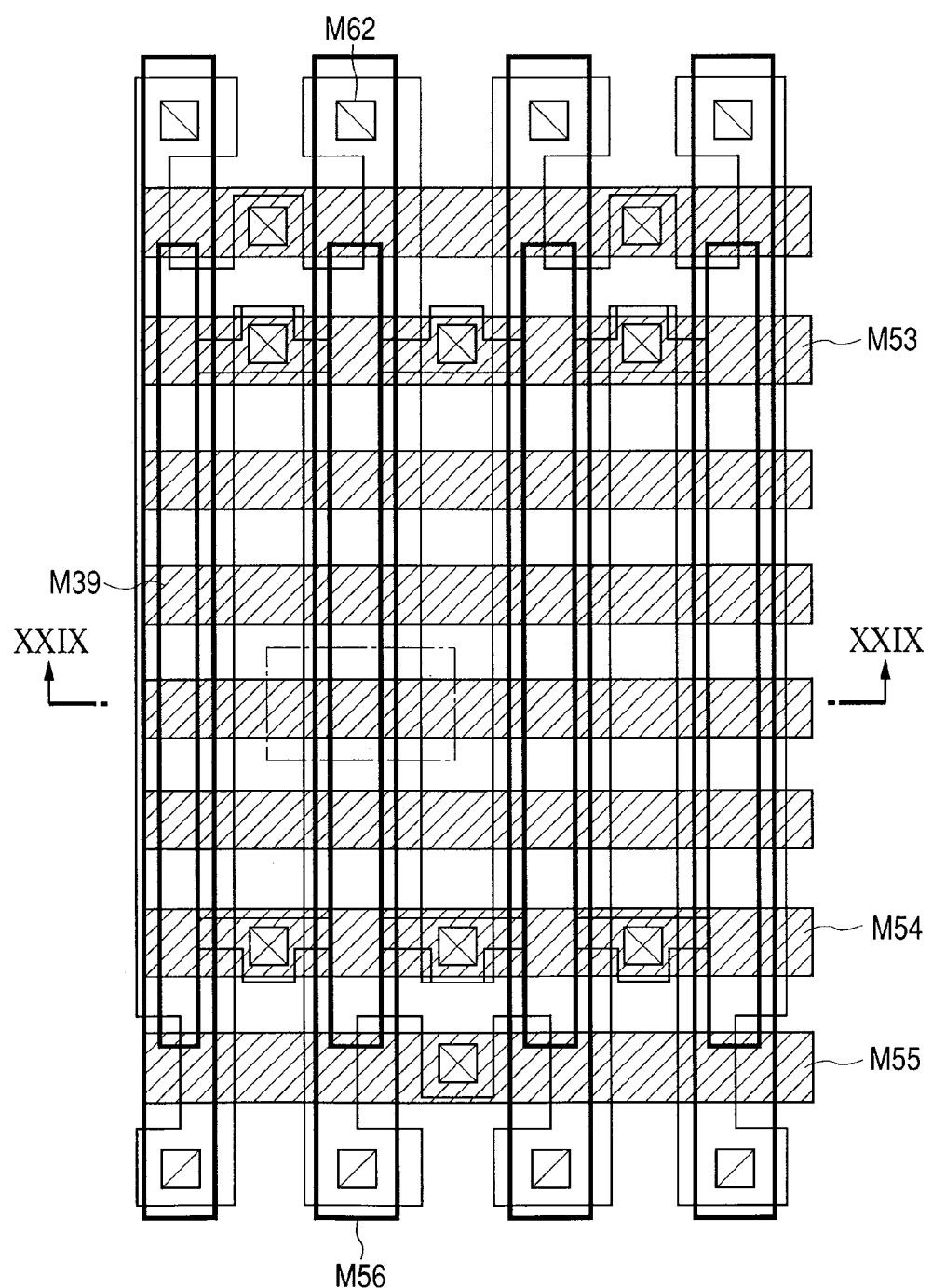
FIG. 34 is a view for showing a layout of the memory cell array, for explaining the manufacturing processes of the semiconductor memory cell according to the embodiment 9.
Figure 35A:
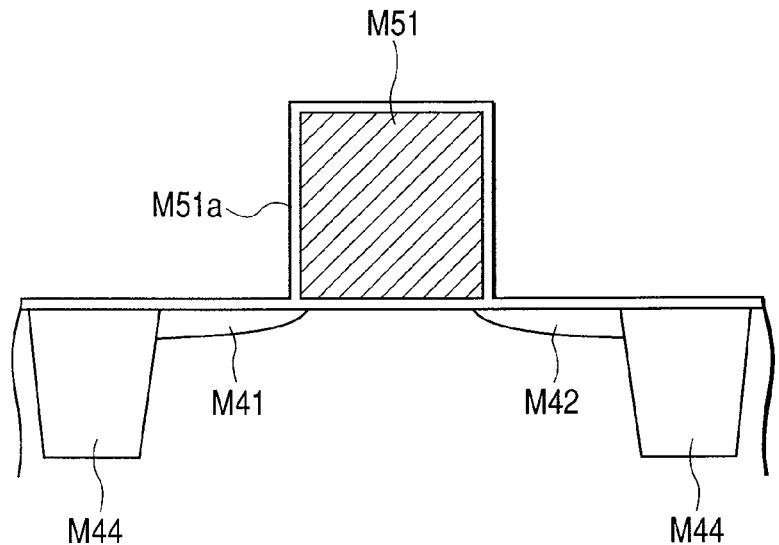
FIG. 35 is a view for showing the cross-section of the semiconductor memory cell according to the embodiment 9, for explaining a part of the manufacturing processes thereof.
Figure 35B:
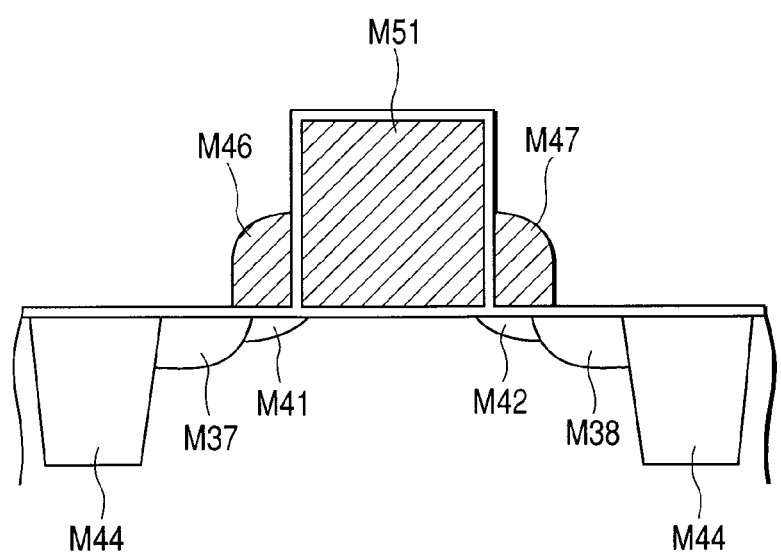
Figure 36A:
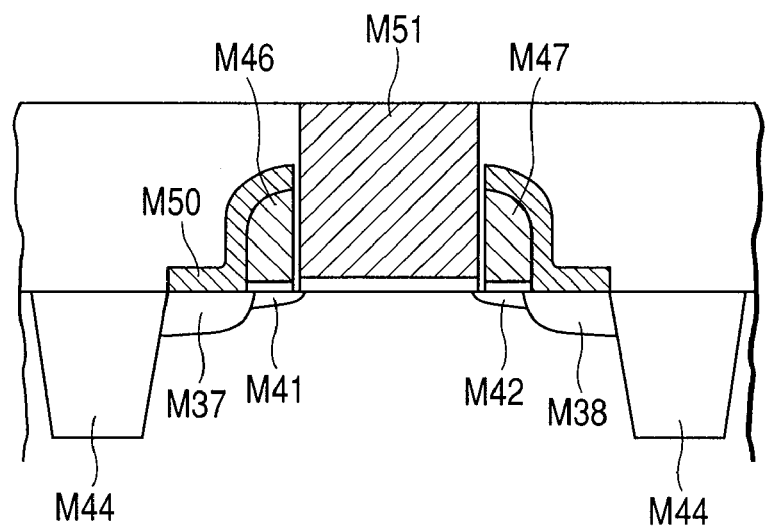
FIG. 36 is a view for showing the cross-section of the semiconductor memory cell according to the embodiment 9, for explaining a succeeding part of the manufacturing processes thereof.
Figure 36B:
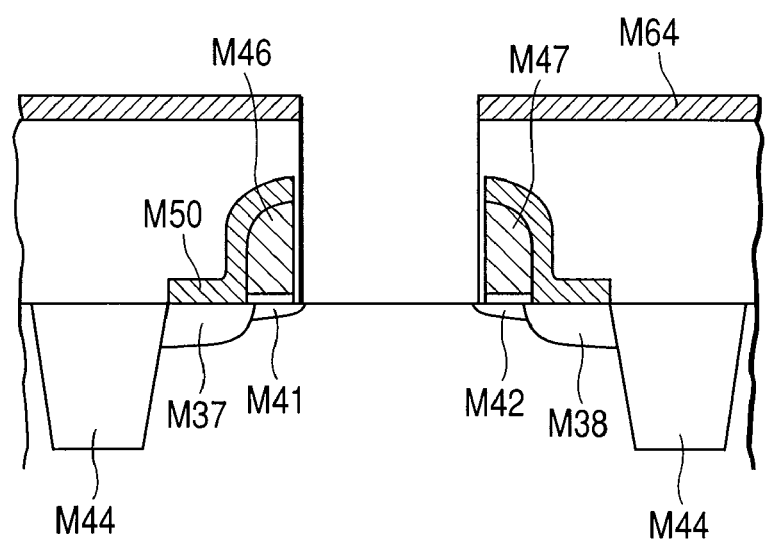

Next, the manufacturing method of the embodiment 9 will be explained. As is shown in FIG. 35(a), after forming the cell separation region M44 and the triple well structure, B (boron) ion is implanted in the region on the P well where the memory cells are formed, for adjustment of the threshold voltage thereof. A mask pattern M58 for forming the cell separation regions of the memory cell is shown in FIG. 31. After forming the victim oxidization of the substrate surface, $Si_2N_3$ film of thickness 150 nm is piled up, and etching is conducted upon the $Si_3N_4$ film with using a resist as the mask, thereby forming the gate electrode M51 as a dummy. After conducting adjustment of the threshold voltage below the sidewalls through implantation of impurity with using the dummy gate M51, the oxide film on the substrate surface is removed, to be oxidized again, and further an insulation film M51a is piled up, thereby forming portions to be the insulation films below the sidewalls M46 and M47. Next, P-type polycrystalline silicon is piled up at thickness of 100 nm, and then the sidewalls are formed through etching-back at thickness of 120 nm. In this instance, the selection transistors M59 are also formed with using the resist mask, at the same time (FIG. 32). After this, with using the resist pattern M63 as the mask, equi-directional etching is conducted, thereby removing the sidewalls in excess. As is shown in FIG. 35(b), after forming n-type diffusion layers through arsenic ion implantation with using the dummy gates, the sidewalls and the selection transistor gates M59 as the mask, the diffusion portions of the cell are exposed upon the substrate surface through dry etching and wet etching with using the resist as the mask. In this instance, on the diffusion layers of the selection transistors are remained the insulation films. After this, as is shown in FIG. 36(a), the diffusion layers and the polycrystalline silicon surface of the sidewalls are silicided. The diffusion layers of cell portion and the sidewalls are electrically connected with, however no connection is made on the selection transistor portions. After this, the insulation film is piled up, and then upper surface of the dummy gate electrodes is exposed through conducting CMP thereupon. Next, as is shown in FIG. 36(b), $Si_3N_4$ of the cell portions is removed through wet etching with using the resist pattern M64, and oxidization is conducted at thickness of 7 nm for forming the tunnel insulation film.

Next, further silicon fine crystalline grains are formed through the CVD method. The fine crystals piled up on the bottom surface of a gutter form memory nodes. The portions thereof, being formed on the side surfaces of the gutter, are not necessary, but since they have no influences upon the threshold voltage of cell, it does not matter if they are not removed therefrom. After forming the film of ONO structure, i.e., of $CVD-SiO_2/CVD-Si_3N_4/CVD-SiO_2$, as an interlayer insulation film M45 of thickness 12 nm, tungsten film is piled up for forming the gate electrodes, and is buried into the gutter portions when being flattened thereon, thereby forming the gate electrodes. Next, after the forming contact openings M63 for the selection transistors M59 and also contact openings M64 for the use of connecting the source lines and the diffusion layers are formed, and further piling up a W film thereon, the word lines M39, the source lines M52 and M55, the control lines M53 and M54 of the selection transistors are formed through processing the tungsten film with using the wiring patterns as the mask. In this instance, etching upon tungsten is conducted deeper down to the gate electrodes formed in advance, thereby preventing the adjacent word lines from being short-circuited. Further, conducting the pile-up of an interlayer insulation film and is conducted the flattening thereon, thereby forming the global data lines and the contact openings M62 for the use of connecting the diffusion layers. After the file-up of metal material, processing is conducted on the global data line M56.

(Embodiment 10)

Figure 37:
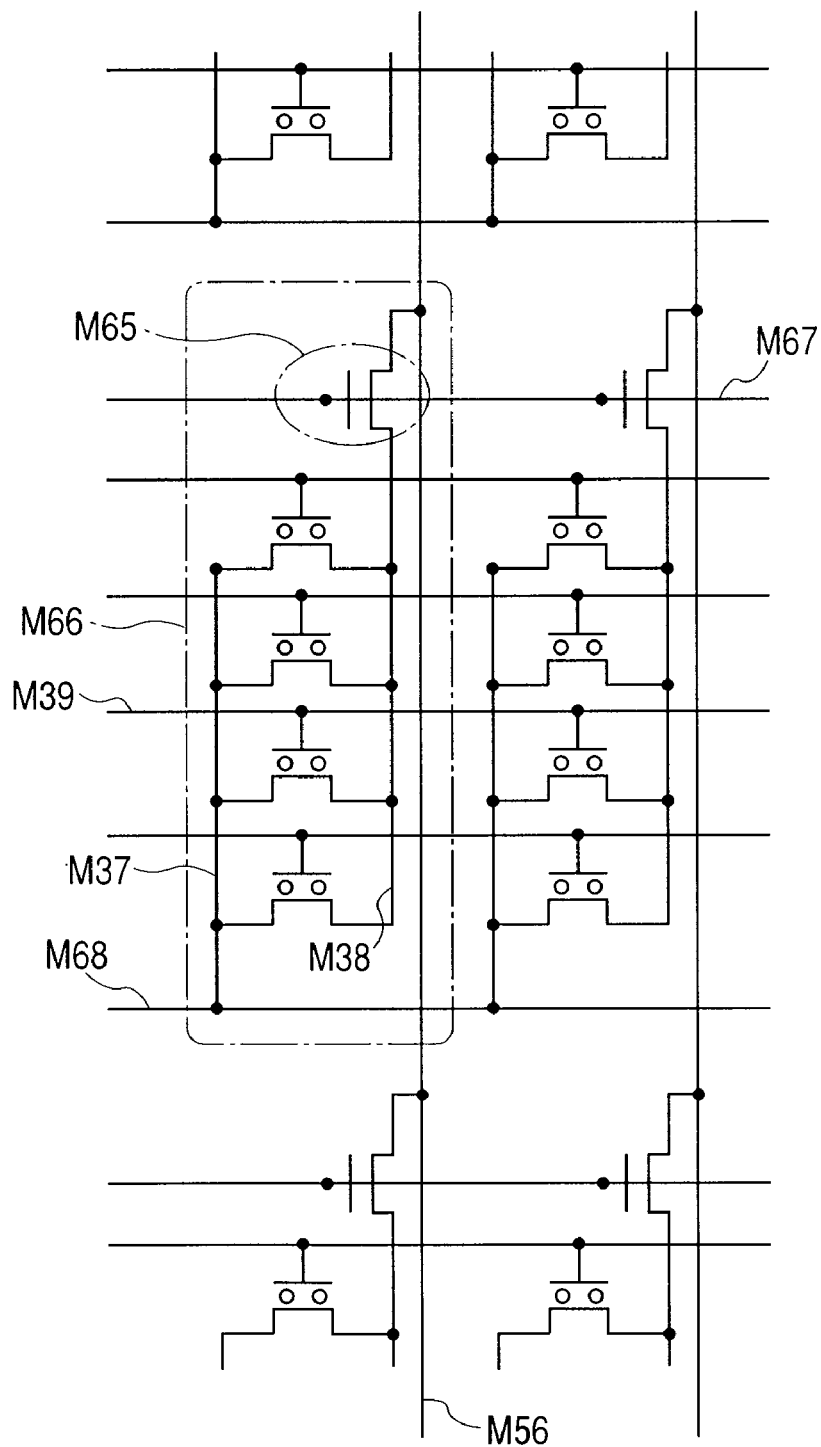
FIG. 37 is a view of showing an equivalent circuit corresponding to the structure of the memory cell array in the semiconductor device according to an embodiment 10.
Figure 38:
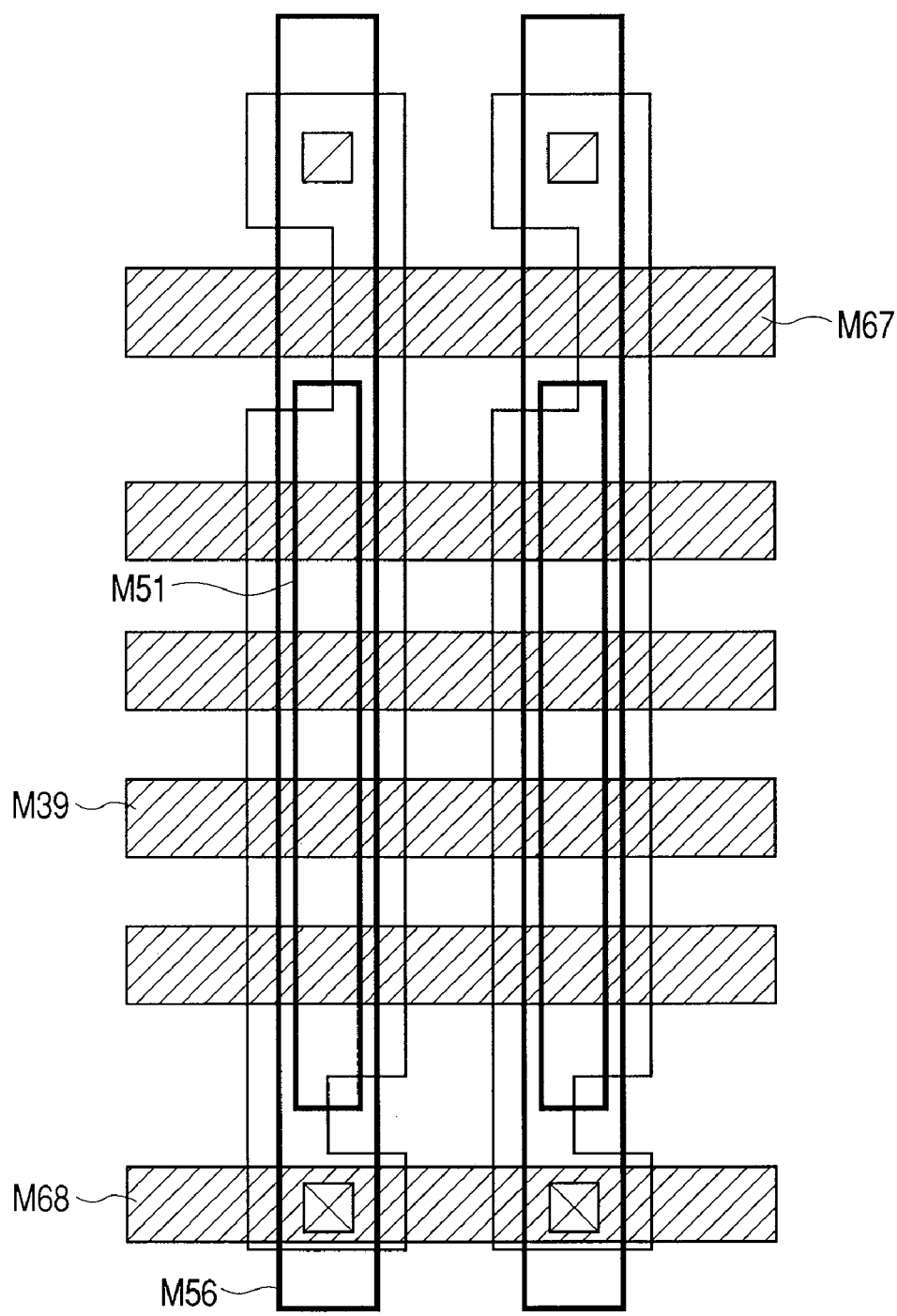
FIG. 38 is a layout view of showing the structure of the memory cell array in the semiconductor device according to the embodiment 10, corresponding to the above FIG. 37.

FIGS. 37 and 38 show a tenth ($10^{th}$) embodiment. The structure of a unit memory cell is same to that of the embodiment 9, however it differs from it in the structure of the cell array. The FIG. 37 shows the equivalent circuit diagram thereof, and the FIG. 38 a layout view thereof. The difference from the embodiment 9 lies in an aspect that the diffusion layer wiring M37 is connected only with each one of the global data lines M56. Also, the difference from the embodiment 8 in connecting relationship thereof lies in that it is connected with the global data line M56 through a selection transistor M65. A feature of the embodiment 10 lies in that an object of achieving small area of the cells can be realized by combining such the effect of reducing the contact number with using the common structures M37 and M38 of the diffusion layers, as in the embodiment 9, and such the effect of obtaining the cells without provision of the large number of selection transistors through source line driving, as in the embodiment 8. The selection transistors are provided, being reduced in parasitic resistance thereof by cutting off the local data lines, which are irrespective of the operations thereof, electrically from the global data lines, thereby increasing the speeds of the write-in and read-out operations thereof.

(Embodiment 11)

Figure 39:
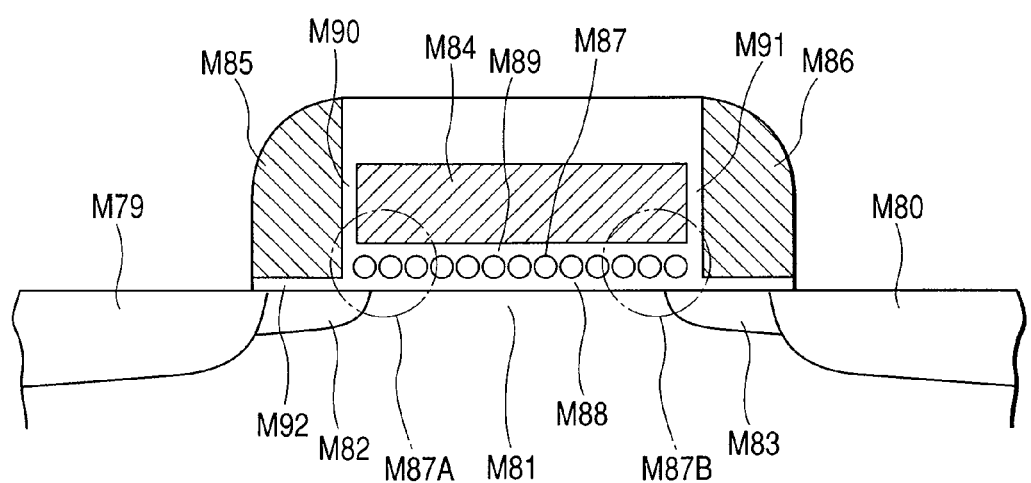
FIG. 39 is a view for showing the cross-section of the semiconductor memory cell according to an embodiment 11, being cut in perpendicular to a data line thereof.
Figure 40:
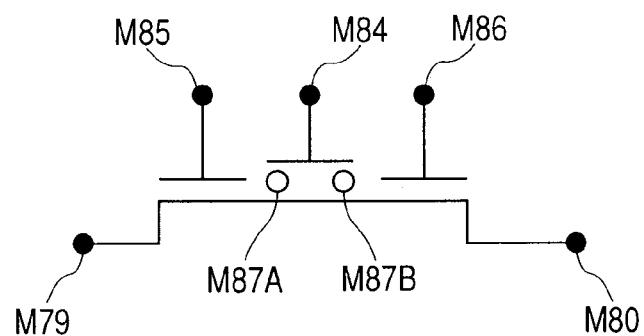
FIG. 40 is a view for showing an equivalent circuit corresponding to the semiconductor memory cell of the embodiment 11.

FIGS. 39 and 40 show an eleventh ($11^{th}$) embodiment. FIG. 39 is a view of showing the cross-sectional structure of the memory cell array, and FIG. 40 of showing the equivalent circuit diagram of the array structure. The embodiment 11 differs from the embodiment 10 in the cell structure. It is same that there are provided a source M79, a drain M80, an active region M81, a charge storage region M87 formed with a large number of independent semiconductor charge storage small regions in the vicinity of the active region, a control electrode M84 for controlling potential of the active region M81 and the charge storage region M87, and electrodes M85 and M86 provided on sidewalls on both sides of the control electrode and insulated from the control electrode through insulation films M90 and M91. The difference lies in that no connection is made between the source region M79, the drain region M80 and the sidewall electrodes M85 and M86, thereby applying potentials onto the sidewall electrodes independent from the source M79 and the drain M80. Due to necessity of a step for forming the contacts to the sidewall electrodes, the area is needed for this, and at the same time, the processing is complicated, however freedom can be increased for voltages, and the memory can be improved in performances thereof. In particular, during the read-out operation, it is possible to turn the region M82 below the source side sidewall electrode into low resistance, by applying positive voltage onto the source side sidewall electrode M85 with respect to the voltage of the source region M79, in the read-out operation of the source side bit, thereby obtaining a high speed operation thereof. Also, in the read-out operation of the drain side bit, it is true since the potential of the drain side sidewall electrode M86 can be changed. In that cell array structure; an increase is made only on the control lines of the sidewall electrodes, but other than that, the connecting relationships in the embodiments mentioned above can be applied therein. By taking into the consideration the fact, that write-in operation of information is conducted on the source side charge storage region M87A and the drain side charge storage region, independently, the equivalent circuit of the embodiment 11 is depicted by symbols as in the FIG. 40.

(Embodiment 12)

Figure 41:
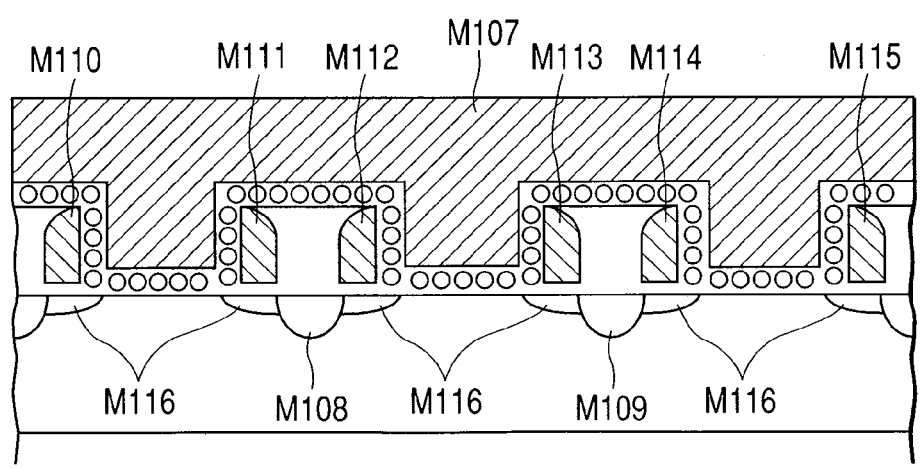
FIG. 41 is a view for showing the cross-sectional structure of a portion of memory cell array of the semiconductor device according to an embodiment 12, being cut in parallel to a word line thereof.
Figure 42:
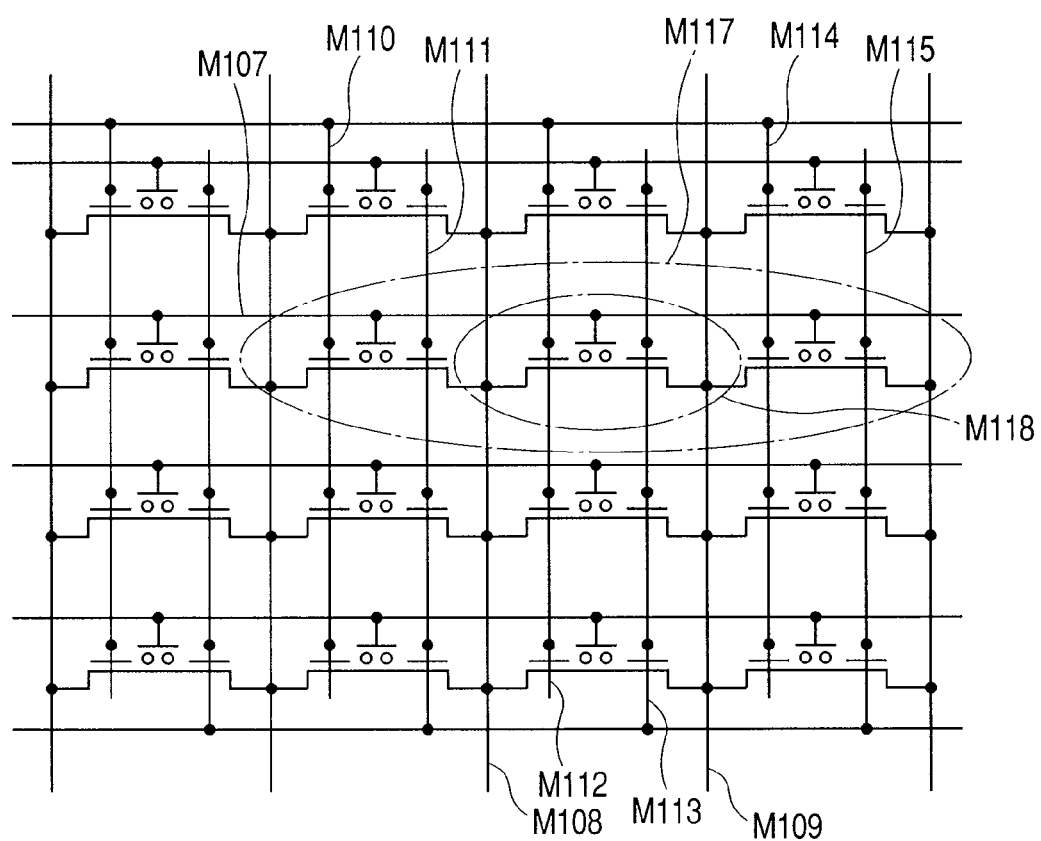
FIG. 42 is a view of an equivalent circuit for showing the connecting relationship in memory cell array portion in the semiconductor device according to the embodiment 12.

FIGS. 41 and 42 shows a twelfth (12$^{th}$) embodiment. FIG. 41 is view of the cross-sectional structure of the memory cell array, and FIG. 42 of showing the equivalent circuit diagram of the array structure. FIG. 41 shows cross-section corresponding to an oval or elliptic portion M117 indicated by chained line in the FIG. 42, being cut in parallel to the word line thereof. The structure of a unit cell and the operation principle for memorizing two (2) bits or more per a unit cell are same to those in the embodiment 11. Being same in the relationship of connection to the embodiment 6, the diffusion layer is shared between the neighboring cells, in common. The difference from the embodiment 6 lies in that auxiliary electrodes are provided on both sidewalls of the gate electrode, which serves as the word line too, and it enables the memory of two (2) bits or more per a unit cell. In an aspect that the write-in or read-out operation is conducted upon every second one of the cells, which are driven by the same word line, this is similar to the embodiment 6. When conducting the write-in operation on the cell M118 of the oval portion indicated by chained line in the FIG. 42, the cells on both sides are turned into non-conductive with using the auxiliary electrodes. In this instance, each of the cells has the auxiliary electrodes of two (2) pieces, by each, but the non-conductive condition can be accomplished by bringing one of them to low voltage, or both of them. In this instance, it is preferable to fix the potentials of the auxiliary electrodes, at least one on the side of the diffusion layer, on which data is loaded, to low voltage. For example, in a case where writing information at the side of the auxiliary electrode M112 in the cell M118, although the data to be written is loaded on the diffusion layer M119, in this instance it is desirable that the potential of the auxiliary electrode M114 of the adjacent cell is fixed to the low voltage. This is because, although the potential of the diffusion layer on data load side changes largely, it is possible to suppress the potential fluctuation in the vicinity of charge holding region of the adjacent cell by fixing the potential of the auxiliary electrode near to this, thereby enabling stable maintenance of memory operation. In the present embodiment, being similar to the embodiment 6, it is effective to apply the backing of metal wiring for lowering the resistance of the diffusion layer or the hierarchical structure of the data lines.

With the manufacturing method thereof, because of the similarity to the embodiment 5, only an outline will be mentioned. Differing from the embodiment 5, the cell separation is not conducted between the adjacent diffusion layer wirings in the memory cell region. This is because they are separated electrically with using the auxiliary electrodes. After forming the wells and the dummy gate electrodes, the sidewalls, being lower in the height than the dummy gates, are formed through the pile-up of conductive material and the etching-back thereof. Implantation of impurity is conducted with using the dummy gates and the sidewalls as the mask, thereby forming the diffusion layers. Further, the silicidation can be achieved without short-circuiting between the sidewall if it is conducted on the insulation layer after exposing the substrate surface through etch-back of the insulation layer which is piled up to be thin after forming the sidewalls. After the pile-up of the insulation layer, the flattening is conducted upon it, thereby exposing the upper end of the dummy electrodes upon the surface thereof. After removing the dummy electrodes selectively, oxidization is conducted, thereby forming the tunnel oxide film, and then the large numbers of memory regions are formed with fine grains made of metal or semiconductor. After forming the interlayer film of the ONO film, the word line material is piled up, and etching is conducted with using the resist pattern as the mask, thereby forming the word lines.

Figure 43:
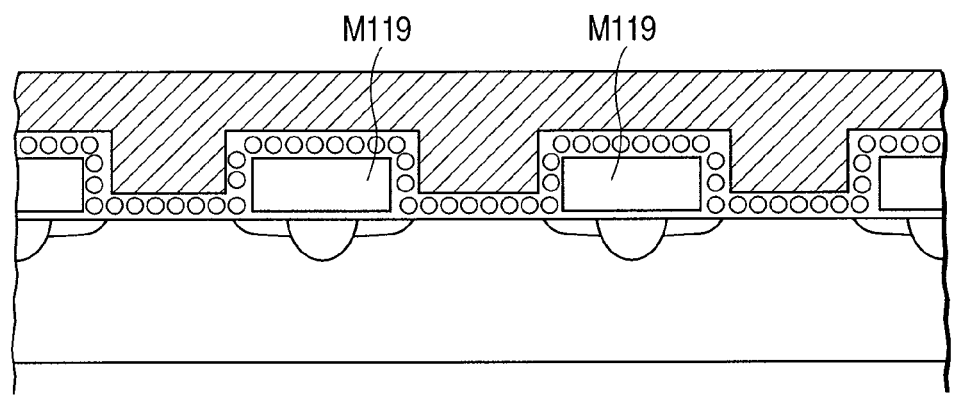
FIG. 43 is a view for showing the cross-sectional structure of a portion of memory cell array of the semiconductor device according to a variation of the embodiment 12, being cut in parallel to the word line thereof.

FIG. 43 shows another variation of the embodiment 12. This corresponds to the structure, in which the sidewall gates M119 are shared between the adjacent cells in common. However, no sidewall is formed, and therefore it differs from it in the manufacturing method thereof. Comparing to the structure mentioned above, the auxiliary gate can be formed wide, and therefore the process for forming the contacts is easy. Further, the number of wirings is reduced comparing to the case of driving the sidewalls on both sides independently, then the wiring pitch scarcely brings about problems, and therefore it is easy to make the backing with metal wirings. In the case of this embodiment, the two (2) cells neighboring to each other are turned into non-conductive when the auxiliary electrodes are set to low voltage. Accordingly, with making one of three (3) pieces of the auxiliary electrodes to low resistance, one of three (3) cells is operated, which are neighboring with one another and are driven with the same word line. In the manufacturing processes, after the implantation of impurity for forming the diffusion layers on way of the manufacturing processes of the structure shown in the FIG. 41 of the embodiment 12, the sidewalls are removed, and after filling up the gutters with the auxiliary gate electrode material, the auxiliary gate electrodes are formed through the etch-back thereof. After this, the gutters are filled up with insulation material and then flattened, and the processes thereafter are similar to those of the manufacturing processes of the structure shown in the FIG. 41, again.

(Embodiment 13)

Figure 44:
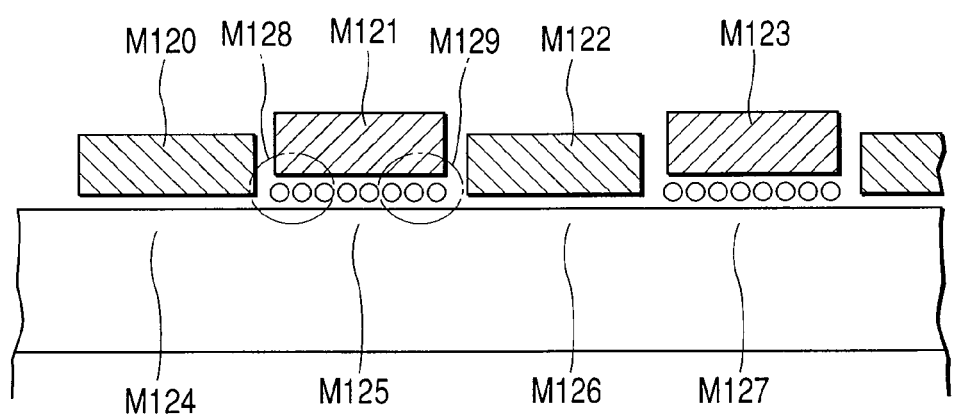
FIG. 44 is a view for showing the cross-section of a portion of memory cell array of the semiconductor device according to an embodiment 13, being cut in parallel to the word line thereof.
Figure 45:
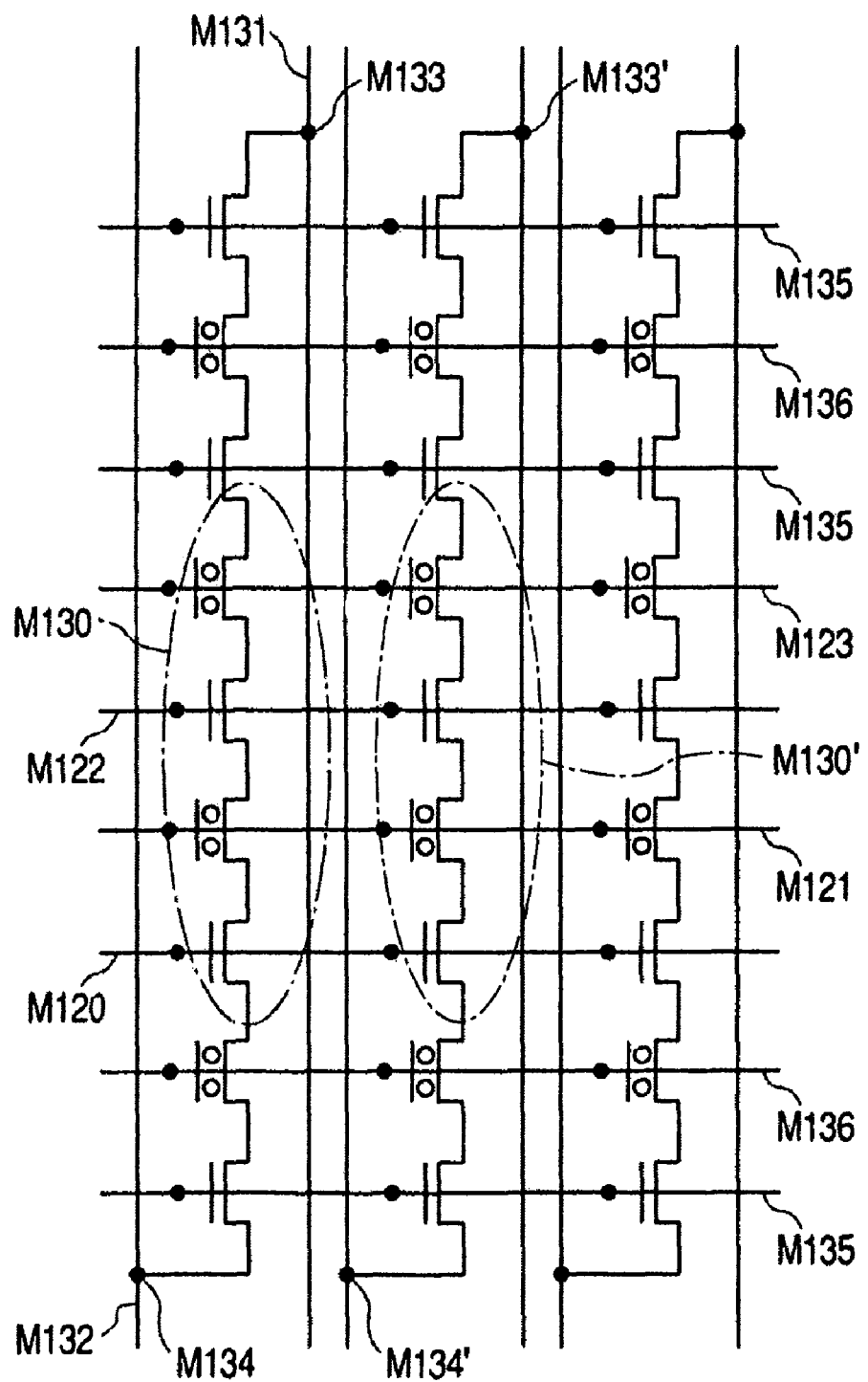
FIG. 45 is a view of an equivalent circuit for showing the connecting relationship in memory cell array portion in the semiconductor device according to the embodiment 13.
Figure 46:
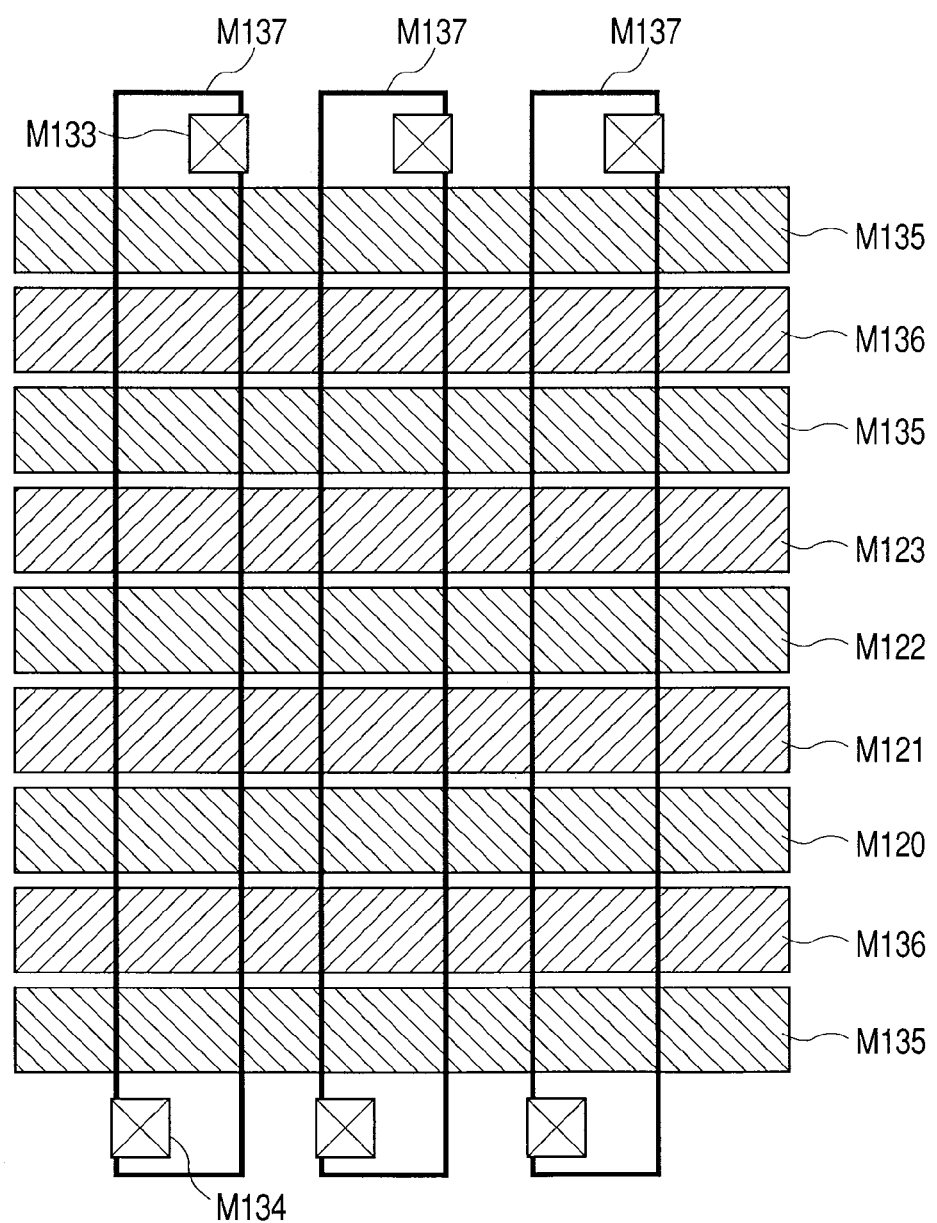
FIG. 46 is a view for showing a layout of a portion corresponding to the above FIG. 45, for explaining a portion of the manufacturing process of the semiconductor device according to the embodiment 13.
Figure 47:
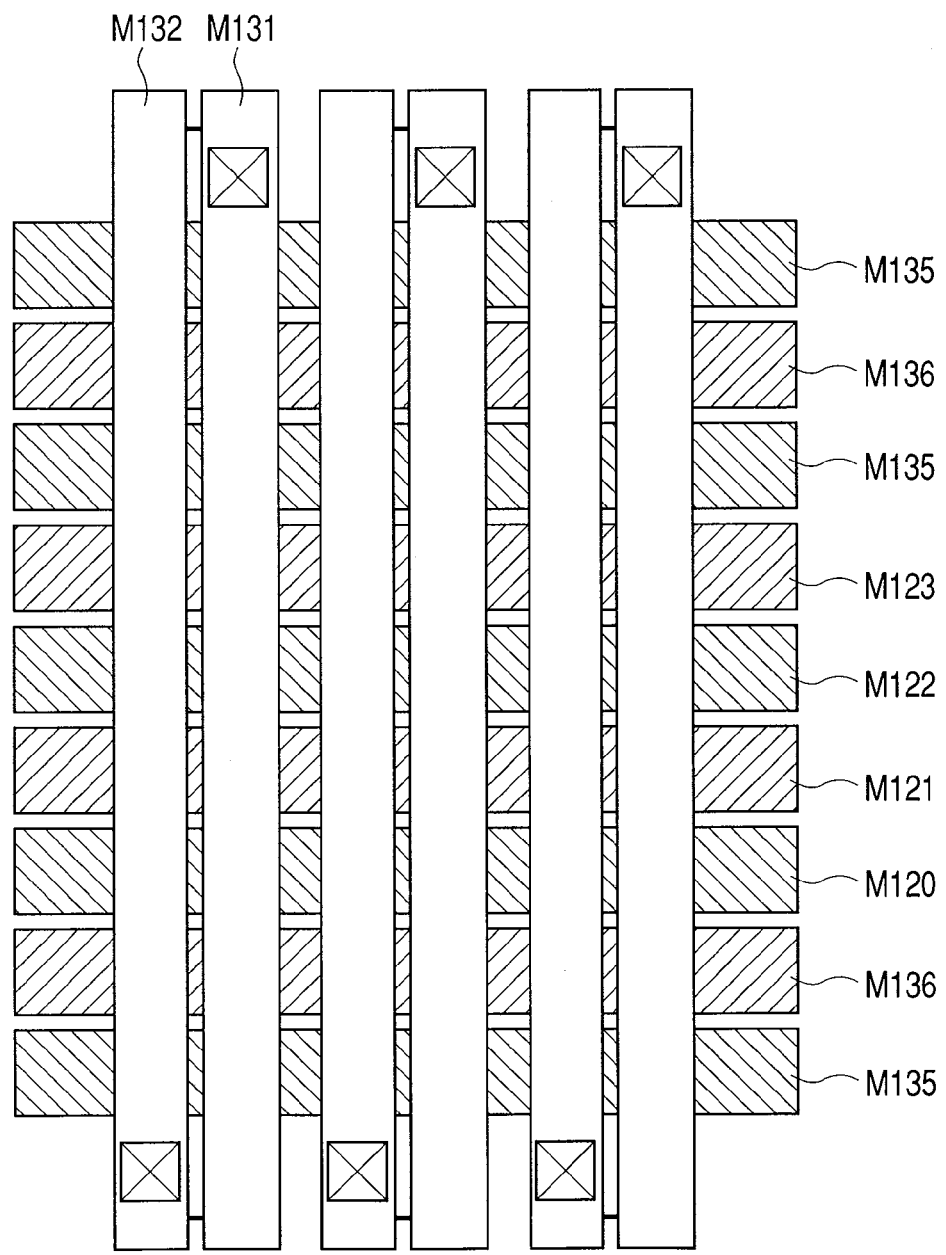
FIG. 47 is a view for showing a layout of a portion corresponding to the above FIG. 45, for explaining a succeeding portion of the manufacturing process of the semiconductor device according to the embodiment 13.

FIGS. 44 to 47 show a thirteenth (13$^{th}$) embodiment. FIG. 44 is a view for showing the cross-sectional structure of the memory cell array, FIG. 45 of showing the equivalent circuit diagram of the small-scaled array structure, and FIGS. 46 and 47 are layout views corresponding to the FIG. 45. The FIG. 44 shows the cross-section view in the direction perpendicular to the word line of the oval portion M130 indicated by chained line in the FIG. 45. Herein, explanation will be given on the array being small-scaled than the actual array structure. Differing from the embodiments mentioned heretofore, the embodiment 13 is characterized in that the memory cells are connected in series. Also, it is characterized in that no diffusion layer lies between the memory cells connected in series, on the cross-section of the FIG. 44 through which current flows. In the present embodiment, the resistance is high for the series connection thereof, but it has a feature that the cell area is small.

In the write-in operation of information into one end M128 of the cell driven by the word line M121, first the voltage of the first data line M131 is set at high voltage (for example, 5V) or low voltage (for example, 0V) depending upon the information to be written. The voltage of the second data line M132 is set at 0V. Further, voltages of the word line M121 of the cell to be written and the word lines M123 and M136 other than the auxiliary electrodes M120 on the side to be written of that cell, and the auxiliary electrodes M122, M135 are set at predetermined high potentials (for example, all 6.5V), thereby turning the portions below the electrodes into low resistance condition. The auxiliary electrode M120 to be written is set to lower potential (for example, 2V), thereby turning the substrate surface M124 below it into relatively high resistance. When bringing the word line M121 of the cell to a potential (for example, 12V) higher than other word lines thereof, hot electrons are generated on the substrate surface between the auxiliary electrode and the word line if the voltage of the first data line M131 is set the high voltage (for example, 5V), and they are injected into the charge storage region M128 in the vicinity thereof. The electric charge is scarcely injected if the first data line M131 is set at the low voltage. In the charge injection into the other end M129, the same word line M121 and the auxiliary electrode on the opposite side are used. In this time, data is loaded onto the data line M132, while the first data line M131 is turned to 0V. The information is written into the charge storage region M129 through the similar operation, but except for current flowing in the opposite direction.

In the read-out operation, the first data line M131 is pre-charged up to a positive potential (for example, 2V) when reading out the information on the side, at which the written information is loaded on the first data line M131 during the write-in operation, while the second data line M132 to that when reading out the information on the side, at which the written information is loaded on the second data line M132. In each of the cases, other ends are turned to 0V. With setting voltages of the word line M123 and M136, the auxiliary electrodes M120, M122 and M135, other than the word line M121 for driving the cell to be read out, are set to predetermined high potentials (for example, all 6.5V), and further a predetermined read-out voltage (for example, 3V) is applied onto the corresponding word line M121. For example, in the read-out operation of pre-charging the first data line M131, channel is formed on a side of lower potential, which is connected to the second data line M132, in the region M125 below the word line M121, while on the side of the first data line M131, since it receives more influences on the side of the second data line M132 due to the "pinch-off", i.e., the influences of the information held in M128, and therefore the read-out can be conducted.

Figure 48:
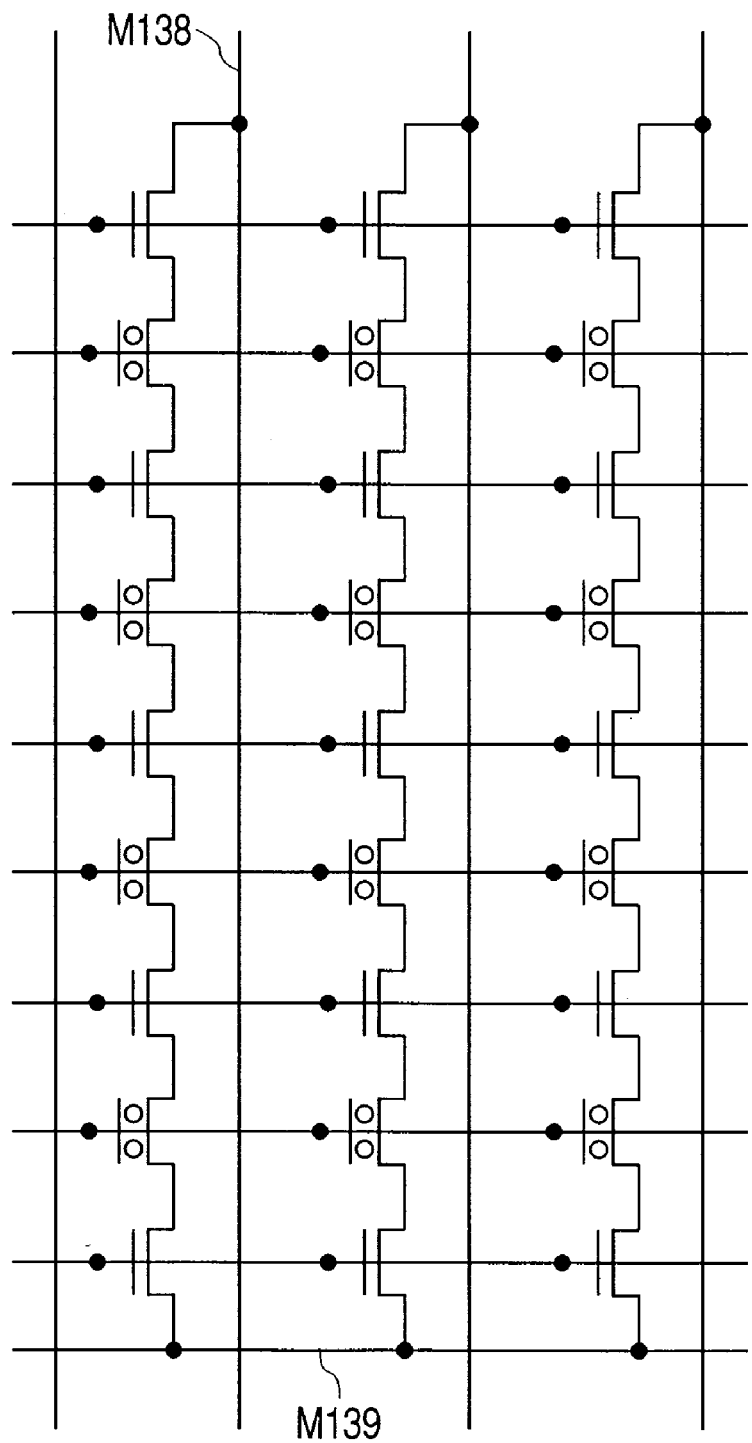
FIG. 48 is a view of an equivalent circuit for showing the connecting relationship in memory cell array portion in the semiconductor device according to a variation of the embodiment 13.

In the embodiment 13, there is used the method, in which two (2) pieces of data lines are prepared and the set voltages are exchanged therebetween, however as other embodiment, it is also possible to use a driving method similar to that of the embodiment 8, in which the potential on the source line is raised up in the connecting relationship of using the data line M138 and the source line M139, as is shown in the FIG. 48. With using this connecting relationship, it is enough that only one piece of the data lines is prepared for a line of series-connected cell arrays, thereby making the data line pitch smaller than that in the connecting relationship shown in the FIG. 45, and therefore it is possible to realize a small memory cell, as well as, an effect of cost reduction thereof.

The manufacturing processes of the embodiment 13 will be explained together with the layout views of the FIGS. 46 and 47. After conducting the cell separation for defining the active region M137, building-up or pile-up is conducted of the tunnel insulation film, the silicon fine crystal, the ONO film, the word line electrode material, and the cover insulation film. Etching is conducted upon the cover insulation film, the word line electrode material, the interlayer film and the silicon fine crystal, with using a resist as the mask, thereby forming the word lines M136, M123 and M121. After the oxidization of the surface thereof, further the insulation film is pile up thereon, and further the auxiliary gate electrode material is piled up at the film thickness thereof, so that the gutters formed with the word lines are completely filled up with it. Etch-back is conducted upon the auxiliary gate electrode material with using the peripheral portions thereof, so as to separate between the adjacent auxiliary gates, thereby forming the memory cells. After this, with using the word lines and the auxiliary electrodes as the mask, n-type impurity is implanted upon both end portions of the active region M137, thereby activating them. After forming the interlayer film, the contact openings M133 and M134 are formed in each of the both end portions of the active region M137, and the first data line M131 and the second data line M132 are formed.

(Embodiment 14)

Figure 49:
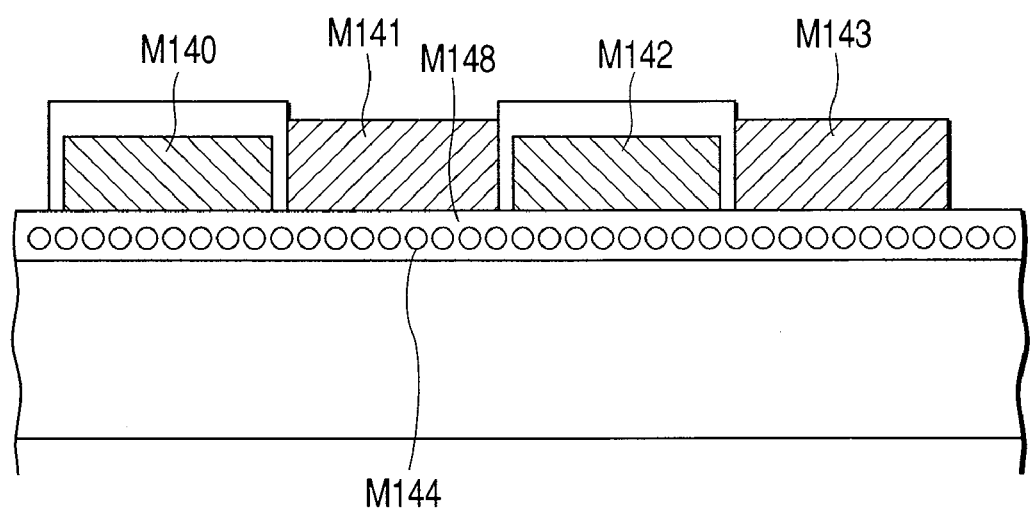
FIG. 49 is a view for showing the cross-sectional structure of memory cell array portion, being cut in parallel to read-out current and perpendicular to the word line, in the semiconductor device according to an embodiment 14.
Figure 50:
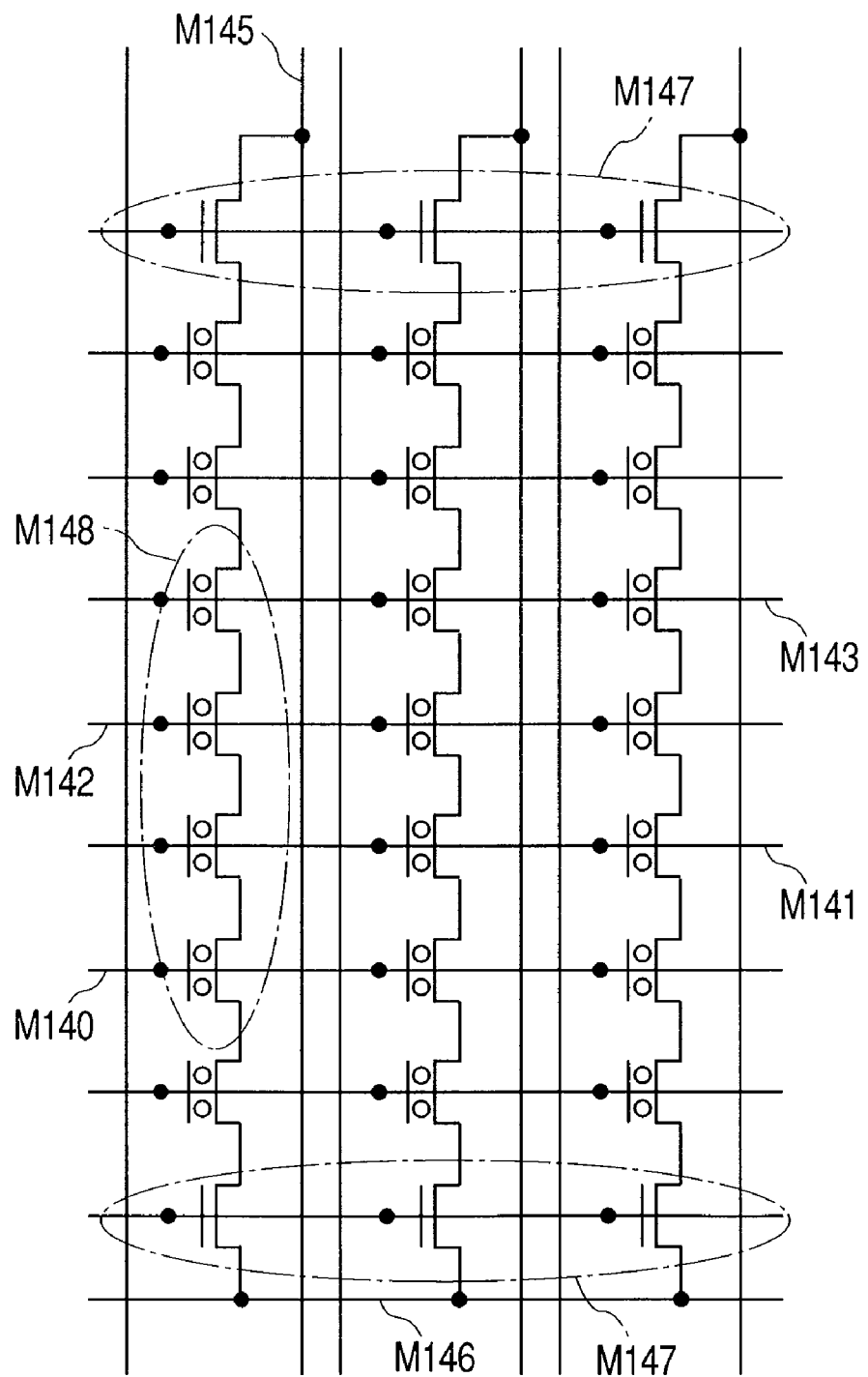
FIG. 50 is a view of an equivalent circuit for explaining connecting relationship in the memory cell array portion in the semiconductor device according to the embodiment 14.

FIGS. 49 and 50 show a fourteenth ($14^{th}$) embodiment. FIG. 49 shows the cross-section, and FIG. 50 is the equivalent circuit diagram for showing the connecting relationship of the cell array. The cross-section of the oval portion M148 elongated in the vertical direction, being indicated by the chained line in the FIG. 50, corresponds to the FIG. 49. Though being similar to the embodiment 13, however no auxiliary electrode is provided, and then it differs from in an aspect that all the portions where the auxiliary electrodes were formed are filled up with memory cells in places thereof. The charge storage region M144 lies over the entire. In the embodiment 14, the area for each the memory cell is very small. Accordingly, it has an effect of being suitable for the structure of low cost memory without conducting the write-in operation at both ends, i.e., on both the source side and the drain sides. With combining this together with the multi-memory per a cell, it enables great cost reduction, exceeding over the present flash memory. Also in the embodiment 14, two (2) bits memory per a unit cell can be achieved by conducting the write-in operation on both ends, as shown in the FIG. 50, however it may also be possible to obtain the multi-levels depending upon the charge amount in the same place where the charge is injected, or to realize further high density memory, with combination of the charge amount and the both end writing together. Also, it is described that the array structure is similar to that of the variation (shown in the FIG. 48) of the embodiment 13, however it may be built up in the similar relationship in connection to that shown in the FIG. 45.

Also in the driving method, being similar to that of the variation (shown in the FIG. 48) of the embodiment 13, when conducting the write-in operation on the right-hand side in the cell driven by the word line M141, on the drawing sheet, the word line M140 is utilized in the same manner as of the auxiliary electrodes M120 in the embodiment 13. The read-out operation is also similar to that. The difference lies in that the portions, though being used as the auxiliary electrodes in the embodiment 13, also constitute the memory cells, and therefore the write-in and the read-out operations can be conducted with using the word lines of the adjacent memory cells, as the auxiliary electrodes. In more details, it is characterized in that, when driving the memory cells on the word line M141, the word lines M140 and M141 are used as the auxiliary electrodes, while when driving the memory cells on the word line M142, the word lines M141 and M143 are used as the auxiliary electrodes. In the FIG. 50, though both ends M147 of the series-connected cells are indicated to be formed with the ordinary transistor structure, but that structure may be the same to the memory cells. The write-in operation on both sides cannot be conducted since the auxiliary electrode is provided only the one side thereof, however the write-in operation on one side is possible, and therefore they can also be used as the memory cell.

Manufacturing method of the embodiment 14 will be explained. This is characterized in that the adjacent word lines are formed in different processes. After conducting the cell separation for defining the active region M137, the pile-up is conducted for forming the tunnel insulation film, the silicon fine crystal, the ONO film, the word line electrode material, and the cover insulation film. Etching is conducted upon the cover insulation film and the word line electrode material, with using a resist as the mask, thereby forming the word lines M140 and M142. Differing from the embodiment 13, no etching is conducted upon the interlayer film and the silicon fine crystals. Herein, weak oxidization is conducted in this stage. Though the surface of the n-type polycrystalline silicon is oxidized, however the ONO film M148 protects the silicon fine crystals and the substrate, and therefore no oxidization is caused, practically. It may be possible to use a CVD film in the place of the oxidization film, however since the characteristics of the cells driven by the adjacent word lines are changed or fluctuated due to the film thickness of the word line formed later, being thicker than the interlayer film in thickness, and therefore attention is needed. Further, word line material is piled up at the thickness so that the gutters built up with the word lines M140 and M142 can be buried or filled up with it, completely, and then etch-back is conducted upon the word line material, with using the resist mask for the peripheral portions in common, thereby forming the word lines M141 and M143. The processing after this is same to that of the embodiment 13.

(Embodiment 15)

Figure 51:
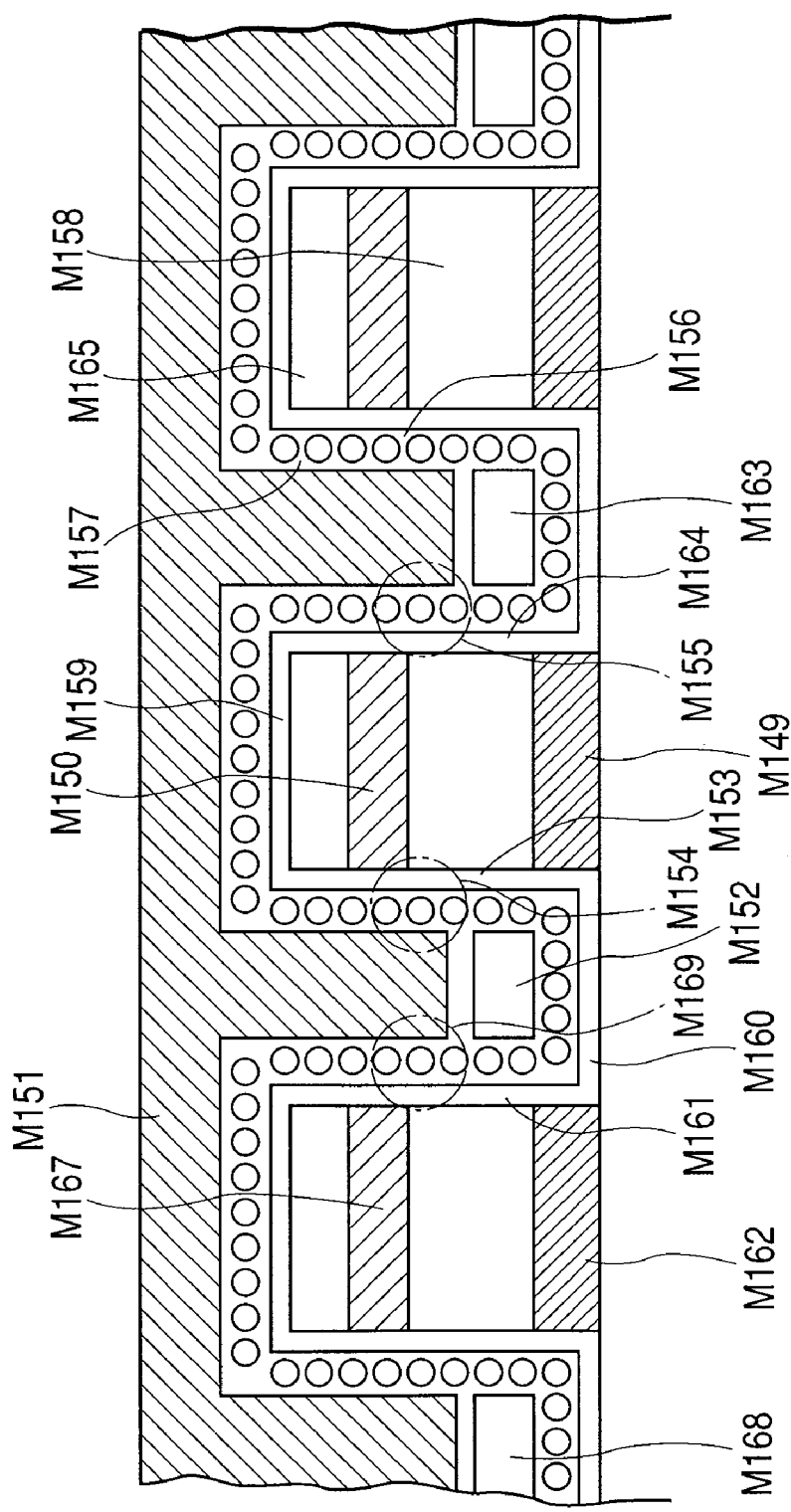
FIG. 51 is a view for showing the cross-sectional structure of a layout of memory cell array portion in the semiconductor according to an embodiment 15, shown along LI-LI line into the direction of arrows in FIG. 54.
Figure 52:
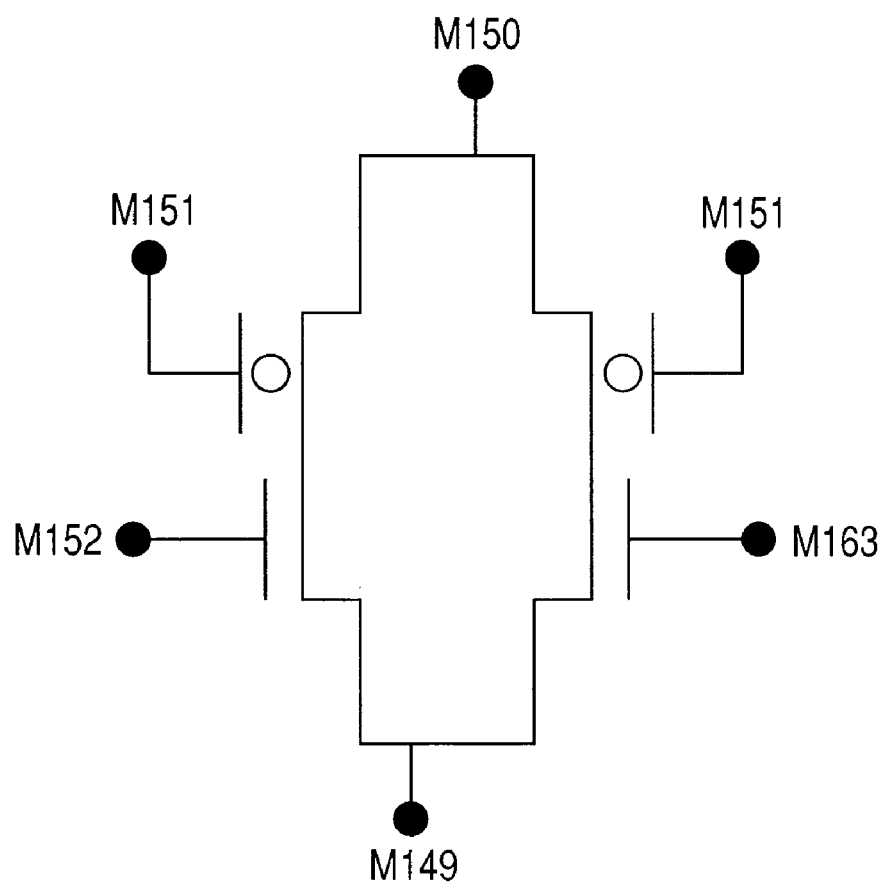
FIG. 52 is a view of an equivalent circuit corresponding to the semiconductor memory cell of the embodiment 15.
Figure 53:
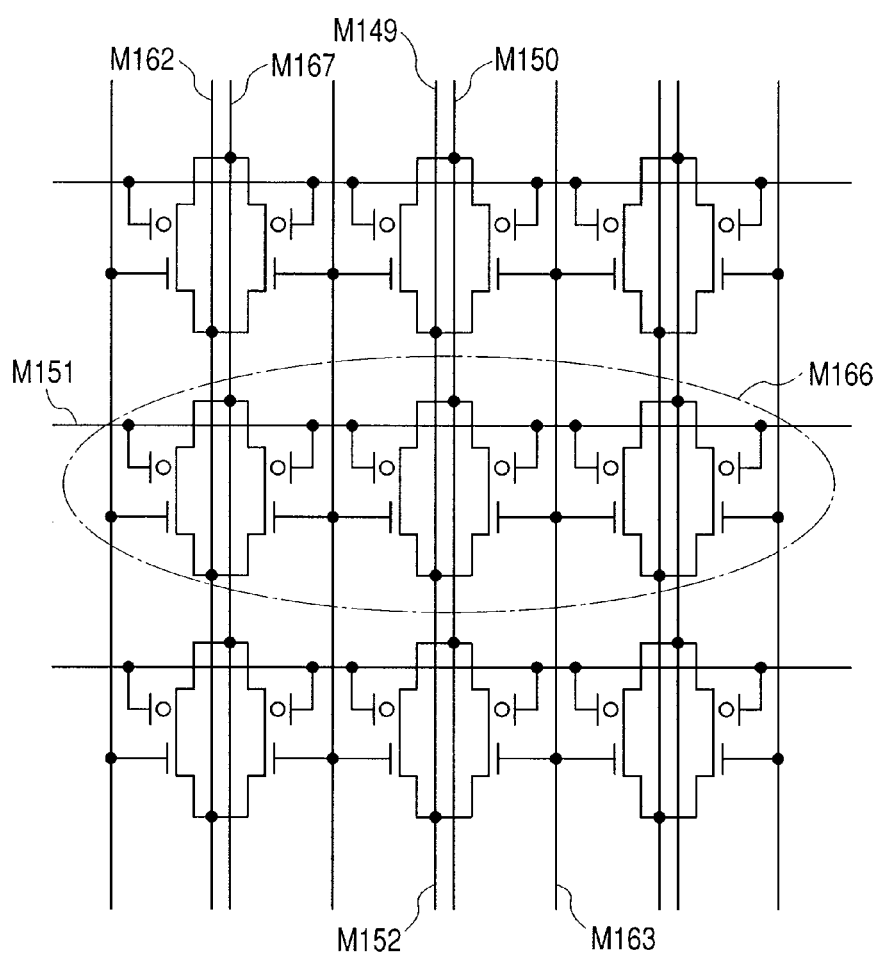
FIG. 53 is a view of an equivalent circuit for explaining connecting relationship in the memory cell array portion in the semiconductor device according to the embodiment 15.
Figure 54:
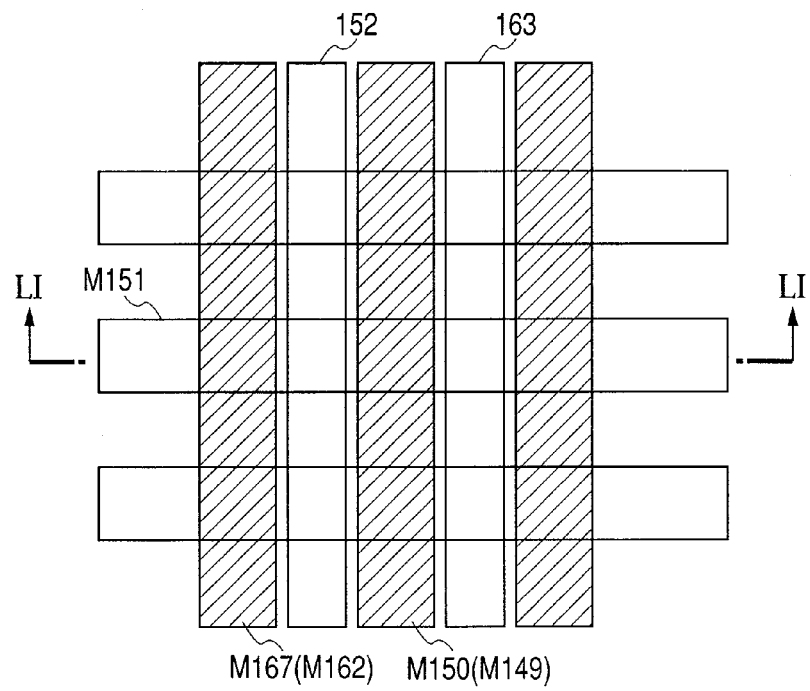
FIG. 54 is a view for showing a layout of the memory cell array portion in the semiconductor device according to the embodiment 15.

FIGS. 51 through 54 show a fifteenth (15$^{th}$) embodiment. FIG. 51 shows the cross-section view thereof, on the surface being perpendicular to the data line and parallel to the word line. FIG. 52 shows the equivalent circuit diagram of the unit structure, and FIG. 53 the equivalent circuit diagram for showing the connecting relationship between the cells. Also, FIG. 54 is a layout view for showing the connecting relationship between the cells and the layout thereof. The cross-section along with LI-LI line shown into the direction of arrows in the FIG. 54 corresponds to the FIG. 51. From a viewpoint of circuits, the cross-section of the region of an oval portion M166, indicated by chained line in the FIG. 53, corresponds to the FIG. 51. Memory cell array is formed on an insulation film, for example, on the buried insulation film for cell separation. With such the lamination structure, the source (source line) M149 made of n-type polycrystalline silicon and the drain (data line) M150 are in a positional relationship of up and down, and an insulation film M158 lies between them. The source M149 and the drain M150 are connected with each other through channel layer thin films M153 and M164 made of semiconductor, and then current flows in direction perpendicular to the substrate. On side surfaces of the channel layer thin film are provided the charge storage regions M154 and M155, being made from a large number of fine grains of semiconductor, independently from one another, and further the auxiliary electrodes M152 and M164 and the word line 151 are provided on the side surfaces between the data lines through the interlayer insulation films M157, thereby controlling one portions of the channel layer thin films, respectively. The present structure is small in the cell area with the utilization of a cubic or three-dimensional structure thereof, and brings about cost lowering effect.

With the structure of the embodiment 15, it is possible to drive the charge storage regions M154 and M155 at two (2) locations by only one (1) piece of the data line M150. Namely, when conducting writing and reading of data into/from one of the charge storage regions, for example M154, voltage of the auxiliary electrode M163 on the reverse side is set to low voltage, thereby turning the channel layer thin film M164 into non-conductive state, in the vicinity of this region. With using the auxiliary electrode M152 of the write-in side as the auxiliary electrode for the write-in operation, it is possible to obtain the injection of hot electrons with high efficiency.

Though the auxiliary electrode M149 is used as the auxiliary electrode for the write-in and/or read-out operations, in the embodiment 15, it is also possible to achieve the driving with exchanging the functions between the word line and the auxiliary electrode. For example, in the case where the auxiliary electrode M152 is used as the word line, first data is loaded on the data lines 14167 and M150 on both sides thereof (for example, being set at 0V for the write-in of "1", or 5V for the write-in of "0"), and the source line is set at high voltage (for example, 5V) while the auxiliary electrodes M168 and M152 at low voltage (for example, 0V). Further, the word line M151 is set to relatively low voltage (for example, 2V), and high voltage (for example, 11V) is applied onto the auxiliary electrode M152, wherein information is written into a portion of fine dots M169 and M154 for the charge storages on both ends of the auxiliary electrode M152, being located beside the auxiliary electrode and near to the word line M151. When reading out, it is enough to set the word line M151 to predetermined high voltage (for example, 4V), so as to turn the portions beside the word line M151 into low resistance, and also to set the auxiliary electrode M152 to predetermined read-out voltage (for example, 2.5V).

Figure 55:
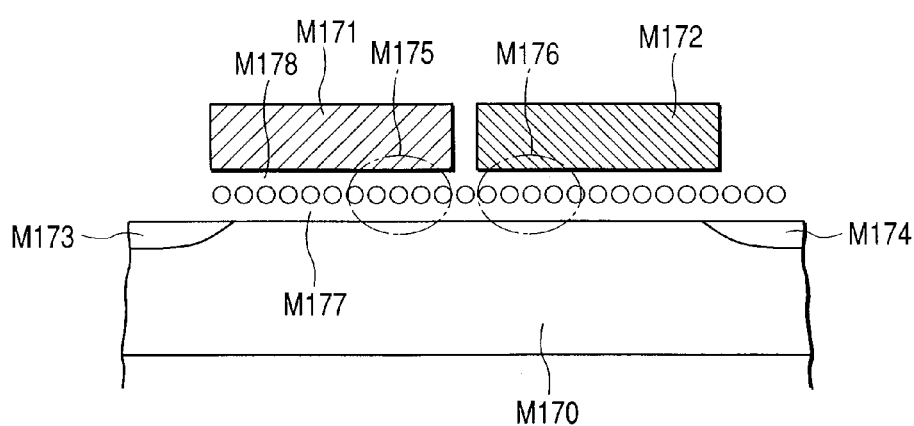
FIG. 55 is a view for showing the cross-sectional structure of the semiconductor memory cell according to a variation of the embodiment 15.

This exchange operation, as was shown simply in the FIG. 55, is applicable only in the case where the gate electrodes are aligned at a very little distance between them. On the P-type silicon substrate M170 is formed a tunnel insulation film M177, fine grain memory nodes and an interlayer layer M178, and further thereon are formed a first gate electrode M171 and a second gate electrode M172. The electrodes can be taken out from both ends through n-type diffusion layers M173 and M174 in the structure thereof. When writing information into the memory region M175 below the first gate electrode M171, the second gate electrode M172 is used as the auxiliary gate. On the contrary to this, when writing the information into the memory region M176 below the second gate electrode M172, the first gate electrode M171 is used as the auxiliary gate. When reading out the information in the memory region M175 below the first gate electrode M171, the second gate electrode M172 is set to the high voltage, so as to turn the substrate surface below the second gate electrode M172 into low resistance irrespective of the information written into the memory region M176 below it, while setting the first gate electrode M171 to predetermined read-out voltage, thereby discriminating or differentiating the threshold voltage shift from the difference in the resistance thereof. When reading out the information in the region M17.2 below the second gate electrode M172, the first gate electrode M171 is set to the high voltage while the second gate electrode M172 to the predetermined read-out voltage.

Upon the basis of this structure, it is also possible to apply such the array structure, being same to that of the embodiment 2, into it. The drawing corresponding to the FIG. 17 is the FIG. 56. It is possible to write information below the auxiliary electrodes M95 and M96, other than the memory in the same manner to that in the embodiment 2, thereby bringing about an improvement on memory density therein.

In the embodiment 15, the semiconductor material of the channel is remained on the data line M159 and between the source lines M160. Of course, though the removing step thereof may be introduced, however there may occurs no problem in the operation thereof, even if remaining as it is. Namely, this is because of the fact that the leakage between the source lines M160 causes no problem since the source line is set at the common voltage, and further on the data line M159 is connected only the different side surface of the same data line. Though the source lines and the data lines are formed of n-type polycrystalline silicon in the embodiment 15, however with this, they have high resistance comparing to the metal wirings. A method of providing contacts at an appropriate length or distance and adopting the structure of backing with metal data lines is also effective. It is also effective to adopt the hierarchical data line structure, in which the polycrystalline silicon data line M150 is cut into an appropriate length, while providing contacts through switches, and they are connected to the metal global data lines. Further, the source lines and the data lines may be made of metal, thereby to obtain low resistance thereof. In this case, no PN junction is established between the channel layer thin films M153 and M164 and the source M149 and the drain M150, however it is possible to suppress the leakage when being off through fully conducting the depletion process upon the channel layer thin films M153 and M164. However, in the embodiment 15, the source, the insulation layer and the drain are formed in the vertical structure, however they may be formed in such the vertical structure, being similar to that of the data line mentioned above, with etching the silicon substrate surface.

Next, manufacturing processes of the embodiment 15 will be explained. On the cell separation region are piled up n-type polycrystalline silicon, $SiO_2$, n-type polycrystalline silicon and $SiO_2$, in that order, and then they are processed or machined together, with using a resist as the mask, collectively, thereby forming the data line M150 and the source line M149. A thin film of amorphous silicon of intrinsic or weak n-type is piled up at thickness of 8 nm, and further a tunnel insulation film M156 is piled up thereon. Through this heating process, crystallization of the amorphous silicon thin film is conducted through the CVD. Silicon crystalline grains are formed, and further the interlayer film M157 is piled up thereon, and then n-type polycrystalline silicon is piled up for the auxiliary electrode, so that gutters are buried or filled up with material thereof. Etching-back is conducted, so as to form the auxiliary electrodes M152 and M163 on the bottom of gutters. In this stage, the surface is oxidized, or piled up with the insulation film, in the place thereof, and further the word line material is piled up, so as to burry or fill up the gutters with it. Conducting the flattening, and further processing or machining upon the word line material with using a resist as the mask, form the word lines M151. Herein, there are formed the channel layer thin films in the region where no word line is provided on the side surfaces of the data line, however no problem occurs, if the threshold voltage is set to be high, thereby to turn them into the normally-off condition. In the case where the threshold voltage is set to be lower, further processing of the interlayer film, the tunnel film, and the channel layer thin film, with using the word lines as the mask, can protect the portion, where no word line is provided, from occurring the leakage therein. Also, it may be possible to conduct the etching upon the channel layer thin film before forming the auxiliary electrodes, in advance.

(Method of Using Dummy Cells for Generating Reference Potential when Reading Out)

Figure 57A:
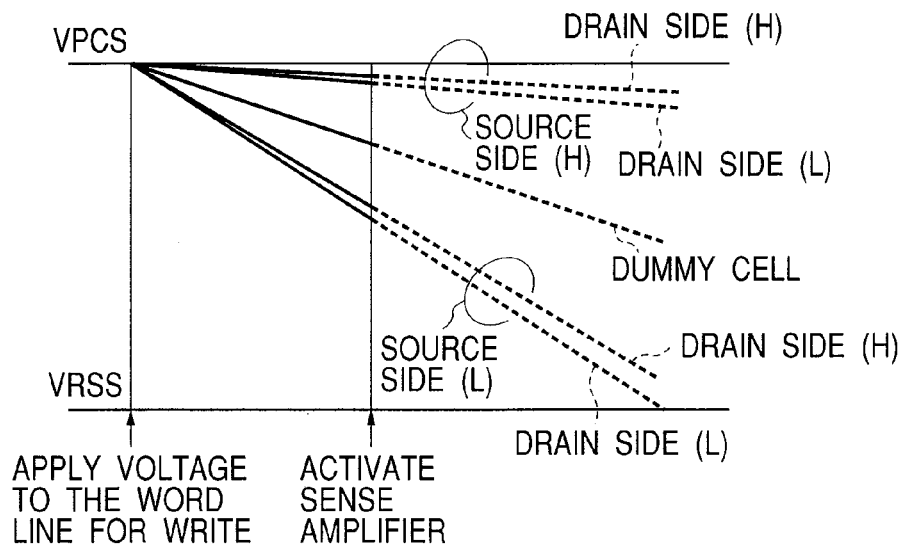
FIG. 57 is a model view for showing potential change in read-out operation of the semiconductor device according to the above embodiment 8.
Figure 57B:
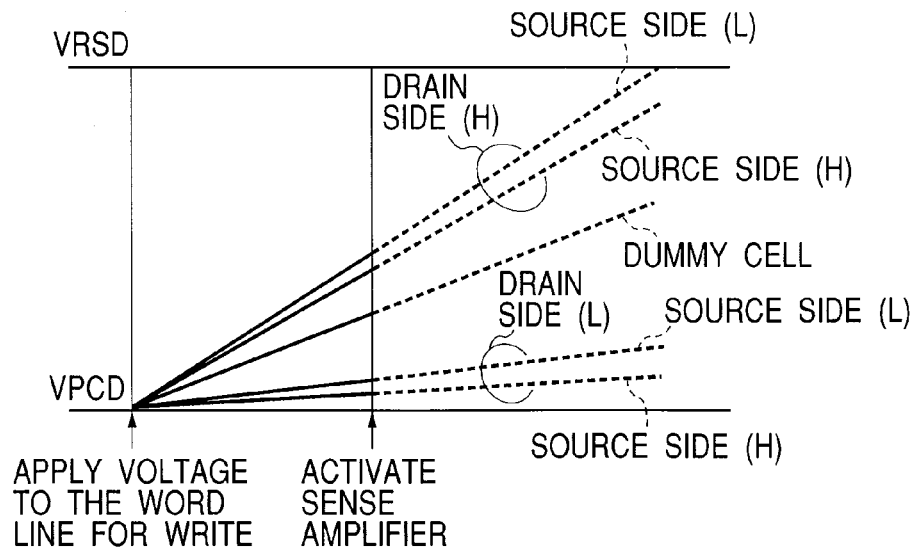

A method is effective, in which the dummy cells are used for generating the reference potentials for the read-out operation, in the respective embodiments mentioned above. FIGS. 57(a) and 57(b) show the potential change of the data line after application of voltage on the word line to be read out, being simplified in the case of using the dummy cells therein. The FIG. 57(a) shows the read-out operation at the source end, while the FIG. 57(b) the read-out operation at the drain end. As shown in the figures, it is ideal that the characteristics of the read-out operation at the source end receive no influences from the read-out operation at the drain end, however it is affected a very little, actually. It is also true in the read-out operation at the drain end. With using the dummy cells, it is possible to escape from this, substantially. Accordingly, it is preferable to use the cell, in which weak write-in operation is conducted at the both ends thereof, in the write-in operation of the dummy cell. For achieving the weak write-in operation, there are known various methods, including a one of setting the word line voltage to be small when writing, and other of shortening write-in pulse width to be applied onto the word line, and further other method of setting the data line voltage small, etc., and it does not matter to adopt any one of them.

(Memory Map)

Herein, explanation will be made on a memory map. Herein, the entire of cells, which are driven by the same word line, will be called by a sector, hereinafter.

Figure 58:
FIG. 58 is a view for showing an example of a memory map of the semiconductor device according to the above embodiment 8.

FIG. 58 shows an example of the memory map of the embodiment 8. The cells, which are driven by the same word line, are 8,192 pieces of cells, and have 16,384 pieces of word lines, thereby realizing the memory capacity of 256 Mb. Actually, other than those, they have control information of several tens bites per a word line for error correction, etc., however they are omitted in the figure. Also, as was mentioned in the embodiment 7, the well is shared in common by a unit of, so-called a block, being made up with plural numbers of sectors as one set thereof. The wells within the different blocks are electrically separated from one another, and therefore they can be driven, independently. Accordingly, it is possible to conduct the erase operation by a unit of the block.

As a result of this, the capacity of the wells to be driven can be reduced, and the parasitic resistance from end to end can be also lowered, thereby enabling stable operation with high speed. The addresses on the left-hand side on the figure are sector addresses. There are prepared the source end memory and the drain end memory for one cell, and therefore two (2) sectors are assigned or distributed to the each cell which is driven by the same word line. In the embodiment 8, the sector address is assigned in the order only to the source end, but the sector address on the drain end is separated from that source end address. In the write-in operation, control is made so that the write-in operation is conducted on the continuous regions of the sector addresses, sequentially. For this, there is no necessity of changing the source line potential during the write-in operation, and therefore the write-in operation can be obtained with high speed. For the same reason, the read-out operation is also high-speeded. On the other hand, information of different files is memorized within the same cell.

Since the erase operation is conducted on both ends at the same time, it is impossible to erase only one file, selectively. Then, first the portion corresponding to the other end of the memory region where is stored the file to be erased is read out to an outside, to be held in a RAM, etc. Next, the erase operation is conducted upon the corresponding region, and again, the information held in the outside and that to be re-written is written into. In the case of adopting the block erase mentioned above, saving operation for this read-out operation is conducted by a unit of the block. In the case of the method where the erase operation can be done without the change of the well potential, since the erase operation by the unit of the sector is possible, other methods also can be applied to, which will be mentioned below. Namely, after reading out information on the other end of the sector to be re-written, so as to be stored into a register, the sector erase operation is done, and next the other end information is written back. The writing of the information to be re-written is conducted after this. Since both this saving information and the re-write information can be held at the same time in the register, freedom in operation sequences can be increased up. On a while, in general, since the erase operation takes time several times long or more, comparing to the time for the read-out operation, there is a problem to that the operation is delayed for repetitions of the erase operation, comparing to the method of saving into an outside.

Figure 59:
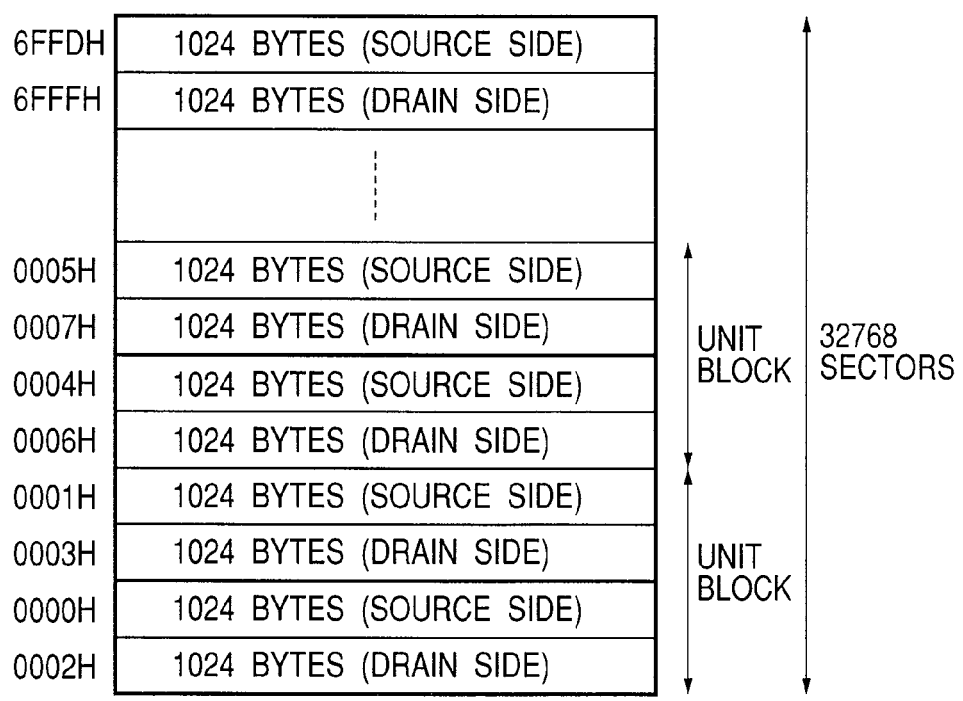
FIG. 59 is also a view for showing an example of the memory map of the semiconductor device according to the above embodiment 8.

FIG. 59 shows another example of the memory map in the embodiment 8. In the present structure, a set is made up with two (2) sectors, which are driven by different source lines, and they are treated by the unit of a block. For example, the sectors driven by the adjacent word lines M25 and M29 form the block. Sector addresses are assigned to, so that they are not continuous at the source end and the drain end of the word line, and the write-in operation is conducted in this order. As a result of this, during the time when the write-in operation is conducted at the drain end on one word line (for example, M29), the source line (M21 in this case) of the cells which are driven by the other word line (for example, M25) can be exchanged to the set voltage for write-in operation at the source end, and therefore it can dissolved without penalty of the voltage exchange speed. Comparing to the method shown in the FIG. 58, it has high frequency of exchanging the source lines and also large electric power consumption, however it enable to construct the block in small in sizes, therefore there can be obtained an advantage that such the saving operation as mentioned above is unnecessary when conducting the ease operation by this unit.

However, all the mentioned herein is about the method for managing places of information storages in the memory, using the cells therein, which enable both ends memory, and this is for explanation of the sequential order of the write-in operations on the sector addresses, for example. Accordingly, it is needless to say that the assignment of the sectors, blocks, and addresses, etc., should not always be in this manner. Also, with managing the assignment by means of software, or the like, the manner of assignment may be changed on the way of the use thereof.

Also, in the embodiment 4, after assigning the sector numbers on the source ends within the same block in series, they are assigned to the drain ends, continuously (see the FIG. 58). In the embodiment 4, plural numbers of the word lines, each driving the unit local data line, form a set, and the entire block of cells which are driven by the one set of word lines is called by a block.

If also making the order of the write-in operations in this sequential order, since continuous data can be stored into the source ends and the drain ends in the same block, no such the saving operation is needed when conducting the block erase operation. Operation for exchanging between the source end and the drain end must be included or inserted during the period of write-in operation, however the exchange operation in the embodiment 4 is fast comparing to that in the embodiment 8, so that such the driving is effective therein. Other than this, it may also possible to adopt the driving method of conducting the write-in operation at the source ends and the drain ends, which are driven by the same word line, continuously. With this, though the consumed electric power is increased for charging/discharging on the local source lines, and also in time, the operation is slow for the exchange time thereof, however the erase and the write-in operations can be achieved by the unit of the word lines, therefore being effective, in particular, where a unit of data to be treated is small in the scale thereof.

Figure 60:
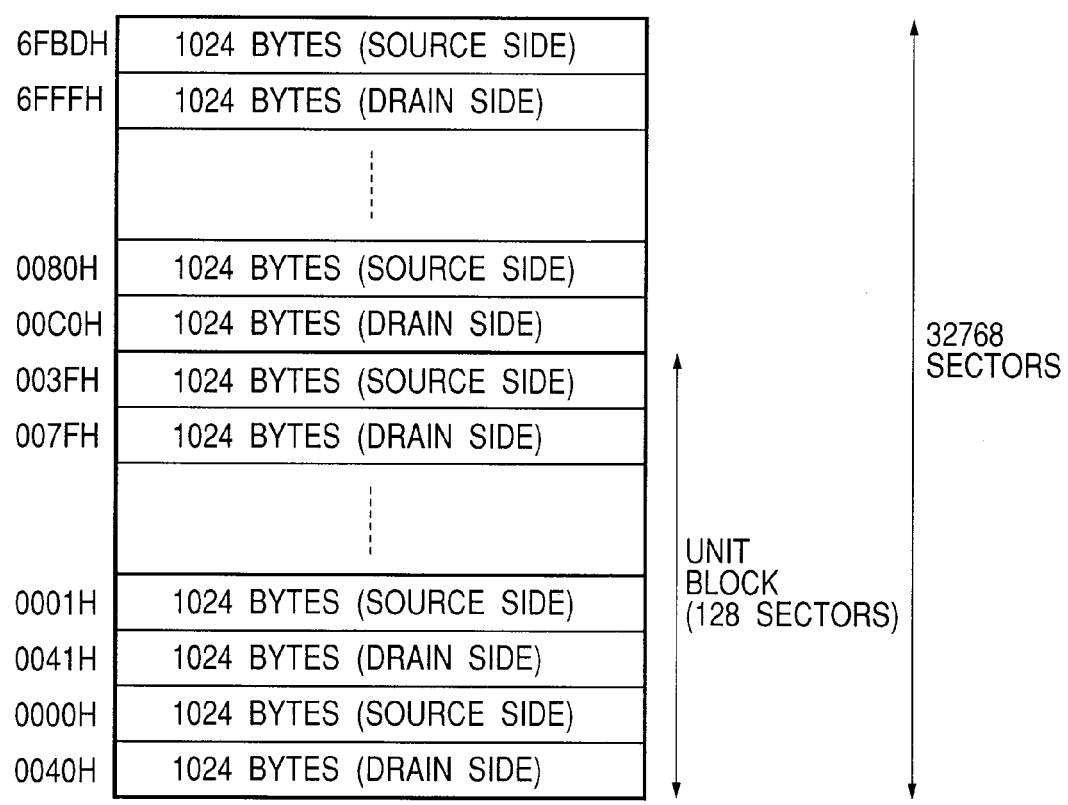
FIG. 60 is a view for showing an example of the memory map of the semiconductor device according to the above embodiment 8.

Further, in the embodiment 9, plural numbers of the word lines for driving the unit local data line form a set, and the entire of cells, which are driven by the one set of those word lines, is called by the block. In the embodiment 9, after assigning the sector numbers on the source ends within the same block, they are assigned onto the drain ends, continuously (see FIG. 60). If making the order of the write-in operations in this sequential order, the continuous data can be stored into the source ends and the drain ends of the same block, and therefore the saving operation can eliminated from when conducting the block erase operation. Also the operation for exchanging between the source end and the drain end must be included or inserted during the write-in operation, however the exchange operation in the present embodiment is fast comparing to that in the embodiment 8, so that such the driving is preferable for it. Other than this, it may also possible to adopt the driving method of conducting the write-in operation at the source ends and the drain ends, which are driven by the same word line, continuously. With this, though the consumed electric power is increased for charging/discharging on the local source lines, and also in time, the operation is slow for the exchange time, however the erase and the write-in operations can be achieved by the unit of the word line, therefore being effective, in particular, where a unit of data to be treated is small in the scale thereof.

Also, since the embodiment 10 has the local data line structure, the definition of the block is same to that in the embodiment 9. The cell driving method of the embodiment 10 is similar to that of the embodiment 8, however it differs from that, in an aspect that the selection transistor is turned into the off condition, which is connected to the local data line, but not including the cells as the target of the write-in or the read-out operation. Also, in the memory using the memory cells of the present embodiment, it also differs from the embodiment 8, in the method of managing the memory locations that will be explained below. The present method is suitable for use in the case where, in particular, a unit file size is 100 KB or more per a unit in the scale thereof, so as to take a picture through so-called a digital camera, etc., with almost equal in the file sizes thereof.

First of all, a signal is inputted for designating the unit file size from an outside. In the file write-in operation, the writing is conducted with using plural numbers of blocks, but without exchanging the source ends and the drain ends of the each memory mat. For example, the write-in operation is conducted only into the source ends. The numbers of the plural blocks are so determined in capacity, that the file size inputted in advance can be stored in both the source ends and the drain ends joining together. Next, the mode is changed into a mode for writing into the other ends, and the write-in operation is conducted for the remaining. As a result of this, it is enough to erase the plural numbers of blocks mentioned above when erasing the file, and therefore it has a feature that the saving operation is not necessary, in the same manner in the embodiment 9.

As was fully explained in the above, according to the present invention, it is possible to provide a semiconductor memory device, upon which the high-speeded read-out operation is required, with cheap. Or, it is possible to provide the structure, with which the scaling-down can be achieved in the vertical direction of the memory cell, while maintaining reliability thereof. Also, it is possible to provide a method of increasing the memory capacity per a cell, but without lowering the performances of the cells greatly. Further, with such the cell, it is possible to provide a method for realizing a memory device having a large memory capacitor therewith.

What is claimed is:

1. A semiconductor device comprising a single nonvolatile memory cell, wherein the single nonvolatile memory cell includes:
   a first region formed in a semiconductor substrate and serving as one of a source region and a drain region;
   a second region formed in the semiconductor substrate and serving as another of the source region and the drain region;
   an active region serving as a channel forming region and formed in the semiconductor substrate, in a first direction, between the first and the second region;

a first gate electrode formed on a first part of the active region through a first insulator film;

a second gate electrode formed on a second part of the active region through a second insulator, the first gate electrode and the second gate electrode arranged, in the first direction, side by side in the active region such that the first part is separately arranged, in the first direction, between the second part and the first region and such that the second part is separately arranged, in the first direction, between the first part and the second region; and a charge trap region formed between the first insulator film and the first gate electrode, wherein the first gate electrode includes a semiconductor film of a first conductivity type (n-type), wherein the second gate electrode includes a semiconductor film of a second conductivity type (p-type).

2. The semiconductor device according to claim 1, wherein the second gate electrode is formed to have a side wall spacer shape.

3. The semiconductor device according to claim 1, wherein the first conductivity type and the second conductivity type are n-type and p-type, respectively.

4. The semiconductor device according to claim 1, wherein the charge trap region includes a plurality of crystalline grains.

* * * * *